US012374932B2

(12) United States Patent
Park et al.

(10) Patent No.: US 12,374,932 B2
(45) Date of Patent: Jul. 29, 2025

(54) METHOD FOR DETECTING FOREIGN MATERIAL, AND DEVICE AND SYSTEM THEREFOR

(71) Applicant: LG INNOTEK CO., LTD., Seoul (KR)

(72) Inventors: Jae Hee Park, Seoul (KR); Yong Il Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/355,929

(22) Filed: Jul. 20, 2023

(65) Prior Publication Data

US 2023/0369902 A1 Nov. 16, 2023

Related U.S. Application Data

(63) Continuation of application No. 18/298,896, filed on Apr. 11, 2023, now Pat. No. 12,034,317, which is a
(Continued)

(30) Foreign Application Priority Data

Jul. 1, 2016 (KR) ........................ 10-2016-0083406
Jul. 18, 2016 (KR) ........................ 10-2016-0090701
(Continued)

(51) Int. Cl.
*H02J 50/60* (2016.01)
*G01N 27/02* (2006.01)
(Continued)

(52) U.S. Cl.
CPC .............. *H02J 50/60* (2016.02); *G01N 27/02* (2013.01); *G01R 27/26* (2013.01); *H02J 3/02* (2013.01);
(Continued)

(58) Field of Classification Search
CPC .. H02J 50/00–90; H02J 5/005; H04B 5/0037; G01R 29/08; G01R 29/0807; G01R 29/0814
See application file for complete search history.

(56) References Cited

U.S. PATENT DOCUMENTS 9,762,092 B2 9/2017 Jung et al.
2007/0228833 A1* 10/2007 Stevens .................. H02J 50/80 307/45
(Continued)

FOREIGN PATENT DOCUMENTS

JP 5071574 B1 11/2012
JP 2014-183731 A 9/2014
(Continued)

OTHER PUBLICATIONS

Fukuda et al., "A Novel Metal Detector using the Quality Factor of the Secondary Coil for Wireless Power Transfer Systems", IEEE Xplore, Mar. 5, 2021, pp. 241-244.
(Continued)

*Primary Examiner* — Huy Q Phan
*Assistant Examiner* — David B Frederiksen
(74) *Attorney, Agent, or Firm* — Birch, Stewart, Kolasch & Birch, LLP

(57) ABSTRACT

A method of transmitting power by a wireless power transmitter, the method including sequentially transmitting a sensing signal a plurality of times to a wireless power receiver through a plurality of transmission coils to sense the presence of the wireless power receiver; identifying transmission coils that receive a signal strength indictor transmitted by the wireless power receiver in response to the plurality of sensing signals; and selecting, as a power transmission coil, the transmission coil that has received the signal strength indicator having the largest amount or the largest value among the transmission coils that have
(Continued)

received the signal strength indicator, receiving a plurality of packets including a foreign object detection (FOD) status packet from the wireless power receiver; determining whether a foreign object is present in a charging area of the wireless power transmitter on the basis of the FOD status packet; and transmitting, to the wireless power receiver, a response signal indicating whether the foreign object is present in the charging area of the wireless power transmitter on the basis of a result of the determination, wherein the response signal is determined using a measured peak frequency of a power signal transmitted by the wireless power transmitter and a reference peak frequency included in the FOD status packet received from the wireless power receiver.

4 Claims, 46 Drawing Sheets

Related U.S. Application Data continuation of application No. 17/318,000, filed on May 12, 2021, now Pat. No. 11,646,607, which is a continuation of application No. 16/314,559, filed as application No. PCT/KR2017/006975 on Jun. 30, 2017, now Pat. No. 11,070,095.

(30) Foreign Application Priority Data

Jul. 22, 2016 (KR) ........................ 10-2016-0093483
Jul. 27, 2016 (KR) ........................ 10-2016-0095293

(51) Int. Cl.

*G01R 27/26* (2006.01)
*H02J 3/02* (2006.01)
*H02J 7/00* (2006.01)
*H02J 7/02* (2016.01)
*H02J 13/00* (2006.01)
*H02J 50/12* (2016.01)

(52) U.S. Cl.

CPC ............ *H02J 7/00308* (2020.01); *H02J 7/02* (2013.01); *H02J 13/00001* (2020.01); *H02J 50/12* (2016.02); *H02J 7/00045* (2020.01)

(56) References Cited

U.S. PATENT DOCUMENTS

2009/0315412 A1 12/2009 Yamamoto et al.
2010/0013319 A1 1/2010 Kamiyama et al.
2010/0013322 A1* 1/2010 Sogabe .................. H04B 5/266 307/104
2010/0225173 A1* 9/2010 Aoyama ................. H02J 50/12 320/108
2011/0196544 A1* 8/2011 Baarman ................. H02J 50/60 700/291
2012/0281547 A1* 11/2012 Kim ........................ H02J 50/80 370/242
2013/0094598 A1 4/2013 Bastami
2013/0119773 A1* 5/2013 Davis ...................... H02J 50/60 307/104
2013/0181724 A1 7/2013 Teggatz et al.
2013/0193771 A1 8/2013 Teggatz
2013/0257168 A1 10/2013 Singh
2014/0015329 A1 1/2014 Widmer et al.
2014/0084857 A1 3/2014 Liu et al.
2014/0125287 A1 5/2014 Nakano et al.
2014/0159503 A1 6/2014 Murakami et al.
2014/0187704 A1 6/2014 Lafontaine et al.
2014/0225628 A1 8/2014 Yoon et al.
2014/0245464 A1 8/2014 Chu
2014/0253028 A1 9/2014 Lee et al.
2014/0266036 A1 9/2014 Jung et al.
2015/0002166 A1 1/2015 Krupezevic et al.
2015/0108849 A1 4/2015 Robertson
2015/0142348 A1 5/2015 Huang et al.
2015/0198840 A1 7/2015 Lee
2015/0285926 A1 10/2015 Oettinger
2015/0349542 A1 12/2015 Yamamoto et al.
2015/0355360 A1 12/2015 Miyashita
2015/0372496 A1 12/2015 Lee et al.
2016/0006263 A1 1/2016 Shichino
2016/0134334 A1 5/2016 Park et al.
2016/0164302 A1 6/2016 Nakano et al.
2016/0181874 A1 6/2016 Raveh et al.
2016/0190852 A1* 6/2016 Chiang .................. G01V 3/088 320/108
2016/0197493 A1 7/2016 Nakano et al.
2016/0248279 A1 8/2016 Nakano et al.
2016/0268815 A1 9/2016 Lee et al.
2016/0329751 A1* 11/2016 Mach ...................... H02J 50/90
2016/0336759 A1 11/2016 Yamamoto et al.
2016/0352155 A1 12/2016 Iwasaki
2016/0359371 A1 12/2016 Wikstrand
2017/0018977 A1 1/2017 Van Wageningen et al.
2017/0033591 A1* 2/2017 Govindaraj ............. H02J 50/10
2017/0047786 A1 2/2017 Park et al.
2017/0061142 A1 3/2017 Niessen
2017/0117755 A1 4/2017 Muratov et al.
2017/0126072 A1 5/2017 Tsai et al.
2017/0237296 A1* 8/2017 Keith ...................... H02J 50/40 307/104
2017/0302113 A1 10/2017 Nakano et al.
2017/0331334 A1 11/2017 Park
2018/0323658 A1 11/2018 Cheikh
2023/0361620 A1* 11/2023 Park ........................ H02J 50/12

FOREIGN PATENT DOCUMENTS

JP 2015/46990 A 3/2015
JP 2016-59197 A 4/2016
JP 2017-511117 A 4/2017
KR 10-1213649 B1 12/2012
KR 10-2014-0008130 A 1/2014
KR 10-2014-0036344 A 3/2014
KR 10-2014-0102553 A 8/2014
KR 10-2014-0110500 A 9/2014
KR 10-2014-0113147 A 9/2014
KR 10-2015-0143654 A 12/2015
KR 10-1603420 B1 3/2016
KR 10-2016-0061121 A 5/2016
WO WO 2015/154086 A1 10/2015
WO WO 2015/156628 A1 10/2015
WO WO 2016/024869 A1 2/2016

OTHER PUBLICATIONS

"The Qi Wireless Power Transfer System, Power Class 0 Specification, " Wireless Power Consortium, Parts 1 and 2: Interface Definitions, Version 1.2.2, Apr. 2016, 11 pages total.

* cited by examiner

FIG. 5

| HEADER | PACKET TYPE | MESSAGE SIZE (BYTE) |
|---|---|---|
| 0x01 | Signal Strength | 1 |
| 0x02 | End Power Transfer | 1 |
| 0x06 | Power Control Hold-off | 1 |
| 0x51 | Configuration | 5 |
| 0x71 | Identification | 7 |
| 0x81 | Extended Identification | 8 |
| 0x07 | General Request | 1 |
| 0x20 | Specific Request | 2 |
| 0x22 | FOD Status | 2 |
| 0x03 | Control Error | 1 |
| 0x09 | Renegotiate | 1 |
| 0x31 | 24-bit Received Power | 3 |
| 0x04 | 8-bit Received Power | 1 |
| 0x05 | Charge Status | 1 |

| | b7 | b6 | b5 | b4 | b3 | b2 | b1 | b0 |
|---|---|---|---|---|---|---|---|---|
| B0 | RESERVED | | | | | | MODE | |
| B1 | REFERENCE QUALITY FACTOR VALUE | | | | | | | |

702

703

| MODE [b1 b0] | DESCRIPTION |
|---|---|
| 00 | REFERENCE QUALITY FACTOR VALUE MEASURED IN STATE IN WHICH WIRELESS POWER RECEIVER IS POWERED OFF |
| 01 | RESERVED |
| 10 | RESERVED |
| 11 | RESERVED |

| | $b_7$ | $b_6$ | $b_5$ | $b_4$ | $b_3$ | $b_2$ | $b_1$ | $b_0$ |
|---|---|---|---|---|---|---|---|---|
| B0 | NONE (ALL ZEROS) OR REFERENCE INDUCTANCE VALUE | | | | | | MODE | |
| B1 | REFERENCE QUALITY FACTOR VALUE | | | | | | | |

704

| MODE [b1 b0] | DESCRIPTION |
|---|---|
| 00 | REFERENCE QUALITY FACTOR VALUE MEASURED IN STATE IN WHICH WIRELESS POWER RECEIVER IS POWERED OFF |
| 01 | REFERENCE INDUCTANCE VALUE AND REFERENCE QUALITY FACTOR VALUE MEASURED IN STATE IN WHICH WIRELESS POWER RECEIVER IS POWERED OFF |
| 10 | RESERVED |
| 11 | RESERVED |

| | b7 | b6 | b5 | b4 | b3 | b2 | b1 | b0 |
|---|---|---|---|---|---|---|---|---|
| B0 | RESERVED (ALL ZEROS) | | | | | | MODE | |
| B1 | REFERENCE VALUE | | | | | | | |

703

704

| MODE [b1 b0] | DESCRIPTION |
|---|---|
| 00 | REFERENCE QUALITY FACTOR VALUE MEASURED IN STATE IN WHICH WIRELESS POWER RECEIVER IS POWERED OFF |
| 01 | REFERENCE INDUCTANCE VALUE IN STATE IN WHICH WIRELESS POWER RECEIVER IS POWERED OFF |
| 10 | RESERVED |
| 11 | RESERVED |

1630

| No_FO(RQF) | 10cent | diff1 | %diff1 |
|---|---|---|---|
| 72 | 60 | 12 | 16.66667 |
| 59 | 52 | 7 | 11.86441 |
| 57 | 48 | 9 | 15.78947 |
| 50 | 49 | 1 | 2 |
| 48 | 46 | 2 | 4.166667 |
| 82 | 61 | 21 | 25.60976 |

1730

| No_FO | 25cent | diff2 | %diff2 |
|---|---|---|---|
| 72 | 51 | 21 | 29.16667 |
| 59 | 50 | 9 | 15.25424 |
| 57 | 45 | 12 | 21.05263 |
| 50 | 45 | 5 | 10 |
| 48 | 43 | 5 | 10.41667 |
| 82 | 47 | 35 | 42.68293 |

| MEASURED VALUE | Empty pad | FO#4 | 10 cent | REACEIVER 1 | REACEIVER 2 | REACEIVER 3 | REACEIVER 4 |
|---|---|---|---|---|---|---|---|
| INDUCTANCE VALUE(Ls) | 25.20μH | 21.00 | 22.56 | 26.68 | 32.14 | 29.94 | 35.25 |
| RESISTANCE VALUE(Rs) | 0.118Ω | 0.308 | 0.225 | 0.261 | 0.482 | 0.433 | 0.626 |
| QUALITY FACTOR VALUE(Q) | 133.8 | 42.7 | 62.9 | 64.2 | 42.5 | 43.4 | 35.4 |

1211 1212 1213

1220

| MEASURED VALUE | REACEIVER 1 + FO#4 | REACEIVER 2 + FO#4 | REACEIVER 3 + FO#4 | REACEIVER 4 + FO#4 | REACEIVER 1 + 10 cent | REACEIVER 2 + 10 cent | REACEIVER 3 + 10 cent | REACEIVER 4 + 10 cent |
|---|---|---|---|---|---|---|---|---|
| INDUCTANCE VALUE(Ls) | 21.10μH | 22.48 | 22.20 | 23.63 | 22.91 | 25.15 | 24.12 | 26.63 |
| RESISTANCE VALUE(Rs) | 0.383Ω | 0.554 | 0.498 | 0.630 | 0.318 | 0.514 | 0.464 | 0.581 |
| QUALITY FACTOR VALUE(Q) | 34.6 | 25.5 | 28 | 23.6 | 45.2 | 30.7 | 32.6 | 28.8 |

1221 1222

|   | b7 | b6 | b5 | b4 | b3 | b2 | b1 | b0 |
|---|----|----|----|----|----|----|----|----|
| B0 | OPERATING FREQUENCY FOR MAXIMUM QUALITY FACTOR VALUE ||||||  MODE ||
| B1 | REFERENCE QUALITY FACTOR VALUE ||||||||

| | b7 | b6 | b5 | b4 | b3 | b2 | b1 | b0 |
|---|---|---|---|---|---|---|---|---|
| B0 | RESERVED | | | | | | MODE | |
| B1 | REFERENCE QUALITY FACTOR VALUE | | | | | | | |

1303

1304

| MODE (b1 b0) | DESCRIPTION |
|---|---|
| 00 | REFERENCE QUALITY FACTOR WHEN FO IS NOT PRESENT (RQF_NO_FO) |
| 01 | REFERENCE QUALITY FACTOR WHEN FO IS PRESENT (RQF_FO) |
| 10 | Reserved |
| 11 | Reserved |

FIG. 13E 1311 1310

| | b7 | b6 | b5 | b4 | b3 | b2 | b1 | b0 |
|---|---|---|---|---|---|---|---|---|
| B0 | RESERVED | | | | | | MODE | |
| B1 | REFERENCE QUALITY FACTOR VALUE | | | | | | | |
| B2 | REFERENCE QUALITY FACTOR VALUE WITH FOREIGN OBJECT | | | | | | | |

1312 1313 1314

| MODE [b1 b0] | DESCRIPTION |
|---|---|
| 00 | The Power Receiver is powered off |
| 01 | Reserved |
| 10 | Reserved |
| 11 | Reserved |

| | b7 | b6 | b5 | b4 | b3 | b2 | b1 | b0 |
|---|---|---|---|---|---|---|---|---|
| B0 | DROP VALUE OF REFERENCE QUALITY FACTOR | | | | | | MODE | |
| B1 | REFERENCE QUALITY FACTOR VALUE | | | | | | | |

1322

1323

| MODE [b1 b0] | DESCRIPTION |
|---|---|
| 00 | The Power Receiver is powered off |
| 01 | Drop Value of Reference Quality Factor in reserved field |
| 10 | Reserved |
| 11 | Reserved |

1324

| RECEIVER IDENTIFIER | LATEST MEASURED QUALITY FACTOR VALUE | RQF_NO_FO | RQF_FO | Q_threshold_correct |
|---|---|---|---|---|
| ⋮ | ⋮ | ⋮ | ⋮ | ⋮ |

2413

| FREQUENCY(KHz) | FIRST RECEIVER | FIRST RECEIVER + FO4 |
|---|---|---|
| 100 | 44 | 27.1 |
| 110 | 44.1 | 27.9 |
| 120 | 44.1 | 28.5 |
| 130 | 44 | 29 |
| 140 | 43.7 | 29.4 |
| 150 | 43.3 | 29.7 |
| 160 | 42.8 | 29.9 |
| 170 | 42.4 | 30.2 |
| 180 | 41.7 | 30.3 |
| 190 | 41.2 | 30.4 |
| 200 | 40.6 | 30.4 |
| 210 | 40 | 30.5 |

2423

| FREQUENCY(KHz) | SECOND RECEIVER | SECOND RECEIVER + FO4 |
|---|---|---|
| 100 | 39.5 | 24.9 |
| 110 | 38.8 | 25.3 |
| 120 | 38.1 | 25.7 |
| 130 | 37.3 | 26 |
| 140 | 36.4 | 26.1 |
| 150 | 35.6 | 26.2 |
| 160 | 34.8 | 26.2 |
| 170 | 34 | 26.2 |
| 180 | 33.2 | 26.2 |
| 190 | 32.5 | 26.2 |
| 200 | 31.8 | 26.1 |
| 210 | 31.1 | 26.1 |

2433

| FREQUENCY(KHz) | FO4 | 10cent |
|---|---|---|
| 100 | 40 | 63.1 |
| 110 | 41.5 | 64.9 |
| 120 | 42.9 | 66.4 |
| 130 | 44.1 | 67.4 |
| 140 | 44.9 | 68.1 |
| 150 | 45.7 | 68.4 |
| 160 | 46.2 | 68.5 |
| 170 | 46.9 | 68.7 |
| 180 | 47.3 | 68.7 |
| 190 | 47.6 | 68.5 |
| 200 | 47.9 | 68.2 |
| 210 | 48.1 | 67.5 |

LOWER-LIMIT FREQUENCY BAND (100–120)

MIDDLE FREQUENCY BAND (130–180)

UPPER-LIMIT FREQUENCY BAND (190–210)

2453

| FREQUENCY(KHz) | STANDARD RECEIVER | ABSENCE |
|---|---|---|
| 100 | 129.1 | 133.5 |
| 110 | 131.1 | 134.5 |
| 120 | 131.7 | 135.8 |
| 130 | 131.6 | 136.4 |
| 140 | 129.3 | 134.4 |
| 150 | 128.1 | 133.5 |
| 160 | 125.1 | 131 |
| 170 | 123.3 | 128.9 |
| 180 | 120.9 | 127.1 |
| 190 | 118.7 | 124.4 |
| 200 | 116.1 | 122.3 |
| 210 | 112.5 | 118.7 |

FIG. 25

| | ONLY Rx | | with FO#4(center) | | with FO#4(10mm shift) | | with FO#4(20mm shift | |
|---|---|---|---|---|---|---|---|---|
| | PEAK FREQUENCY (peak freq) | PEAK QUALITY FACTOR (peak Q) | Peak freq | peak Q | peak freq | peak Q | peak freq | peak Q |
| RECEIVER A | 101.07 | 67.1 | 109.16 | 50.4 | 107.92 | 53.2 | 104.14 | 61.5 |
| RECEIVER B | 97.36 | 55.8 | 106.72 | 43.1 | 105.51 | 45.2 | 101.39 | 52.6 |
| RECEIVER C | 92.64 | 64 | 105.05 | 44.5 | 104.22 | 49.7 | 99.06 | 58.1 |
| RECEIVER D | 93.58 | 54.56 | 104.76 | 41.67 | 102.64 | 45.33 | 98.96 | 52.00 |

METHOD FOR DETECTING FOREIGN MATERIAL, AND DEVICE AND SYSTEM THEREFOR

CROSS-REFERENCE TO RELATED APPLICATIONS

This Application is a Continuation of U.S. patent application Ser. No. 18/298,896 filed on Apr. 11, 2023 (now U.S. Pat. No. 12,034,317 issued on Jul. 9, 2024), which is a Continuation of U.S. patent application Ser. No. 17/318,000 filed on May 12, 2021 (now U.S. Pat. No. 11,646,607 issued on May 9, 2023), which is a Continuation of U.S. patent application Ser. No. 16/314,559 filed on Dec. 31, 2018 (now U.S. Pat. No. 11,070,095 issued on Jul. 20, 2021), which is the National Phase of PCT International Application No. PCT/KR2017/006975 filed on Jun. 30, 2017, which claims the priority benefit under 35 U.S.C. 119 (a) to Korean Patent Application Nos. 10-2016-0095293 filed on Jul. 27, 2016, 10-2016-0093483 filed on Jul. 22, 2016, 10-2016-0090701 filed on Jul. 18, 2016 and 10-2016-0083406 filed on Jul. 1, 2016, all filed in the Republic of Korea, and all of which are hereby expressly incorporated by reference into the present application.

BACKGROUND OF THE INVENTION

Field of the Invention

Embodiments relate to wireless power transmission technology and, more particularly, a method of detecting a foreign object in a wireless charging system, and an apparatus and system therefor.

Discussion of the Related Art

Recently, as information and communication technology has been rapidly developed, a ubiquitous society based on information and communication technology is being developed.

In order to connect information communication devices anytime anywhere, sensors equipped with a computer chip having a communication function should be installed in all social facilities. Accordingly, supplying power to such devices or sensors is a new challenge. In addition, as the types of mobile devices such as music players such as Bluetooth handsets or iPods as well as mobile phones have rapidly increased, it is necessary for users to take more time and efforts to charge batteries. As a method of solving such problems, wireless power transfer technology has recently attracted attention.

Wireless power transmission or wireless energy transfer refers to technology for wirelessly transmitting electric energy from a transmitter to a receiver using the magnetic induction principle. In 1800s, electric motors or transformers using the electromagnetic induction principle have begun to be used and, thereafter, attempts have been made to radiate electromagnetic waves such as high frequencies, microwaves and lasers to transfer electric energy. Frequently used electric toothbrushes or some wireless shavers are charged using the electromagnetic induction principle.

Up to now, a wireless energy transfer method may be roughly divided into a magnetic induction method, an electromagnetic resonance method and a radio frequency (RF) transmission method of a short-wavelength radio frequency.

The magnetic induction method uses a phenomenon that, when two coils are located adjacent to each other and then current is applied to one coil, a magnetic flux is generated to cause an electromotive force in the other coil, and is rapidly being commercialized in small devices such as mobile phones. The magnetic induction method may transfer power of up to several hundreds of kilowatts (kW) and has high efficiency. However, since a maximum transmission distance is 1 centimeter (cm) or less, a device to be charged should be located adjacent to a charger or the floor.

The electromagnetic resonance method uses an electric field or a magnetic field instead of using electromagnetic waves or current. The electromagnetic resonance method is rarely influenced by electromagnetic waves and thus is advantageously safe for other electronic devices or human bodies. In contrast, this method may be used in a limited distance and space and energy transmission efficiency is somewhat low.

The short-wavelength wireless power transmission method (briefly, referred to as the RF transmission method) takes advantage of the fact that energy may be directly transmitted and received in the form of a radio wave. This technology is a RF wireless power transmission method using a rectenna. The rectenna is a combination of an antenna and a rectifier and means an element for directly converting RF power into DC power. That is, the RF method is technology of converting AC radio waves into DC. Recently, as efficiency of the RF method has been improved, studies into commercialization of the RF method have been actively conducted.

Wireless power transmission technology may be used not only in mobile related industries but also in various industries such as IT, railroad and home appliance.

If a conductor which is not a wireless power receiver, that is, a foreign object (FO), is present in a wireless charging area, an electromagnetic signal received from a wireless power transmitter may be induced in the FO, thereby increasing in temperature. For example, the FO may include coins, clips, pins, and ballpoint pens.

If an FO is present between a wireless power receiver and a wireless power transmitter, wireless charging efficiency may be significantly lowered, and the temperatures of the wireless power receiver and the wireless power transmitter may increase due to increase in ambient temperature of the FO. If the FO located in the charging area is not removed, power waste may occur and the wireless power transmitter and the wireless power receiver may be damaged due to overheating.

Accordingly, accurate detection of the FO located in the charging area is becoming an important issue in wireless charging technology.

SUMMARY OF THE INVENTION

Embodiments provide a method of detecting a foreign object for wireless charging, and an apparatus and system therefor.

Embodiments provide a wireless power transmission apparatus capable of more accurately detecting a foreign object, by applying a weight determined linearly or exponentially according to a reference quality factor value and dynamically determining a threshold value or a threshold range for detecting the foreign object.

Embodiments provide a wireless power transmission apparatus capable of detecting a foreign object based on a quality factor value and an inductance value of a resonant circuit measured before a ping phase.

Embodiments provide a method of detecting a foreign object, which is capable of more accurately detecting a foreign object, by measuring a quality factor value and an inductance value of a resonant circuit before a ping phase when an object is detected in a charging area and comparing a determined threshold value with a measured value based on an FOD status packet in a negotiation phase, and an apparatus and system therefor. Embodiments provide a wireless power transmitter capable of detecting a foreign object based on a quality factor value measured at a specific frequency in an operating frequency band.

Embodiments provide a wireless power transmitter capable of detecting a foreign object based on a quality factor average value measured at a specific frequency in an operating frequency band.

The technical problems solved by the embodiments are not limited to the above technical problems and other technical problems which are not described herein will become apparent to those skilled in the art from the following description.

Embodiments provide a method of detecting a foreign object, and an apparatus and system therefor.

In an embodiment, a method of detecting a foreign object in a wireless power transmitter including a resonant circuit for wirelessly transmitting power includes detecting an object placed in a charging area, measuring a quality factor value of the resonant circuit when the object is detected, transmitting a sensing signal to identify a wireless power receiver, determining a threshold value for detecting the foreign object based on a reference quality factor value received from the identified wireless power receiver, and comparing the measured quality factor value with the determined threshold value to determine whether the foreign object is present, wherein the threshold value is determined by applying a weight which increases according to the reference quality factor value.

Here, the weight may linearly or exponentially increase according to the reference quality factor value.

In addition, the threshold value may be determined by further applying a design factor corresponding to the wireless power transmitter and a predefined tolerance, and the threshold value may be determined by adding the tolerance to a product of the reference quality factor value and the design factor and then subtracting the weight from the added value.

The method may further include starting charging of the identified wireless power receiver upon determining that the foreign object is not present, and stopping power transfer through the resonant circuit and outputting a predetermined alarm signal indicating that the foreign object has been detected, upon determining the foreign object is present.

The method may return to the detecting of the object placed in the charging area when power transfer is stopped.

The method may further include comparing the quality factor value of the resonant circuit measured after returning with the determined threshold value to check whether the foreign object has been removed from the charging area.

The stopped power transfer may be resumed upon checking that the foreign object has been removed.

The reference quality factor value may be received in a state of being included in a foreign object detection status packet received in a negotiation phase.

The determining of whether the foreign object is present may include determining that the foreign object is not present, when the measured quality factor value exceeds the threshold value, and determining that the foreign object is present, when the measured quality factor value is equal to or less than the threshold value.

According to another embodiment, a method of detecting a foreign object in a wireless power transmitter including a resonant circuit for wirelessly transmitting power includes detecting an object placed in a charging area, measuring a quality factor value of the resonant circuit when the object is detected, transmitting a sensing signal to identify a wireless power receiver, determining a threshold range for detecting the foreign object based on a reference quality factor value received from the identified wireless power receiver, and comparing the measured quality factor value with the determined threshold range to determine whether the foreign object is present, wherein the threshold range is determined by applying an upper-limit weight and a lower-limit weight which increase according to the reference quality factor value.

According to another embodiment, an apparatus for detecting a foreign object includes a resonant circuit including a resonant capacitor and a resonant inductor, a sensing unit configured to detect an object placed in a charging area, a measurement unit configured to measure a quality factor value of the resonant circuit when the object is detected, and a controller configured to determine a threshold value for detecting the foreign object based on a reference quality factor value received from an identified wireless power receiver and to compare the measured quality factor value with the determined threshold value to determine whether the foreign object is present, wherein the threshold value is determined by applying a weight which increases according to the reference quality factor value.

Here, the weight may linearly or exponentially increase according to the reference quality factor value, and the threshold value may be determined by adding a predefined tolerance to a product of the reference quality factor value and a design factor corresponding to the wireless power transmitter and then subtracting the weight from the added value.

In addition, the controller may perform control to start charging of the identified wireless power receiver upon determining that the foreign object is not present, and to stop power transfer through the resonant circuit and to output a predetermined alarm signal indicating that the foreign object has been detected, upon determining the foreign object is present.

The controller may return to a selection phase after stopping power transfer and compare the quality factor value of the resonant circuit measured after returning with the determined threshold value to check whether the foreign object has been removed from the charging area.

The controller may perform control to resume the stopped power transfer upon checking that the foreign object has been removed.

In addition, the apparatus may further include a DC-to-DC converter configured to convert DC power from a power supply into specific DC power and an inverter configured to convert the converted DC power into AC power, the controller may control the DC-to-DC converter and the inverter to periodically transmit a digital ping for identifying the wireless power receiver when measurement by the measurement unit is terminated, and the wireless power receiver may be identified when a signal strength indicator corresponding to the digital ping is received.

The measurement unit may measure the quality factor value of the resonant circuit based on a voltage measured across the resonant capacitor.

According to another embodiment, an apparatus for detecting a foreign object includes a resonant circuit including a resonant capacitor and a resonant inductor, a sensing unit configured to detect an object placed in a charging area, a measurement unit configured to measure a quality factor value of the resonant circuit when the object is detected, and a controller configured to determine a threshold range for detecting the foreign object based on a reference quality factor value received from an identified wireless power receiver and to compare the measured quality factor value with the determined threshold range to determine whether the foreign object is present, wherein the threshold range is determined by applying an upper-limit weight and a lower-limit weight which increase according to the reference quality factor value.

According to another embodiment, a method of detecting a foreign object in a wireless power transmitter including a resonant circuit for wirelessly transmitting power includes measuring a first inductance value of the resonant circuit, receiving a foreign object detection status packet from a wireless power receiver, determining a threshold value for detecting the foreign object based on the foreign object detection status packet, and comparing the measured first inductance value with the determined threshold value to determine whether the foreign object is present.

In addition, the method may further include detecting an object placed in a charging area and identifying the wireless power receiver, and the measured first inductance value may include an inductance value of the resonant circuit changed by the detected object.

In addition, the first inductance value may be measured before entering the step of identifying the wireless power receiver after detecting the object.

In addition, the method further include measuring a quality factor value of the resonant circuit before entering the step of identifying the wireless power receiver after detecting the object.

In addition, the method may further include stopping power transfer to the wireless power receiver based on the result of determining whether the foreign object is present.

In addition, the method may further include correcting power transmitted to the identified wireless power receiver based on the result of determining whether the foreign object is present.

In addition, the method may further include outputting an alarm signal indicating that the foreign object has been detected based on the result of determining that the foreign object is present.

In addition, the method may further include detecting the object placed in the charging area after stopping the power transfer.

In addition, the method may further include measuring a second inductance value of the resonant circuit after stopping the power transfer and comparing the measured second inductance value with the determined threshold value to determine whether the detected foreign object has been removed from the charging area.

In addition, the foreign object detection status packet may include at least one of a reference quality factor value and a reference inductance value.

In addition, the reference inductance value may include the inductance value of the resonant circuit measured when the wireless power receiver is located in the charging area without a foreign object.

In one embodiment, the foreign object detection status packet may further include a mode field, and the mode field may include a first mode indicating that the foreign object detection status packet includes the reference inductance value.

In another embodiment, the foreign object detection status packet may further include a mode field, and the mode field may include a second mode indicating that the foreign object detection status packet includes the reference inductance value and the reference quality factor value.

In addition, the determined threshold value may include a quality factor threshold value and an inductance threshold value, and the quality factor threshold value and the inductance threshold value may include values respectively less than the reference quality factor value and the reference inductance value by a predetermined ratio.

In addition, the determined threshold value may include a value greater than the reference inductance value by a predetermined ratio.

In addition, the method may further include receiving a received power strength packet for correcting the power from the wireless power receiver, and the received power strength packet may include received power of the wireless power receiver corresponding to a light load or received power of the wireless power receiver corresponding to a load connection state.

In addition, the determining of whether the foreign object is present may include a first foreign object determination step of comparing the measured quality factor value with the quality factor threshold value to determine whether the foreign object is present and a second foreign object determination step of comparing the measured first inductance value with the inductance threshold value to determine whether the foreign object is present.

In addition, upon determining that the foreign object is present in at least one of the first foreign object determination step and the second foreign object determination step, it may be finally determined that the foreign object is present.

According to another embodiment, an apparatus for detecting a foreign object includes a resonant circuit including a resonant capacitor and a resonant inductor, a measurement unit configured to measure a first inductance value of the resonant circuit and a charging area disposed above the inductor, and a controller configured to determine a threshold value for detecting the foreign object based on a foreign object detection status packet received from a wireless power receiver and to compare the measured first inductance value with the determined threshold value to determine whether the foreign object is present.

In addition, the controller may be configured to detect an object located in the charging area, and the measured first inductance value may include the inductance value of the resonant circuit changed by the detected object.

In addition, the measurement unit may be configured to measure the quality factor value of the resonant circuit, and the measured quality factor value may include the quality factor value of the resonant circuit changed by the detected object.

In addition, the inductance value of the resonant circuit may include the inductance value of the inductor.

In addition, w % ben the measured first inductance value is greater than the determined threshold value, the controller may correct power transmitted to the wireless power receiver.

In addition, when the measured first inductance value is equal to or less than the determined threshold value, the controller may perform control to stop power transfer to the wireless power receiver.

In addition, the foreign object detection status packet may include at least one of a reference quality factor value and a reference inductance value.

In one embodiment, the foreign object detection status packet may further include a mode field, and the mode field may include a first mode indicating that the foreign object detection status packet includes the reference inductance value.

In another embodiment, the foreign object detection status packet may further include a mode field, and the mode field may include a second mode indicating that the foreign object detection status packet includes the reference inductance value and the reference quality factor value.

In addition, the determined threshold value may include a quality factor threshold value and an inductance threshold value, and the quality factor threshold value and the inductance threshold value may include values respectively less than the reference quality factor value and the reference inductance value by a predetermined ratio.

In addition, the determined threshold value may include a value greater than the reference inductance value by a predetermined ratio.

In addition, the controller may perform a first foreign object determination of comparing the measured quality factor value with the quality factor threshold value to determine whether the foreign object is present and a second foreign object determination of comparing the measured inductance value with the inductance threshold value to determine whether the foreign object is present.

In addition, upon determining that the foreign object is present in at least one of the first foreign object determination and the second foreign object determination, the controller may finally determine that the foreign object is present.

In addition, the apparatus may further include a DC-to-DC converter configured to convert DC power from a power supply into specific DC power and an inverter configured to convert the converted DC power into AC power, the controller may control the DC-to-DC converter and the inverter to periodically transmit a digital ping for identifying the wireless power receiver when measurement by the measurement unit is terminated, and the wireless power receiver may be identified when a signal strength indicator corresponding to the digital ping is received.

In addition, the measurement unit may measure the first inductance value based on at least one of a voltage, current and impedance measured across the resonant capacitor.

In addition, the measurement unit may include a quality factor measurement unit configured to calculate the quality factor value based on the voltage measured across the resonant capacitor and an inductance measurement unit configured to calculate the inductance value based on the voltage and current measured across the inductor.

According to another embodiment, a method of detecting a foreign object in a wireless power transmitter includes measuring a first quality factor value at a first frequency, measuring a second quality factor value at a second frequency, and determining whether the foreign object is present based on the first quality factor value and the second quality factor value, For example, the second frequency is greater than the first frequency. When the second quality factor value is greater than the first quality factor value, it may be determined that the foreign object is present.

In another example, when the second quality factor value is greater than the first quality factor value, it may be determined that a misaligned wireless power receiver is present.

In addition, the method may further include wirelessly transmitting power according to presence/absence of the foreign object, and the presence/absence of the foreign object may include presence of the foreign object and absence of the foreign object.

In addition, presence of the foreign object may include a state in which the second quality factor value is greater than the first quality factor value.

In addition, absence of the foreign object may include a state in which the second quality factor value is less than or equal to the first quality factor value.

In addition, the method may further include outputting a predetermined alarm signal upon determining that the foreign object is present in the charging area.

In addition, the method may further include temporarily stopping power transfer when the foreign object is detected during power transfer.

In addition, the method further includes checking whether the detected foreign object has been removed from the charging area in a state in which the power transfer is temporarily stopped. Upon checking the detected foreign object has been removed, the temporarily stopped power transfer may be resumed.

In addition, the method may further include entering a selection phase after outputting the alarm signal.

In addition, the method further checks whether the detected foreign object has been removed from the charging area before entering the selection phase after outputting the alarm signal. Upon checking the detected foreign object has been removed, the method may enter the selection phase.

In addition, it may be determined that the foreign object is present in the charging area, when a value obtained by subtracting the first quality factor value from the second quality factor value exceeds a predetermined reference value.

According to another embodiment, a method of detecting a foreign object in a wireless power transmitter includes calculating a first quality factor average value corresponding to a predetermined upper-limit frequency band in an operating frequency band, calculating a second quality factor average value corresponding to a predetermined lower-limit frequency band in the operating frequency band, and determining whether the foreign object is present in a charging area of the wireless power transmitter based on the first quality factor average value and the second quality factor average value.

For example, it may be determined that the foreign object is present in the charging area, when the first quality factor average value is greater than the second quality factor average value.

In another example, it may be determined that the foreign object is present in the charging area, when a value obtained by subtracting the second quality factor average value from the first quality factor average value exceeds a predetermined reference value.

According to another embodiment, a foreign object detection apparatus provided in a wireless power transmitter includes a quality factor measurement unit configured to measure a first quality factor value at a first frequency in a predetermined operating frequency band and a second quality factor value at a second frequency in the operating frequency band, and a detector configured to determine whether a foreign object is present in a charging area based on the first quality factor value and the second quality factor value.

For example, when the second frequency is greater than the first frequency and the second quality factor value is greater than the first quality factor value, the detector may determine that the foreign object is present in the charging area.

In another example, when the second frequency is greater than the first frequency and the second quality factor value is greater than the first quality factor value, the detector may determine that a misaligned wireless power receiver is present in the charging area.

The foreign object detection apparatus may further include an alarm unit configured to output an alarm signal upon determining that the foreign object is present in the charging area.

The foreign object detection apparatus may further include a controller configured to temporarily stopping power transfer upon determining that the foreign object is present in the charging area during power transfer.

In addition, the controller may check whether the foreign object has been removed from the charging area in a state in which the power transfer is temporarily stopped, and resume the temporarily stopped power transfer upon checking the foreign object has been removed.

The controller may perform control to check whether the foreign object has been removed from the charging area before entering the selection phase after outputting the alarm signal and to enter a selection phase upon checking that the foreign object has been removed.

In addition, the controller may perform control to check whether the detected foreign object has been removed from the charging area before entering the selection phase after outputting the alarm signal and to enter the selection phase upon checking the foreign object has been removed.

In addition, when the second frequency is greater than the first frequency and a value obtained by subtracting the first quality factor value from the second quality factor value exceeds a predetermined reference value, the detector may determine that the foreign object is present in the charging area.

According to another embodiment, a foreign object detection apparatus provided in a wireless power transmitter includes a quality factor measurement unit configured to measure a quality factor value in a predetermined operating frequency band, an average calculator configured to calculate a first quality factor average value based on at least one quality factor value measured at a predetermined upper-limit frequency band in the operating frequency band and calculating a second quality factor average value based on at least one quality factor value measured at a predetermined lower-limit frequency band in the operating frequency band, and a detector configured to determine whether a foreign object is present in a charging area of the wireless power transmitter based on the first quality factor average value and the second quality factor average value.

For example, the detector may determine that the foreign object is present in the charging area, when the first quality factor average value is greater than the second quality factor average value.

In another example, the detector may determine that a misaligned wireless power receiver is present in the charging area, when a value obtained by subtracting the second quality factor average value from the first quality factor average value exceeds a predetermined reference value.

In another embodiment, a computer-readable recording medium having recorded thereon a program for executing any one of the above-described methods may be provided.

The aspects of the disclosure are only a part of the preferred embodiments of the disclosure, and various embodiments based on technical features of the disclosure may be devised and understood by the person with ordinary skill in the art based on the detailed description of the disclosure.

The effects of the method, apparatus and system according to embodiments are as follows.

Embodiments provide a method of detecting a foreign object for wireless charging, and an apparatus and system therefor.

Embodiments provide a method of detecting a foreign object, which is capable of more accurately detecting a foreign object, and an apparatus and system therefor.

Embodiments may minimize unnecessary power waste and a heating phenomenon due to a foreign object.

Embodiments provide a wireless power transmission apparatus capable of more accurately detecting a foreign object, by applying a weight determined linearly or exponentially according to a reference quality factor value and dynamically determining a threshold value or a threshold range for detecting the foreign object.

Embodiments provide a wireless power transmission apparatus capable of detecting a foreign object based on a quality factor value and an inductance value of a resonant circuit measured before a ping phase.

Embodiments provide a method of detecting a foreign object, which is capable of more accurately detecting a foreign object, by measuring a quality factor value and an inductance value of a resonant circuit before a ping phase when an object is detected in a charging area and comparing a determined threshold value with a measured value based on an FOD status packet in a negotiation phase, and an apparatus and system therefor.

Embodiments provide a method of detecting a foreign object, which is capable of more accurately detecting the foreign object, by determining a threshold value for dynamically determining whether a foreign object is present based on a receiver type, and an apparatus and system therefor.

Embodiments provide a wireless power transmitter capable of detecting a foreign object based on a quality factor value measured at a specific frequency in an operating frequency band.

Embodiments provide a wireless power transmitter capable of detecting a foreign object based on a quality factor average value measured at a specific frequency in an operating frequency band.

Embodiments may minimize foreign object detection errors and thus minimize unnecessary power waste and equipment damage.

The effects of the disclosure are not limited to the above-described effects and other effects which are not described herein may be derived by those skilled in the art from the following description of the embodiments of the disclosure. That is, effects which are not intended by the disclosure may be derived by those skilled in the art from the embodiments of the disclosure.

BRIEF DESCRIPTION OF THE DRAWINGS

FIG. 5 is a view illustrating the types of packets according to an embodiment:

FIG. 7A is a view illustrating the structure of a foreign object detection (FOD) status packet message according to an embodiment;

FIG. 7B is a view illustrating the structure of an FOD status packet message according to an embodiment;

FIG. 7C is a view illustrating the structure of an FOD status packet message according to another embodiment;

FIG. 12 is a view showing a result of measuring a quality factor value and an inductance value of a resonant circuit according to presence/absence of a foreign object for each receiver type;

FIGS. 13D to 13G are views illustrating the structure of an FOD status packet message according to an embodiment;

FIG. 25 is a view illustrating a relationship between a quality factor value and a maximum quality factor peak frequency according to placement of a foreign object and a wireless power receiver in a charging area of a wireless power transmitter:

DETAILED DESCRIPTION OF THE EMBODIMENTS

Figure 1:
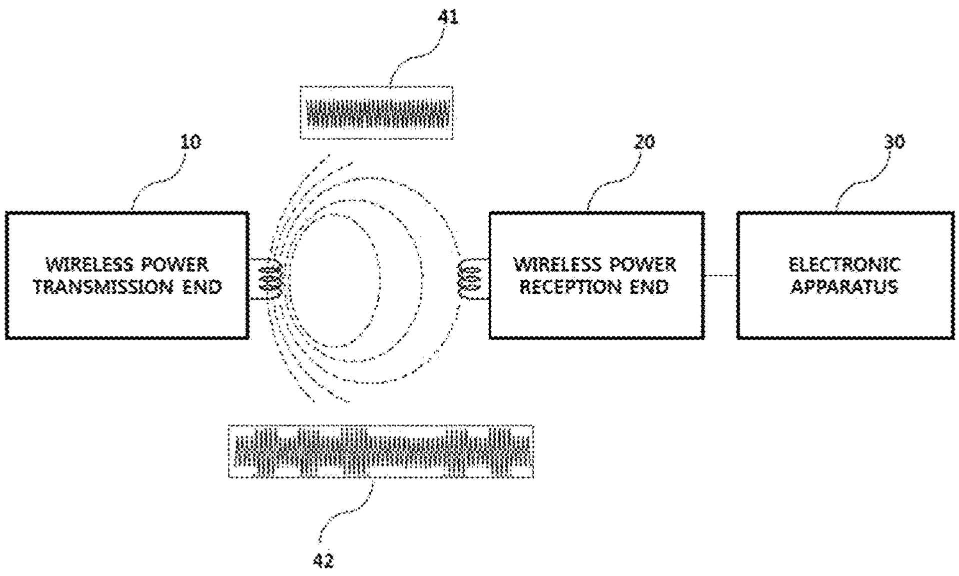
FIG. 1 is a block diagram illustrating a wireless charging system according to an embodiment.

A method of detecting a foreign object in a wireless power transmitter including a resonant circuit for wirelessly transmitting power includes detecting an object placed in a charging area, measuring a quality factor value of the resonant circuit when the object is detected, transmitting a sensing signal to identify a wireless power receiver, determining a threshold value for detecting the foreign object based on a reference quality factor value received from the identified wireless power receiver, and comparing the measured quality factor value with the determined threshold value to determine whether the foreign object is present, wherein the threshold value is determined by applying a weight which increases according to the reference quality factor value.

Hereinafter, apparatuses and various methods according to embodiments will be described in detail with reference to the accompanying drawings. In general, a suffix such as "module" or "unit" may be used to refer to elements or components. Use of such a suffix herein is merely intended to facilitate description of the specification, and the suffix itself is not intended to have any special meaning or function.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In the description of embodiments, an apparatus having a function for transmitting wireless power in a wireless charging system may be used interchangeably with a wireless power transmitter, a wireless power transfer apparatus, a wireless electric power transfer apparatus, a wireless electric power transmitter, a transmission end, a transmitter, a transmission apparatus, a transmission side, a wireless power transfer apparatus, a wireless power tranferer, etc., for convenience of description. An apparatus having a function for receiving wireless power from a wireless power transfer apparatus may be used interchangeably with a wireless electric power reception apparatus, a wireless electric power receiver, a wireless power reception apparatus, a wireless power receiver, a reception terminal, a reception side, a reception apparatus, a receiver, etc.

The transmitter according to embodiment may be configured in the form of a pad, a cradle, an access point (AP), a small base station, a stand, a ceiling embedded structure or a wall-mounted structure. One transmitter may transfer power to a plurality of wireless power reception apparatuses. To this end, the transmitter may include at least one wireless power transfer means. Here, the wireless power transfer means may use various wireless power transfer standards based on an electromagnetic induction method of performing charging using the electromagnetic induction principle in which a magnetic field is generated in a power transfer-end coil and electricity is induced in a reception-end coil by the magnetic field. Here, the wireless power transfer means may include wireless charging technology of the electromagnetic induction method defined in the Wireless Power Consortium (WPC) and Power Matters Alliance (PMA) which are the wireless charging technology organizations.

In addition, a receiver according to an embodiment may include at least one wireless power reception means and may simultaneously receive wireless power from two or more transmitters. Here, the wireless power reception means may include wireless charging technology of the electromagnetic induction method defined in the Wireless Power Consortium (WPC) and Power Matters Alliance (PMA) which are the wireless charging technology organizations.

The receiver according to the embodiment may be used in a small electronic apparatus such as a mobile phone, a smartphone, a laptop, a digital broadcast terminal, a personal digital assistant (PDA), a portable multimedia player (PMP), a navigation system, an MP3 player, an electric toothbrush, an electronic tag, a lighting device, a remote controller, a fishing float, a wearable device such as a smart watch, etc. without being limited thereto, and may be used in any apparatus including wireless power reception means according to embodiment to charge a battery.

FIG. 1 is a block diagram illustrating a wireless charging system according to an embodiment.

Referring to FIG. 1, the wireless charging system roughly includes a wireless power transfer end 10 for wirelessly transmitting power, a wireless power reception end 20 for receiving the transmitted power and an electronic apparatus 30 for receiving the received power.

For example, the wireless power transfer end 10 and the wireless power reception end 20 may perform in-band communication in which information is exchanged using the same frequency band as the operating frequency used for wireless power transfer.

In in-band communication, when a power signal 41 transmitted by the wireless power transfer end 10 is received by the wireless power reception end 20, the wireless power reception end 20 may modulate the received power signal and transmit a modulated signal 42 to the wireless power transfer end 10.

In another example, the wireless power transfer end 10 and the wireless power reception end 20 may perform out-of-band communication in which information is exchanged using the frequency band different from the operating frequency used for wireless power transfer.

For example, the information exchanged between the wireless power transfer end 10 and the wireless power reception end 20 may include status information of each other and control information. Here, the status information and the control information exchanged between the transmission end and the reception end will become more apparent through the following description of the embodiments.

In-band communication and out-of-communication may provide bidirectional communication, but the embodiments are not limited thereto. In another embodiment, in-band communication and out-of-communication may provide a unidirectional communication or half duplex communication.

For example, unidirectional communication may, but is not limited to, mean transmission of information from the wireless power reception end 20 to the wireless power transfer end 10 or transmission from the wireless power transfer end 10 to the wireless power reception end 20.

The half duplex communication method is characterized in that bidirectional communication between the wireless power reception end 20 and the wireless power transfer end 10 is enabled but information can be transmitted only by one device at a certain point in time.

The wireless power reception end 20 according to the embodiment may acquire a variety of status information of the electronic apparatus 30. For example, the status information of the electronic apparatus 30 may include, but is not limited to, current power usage information, current power usage information, information for identifying an executed application, CPU usage information, battery charge status information, battery output voltage/current information, etc. and may include information capable of being acquired from the electronic apparatus 30 and being used for wireless power control.

In particular, the wireless power transfer end 10 according to the embodiment may transmit a predetermined packet indicating whether fast charging is supported to the wireless power reception end 20. The wireless power reception end 20 may inform the electronic apparatus 30 that the wireless power transfer end 10 supports the fast charging mode, upon determining that the wireless power transfer end 10 supports the fast charging mode. The electronic apparatus 30 may display information indicating that fast charging is possible through a predetermined display means, for example, a liquid crystal display.

In addition, the user of the electronic apparatus 30 may select a predetermined fast charging request button displayed on the liquid crystal display means and control the wireless power transmission end 10 to operate in the fast charging mode. In this case, when the user selects the fast charging request button, the electronic apparatus 30 may transmit a predetermined fast charging request signal to the wireless power reception end 20. The wireless power reception end 20 may generate and transmit a charging mode packet corresponding to the received fast charging request signal to the wireless power transmission end 10, thereby switching a normal low-power charging mode to the fast charging mode.

Figure 2A:
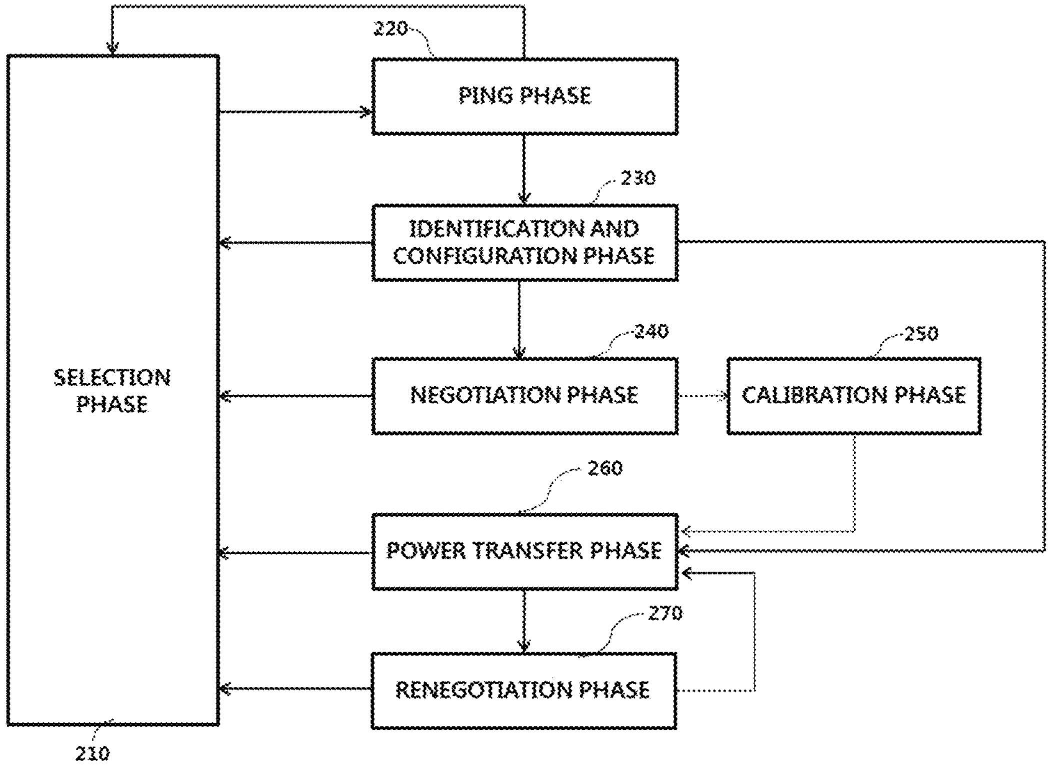
FIG. 2A is a state transition diagram explaining a wireless transmission procedure according to another embodiment.

FIG. 2A is a state transition diagram explaining a wireless transmission procedure according to another embodiment.

Referring to FIG. 2A, power transfer from the transmitter to the receiver may be broadly divided into a selection phase 210, a ping phase 220, an identification and configuration phase 230, a negotiation phase 240, a calibration phase 250, a power transfer phase 260 and a renegotiation phase 270.

The selection phase 210 may transition when power transfer starts or when a specific error or a specific event is detected while power transfer is maintained. The specific error and the specific event will become apparent from the following description. In addition, in the selection phase 210, the transmitter may monitor whether an object is present on an interface surface. Upon detecting that the object is present on the interface surface, the transmitter may transition to the ping step 220. In the selection phase 210, the transmitter transmits an analog ping signal having a very short pulse and detects whether an object is present in an active area of the interface surface based on current change of a transmission coil or a primary coil.

In one embodiment, when the object is detected in the selection phase 210, the quality factor value may be measured in order to determine whether the wireless power receiver is placed in the charging area along with the foreign object. The inductance and/or series resistance component in the coil of the wireless power transmitter may be reduced according to environmental change and thus the quality factor may be reduced. In order to determine whether a foreign object is present using the measured quality factor, the wireless power transmitter may receive, from the wireless power receiver, a reference quality factor value measured in advance in a state in which a foreign object is not present. (Negotiation phase 240) The received reference quality factor value and the measured quality factor value may be compared to determine whether a foreign object is present. However, in the case of a wireless power receiver having a low reference quality factor value (the wireless power receiver may have a low reference quality factor according to the characteristics of the wireless power receiver), since the quality factor value measured when the foreign object is present is not significantly changed, it may be difficult to determine whether a foreign object is present. Accordingly, it is necessary to determine whether a foreign object is present by further considering another determination element or using another method.

In another embodiment, when the object is detected in the selection phase 210, the quality factor value within a specific frequency region (e.g., an operating frequency region) may be measured in order to determine whether the wireless power receiver is placed in the charging area along with a foreign object. The inductance and/or series resistance component in the coil of the wireless power transmitter may be reduced according to environmental change and thus the resonant frequency of the coil of the wireless power transmitter may be changed (shifted). That is, the quality factor peak frequency, at which a maximum quality factor is measured, may be moved.

For example, since the wireless power receiver includes a magnetic shield (a shielding material) having high permeability, the high permeability may increase the inductance value measured in the coil of the wireless power transmitter. In contrast, a foreign object formed of a metal material may reduce inductance.

Figure 2B:
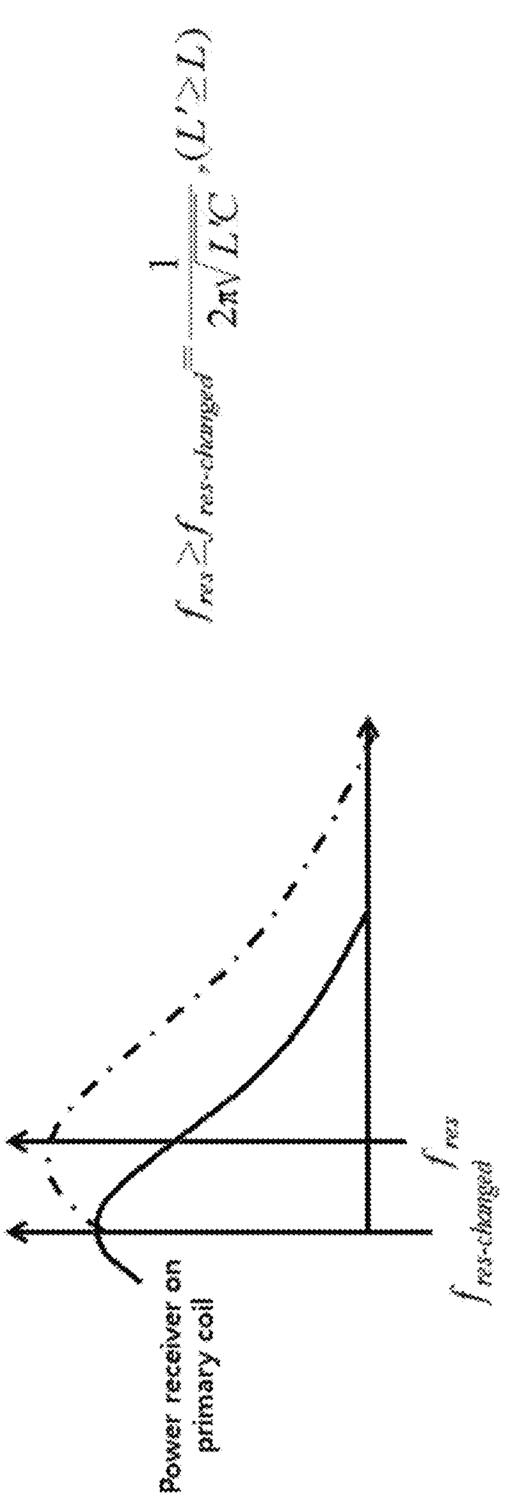
FIG. 2B is a graph illustrating the resonance frequency changing with a power receiver on a primary coil.
Figure 2C:
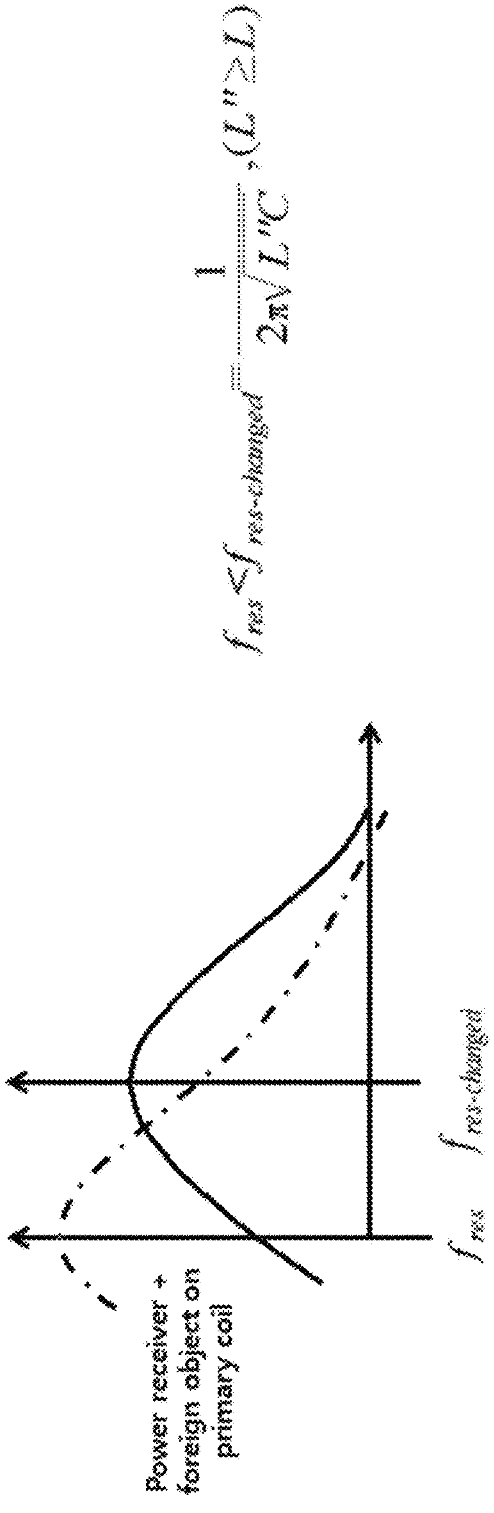
FIG. 2C is a graph illustrating the resonance frequency changing with the power receiver and a foreign object on the primary coil.

For example, when the resonant frequency of the coil of the wireless power transmitter is 100 kHz, the graph of the quality factor measured when the wireless power receiver or the foreign object is placed in the charging area is changed as shown in FIGS. 2B and 2C.

In the case of the wireless power receiver, since the L value is increased, the resonant frequency is decreased and moved (shifted) to the left on the frequency axis.

In the case of the foreign object, since the L value is decreased, the resonant frequency is increased and moved (shifted) to the right on the frequency axis.

In order to determine whether a foreign object is present using the measured maximum quality factor peak frequency (measured peak frequency), the wireless power transmitter may receive, from the wireless power receiver, the reference maximum quality factor frequency (reference peak frequency) value measured in advance in a state in which a foreign object is not present. (Negotiation phase 240) The received reference peak frequency value and the measured peak frequency value may be compared to determine whether a foreign object is present.

This method may be used along with the quality factor value comparison method. When there is no significant difference between the reference quality factor value and the measured quality factor value as the result of comparison (e.g., a difference of 10% or less (for reference, it may be immediately determined that a foreign object is present when the difference exceeds 10%)), the reference peak frequency and the measured peak frequency may be compared to determine the foreign object. The detailed comparison method will be described in the below-described embodiments of FIGS. 1 to 30.

In the ping step 220, when the object is detected, the transmitter activates the receiver and transmits a digital ping for identifying whether the receiver is compatible with the WPC standard. In the ping step 220, when a response signal to the digital ping, for example, a signal strength packet, is not received from the receiver, the transmitter may transition to the selection phase 210 again. In addition, in the ping phase 220, when a signal indicating that power transfer has been terminated, that is, a charging termination packet, is received from the receiver, the transmitter may transition to the selection phase 210.

If the ping phase 220 is terminated, the transmitter may transition to the identification and configuration phase 230 for identifying the receiver and collecting the configuration and status information of the receiver.

In the identification and configuration phase 230, when an unexpected packet is received, when an expected packet is not received during a predetermined time (timeout), when a packet transmission error occurs, or when power transfer contract is not established (no power transfer contract), the transmitter may transition to the selection phase 210.

The transmitter may determine whether entry into the negotiation phase 240 is necessary based on the negotiation field value of the configuration packet received in the identification and configuration phase 230.

Upon determining that negotiation is necessary, the transmitter may enter the negotiation phase 240 to perform a predetermined FOD procedure.

In contrast, upon determining that negotiation is not necessary, the transmitter may immediately transition to the power transfer phase 260.

In the negotiation phase 240, the transmitter may receive a foreign object detection (FOD) status packet including a reference quality factor value. At this time, the transmitter may determine a threshold value for FO detection based on the reference quality factor value. For example, the transmitter may determine a threshold value or a threshold range for determining whether a foreign object is present using a predetermined threshold generation function using a reference quality factor value as a parameter. Here, the threshold value or threshold range calculated by the threshold generation function is less than the reference quality factor value. The threshold value FO_Threshold for detecting the foreign object according to an embodiment may be determined based on a reference quality factor value RQF_Value, a predetermined design factor Design_factor corresponding to the wireless power transmitter, a tolerance defined in the standard, and a weight. Here, the weight may linearly or exponentially increase according to the reference quality factor value. That is, the threshold value for detecting the foreign object may be determined by Equation 1:

$$FO\_Threshold=(RQF\_Value*Design\_factor)+tolerance-weight \quad \text{(Equation 1)}$$

In general, if a foreign object is placed in a charging area, the quality factor value measured in the resonant circuit of the transmitter is lowered as compared to the case where the foreign object is not present. If the foreign object is placed in the charging area in an actual wireless charging system, a rate at which the measured quality factor value is reduced relative to the reference quality factor value may vary according to the type of the receiver placed in the charging area, that is, the reference quality factor value of the wireless power receiver. In particular, as the reference quality factor value increases, the decrease rate of the quality factor value due to placement of the foreign object rapidly increases. Accordingly, the transmitter according to the present invention may determine the threshold value (or the threshold range) such that the ratio of the threshold value for detecting the foreign object to the reference quality factor value decreases as the reference quality factor value of the wireless power receiver increases. As a result, it is possible to reduce a probability that the transmitter fails to detect the foreign object.

The transmitter may compare the quality factor value measured after detecting an object with the threshold value determined for FO detection to determine whether the FO is present in the charging area, and control power transfer according to the FO detection result. For example, when the FO is detected, the transmitter may stop power transfer and output a predetermined warning alarm indicating that the FO has been detected.

When the FO is detected, the transmitter may return to the selection phase 210. In contrast, when the FO is not detected, the transmitter may transition to the power transfer phase 260 through the calibration phase 250. Specifically, when the FO is not detected, the transmitter may measure power loss in the reception end and the transmission end, in order to determine the strength of the power received by the reception end and to determine the strength of the power transmitted by the transmission end in the calibration phase 250. That is, the transmitter may predict power loss based on a difference between the transmission power of the transmission end and the reception power of the reception end in the calibration phase 250. The transmitter according to one embodiment may calibrate the threshold value for FOD using the predicted power loss.

In the power transfer phase 260, when an unexpected packet is received, when an expected packet is not received during a predetermined time (timeout), when power transfer contract violation occurs or when charging is terminated, the transmitter may transition to the selection phase 210.

In addition, in the power transfer phase 260, if a power transfer contract needs to be reconfigured according to transmitter status change, etc., the transmitter may transition to the renegotiation phase 270. At this time, when renegotiation is normally terminated, the transmitter may return to the power transfer phase 260.

The power transfer contract may be configured based on the transmitter and receiver status information and characteristic information. For example, the transmitter status information may include information on the maximum amount of transmittable power, information on the maximum number of receivable receivers, etc. and the receiver status information may include information on required power.

Figure 3:
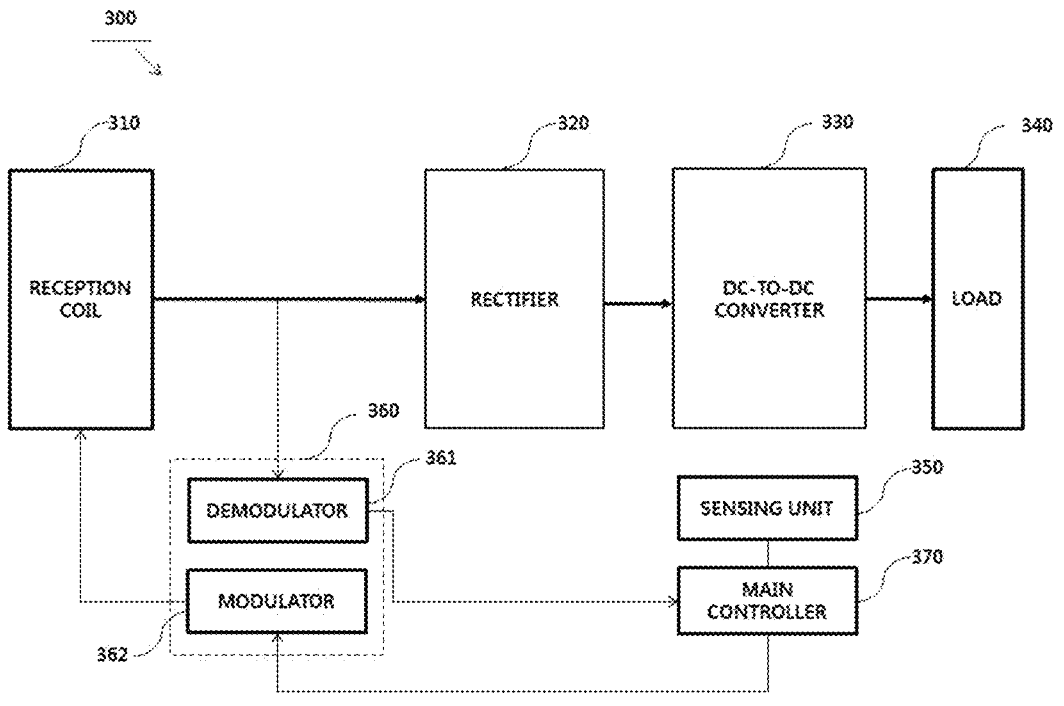
FIG. 3 is a block diagram illustrating the structure of a wireless power receiver interworking with a wireless power transmitter according to an embodiment.

FIG. 3 is a block diagram illustrating the structure of a wireless power receiver interworking with the wireless power transmitter.

Referring to FIG. 3, the wireless power receiver 300 may include at least one of a reception coil 310, a rectifier 320, a DC-to-DC converter 330, a load 340, a sensing unit 350, a communication unit 360, and a main controller 370. The communication unit 360 may include a demodulator 361 and a modulator 362.

Although the wireless power receiver 300 shown in the example of FIG. 3 is shown as exchanging information with the wireless power transmitter 600 through in-band communication, this is merely an example and the communication unit 360 according to another embodiment may provide short-range bidirectional communication through a frequency band different from a frequency band used to transmit a wireless power signal.

AC power received through the reception coil 310 may be transmitted to the rectifier 320. The rectifier 320 may convert the AC power into DC power and transmit the DC power to the DC-to-DC converter 330. The DC-to-DC converter 330 may convert the strength of the DC power output from the rectifier into a specific strength required by the load 340 and transmit the converted power to the load 340.

The sensing unit 350 may measure the strength of the DC power output from the rectifier 320 and provide the strength to the main controller 370. In addition, the sensing unit 350 may measure the strength of current applied to the reception coil 310 according to wireless power reception and transmit the measured result to the main controller 370. In addition, the sensing unit 350 may measure the internal temperature of the wireless power receiver 300 and provide the measured temperature value to the main controller 370.

For example, the main controller 370 may compare the strength of the DC power output from the rectifier with a predetermined reference value and determine whether overvoltage occurs. Upon determining that overvoltage occurs, a predetermined packet indicating that overvoltage has occurred may be generated and transmitted to the modulator 362. The signal modulated by the modulator 362 may be transmitted to the wireless power transmitter 600 through the reception coil 310 or a separate coil (not shown). If the strength of the DC power output from the rectifier is equal to or greater than the predetermined reference value, the main controller 370 may determine that a sensing signal is received and perform control to transmit a signal strength indicator corresponding to the sensing signal to the wireless power transmitter 600 through the modulator 362 upon receiving the sensing signal. In another example, the demodulator 361 may demodulate the AC power signal between the reception coil 310 and the rectifier 320 or the DC power signal output from the rectifier 320, identify whether a sensing signal is received, and provide the identified result to the main controller 370. At this time, the main controller 370 may perform control to transmit the signal strength indicator corresponding to the sensing signal through the modulator 362.

Figure 4:
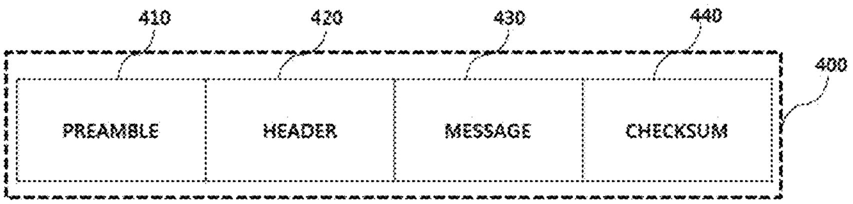
FIG. 4 is a diagram illustrating a packet format according to an embodiment.

FIG. 4 is a view illustrating a packet format according to an embodiment.

Referring to FIG. 4, the packet format 400 used for information exchange between the wireless power transfer end 10 and the wireless power reception end 20 may include a preamble 410 field for acquiring synchronization for demodulation of the corresponding packet and identifying an accurate start bit of the corresponding packet, a header 420 field for identifying the type of a message included in the corresponding packet, a message 430 field for transmitting the content (or payload) of the corresponding packet, and a checksum 440 field for identifying whether an error has occurred in the corresponding packet.

A packet reception end may identify the size of the message 430 included in the corresponding packet based on the value of the header 420.

In addition, the header 420 may be defined for each step of the wireless power transfer procedure, and the value of the header 420 may be defined as the same value in different phases of the wireless power transfer procedure. For example, referring to FIG. 10, it should be noted that the header value corresponding to end power transfer of the ping phase and end power transfer of the power transfer phase is 0x02.

The message 430 includes data to be transmitted by the transmission end of the corresponding packet. For example, the data included in the message 430 field may be a report, a request, or a response, without being limited thereto.

The packet 400 according to another embodiment may further include at least one of transmission end identification information for identifying the transmission end for transmitting the corresponding packet and reception end identification information for identifying the reception end for receiving the corresponding packet. The transmission end identification information and the reception end identification may include IP address information, MAC address information, product identification information, etc. However, the present disclosure is not limited thereto and information for distinguishing the reception end and the transmission end in the wireless charging system may be included.

The packet 400 according to another embodiment may further include predetermined group identification information for identifying a reception group if the corresponding packet is received by a plurality of apparatuses.

FIG. 5 is a view illustrating the types of packets transmitted from the wireless power receiver to the wireless power transmitter according to an embodiment.

Referring to FIG. 5, the packet transmitted from the wireless power receiver to the wireless power transmitter may include a signal strength packet for transmitting the strength information of a sensed ping signal, a power transfer type (end power transfer) for requesting power transfer end from the transmitter, a power control hold-off packet for transferring information on a time waiting until actual power is controlled after a control error packet for control is received, a configuration packet for transferring configuration information of the receiver, an identification packet and an extended identification packet for transmitting receiver identification information, a general request packet for transmitting a general request message, a specific request packet for transmitting a specific request message, an FOD status packet for transmitting a reference quality factor value for FO detection, a control error packet for controlling power transmitted by the transmitter, a renegotiation packet for starting renegotiation, a 24-bit received power packet for transmitting the strength information of the received power, and a charge status packet for transmitting the current charging status information of the load.

The packets transmitted from the wireless power receiver to the wireless power transmitter may be transmitted using in-band communication using the same frequency band as the frequency band used to transmit wireless power.

Figure 6A:
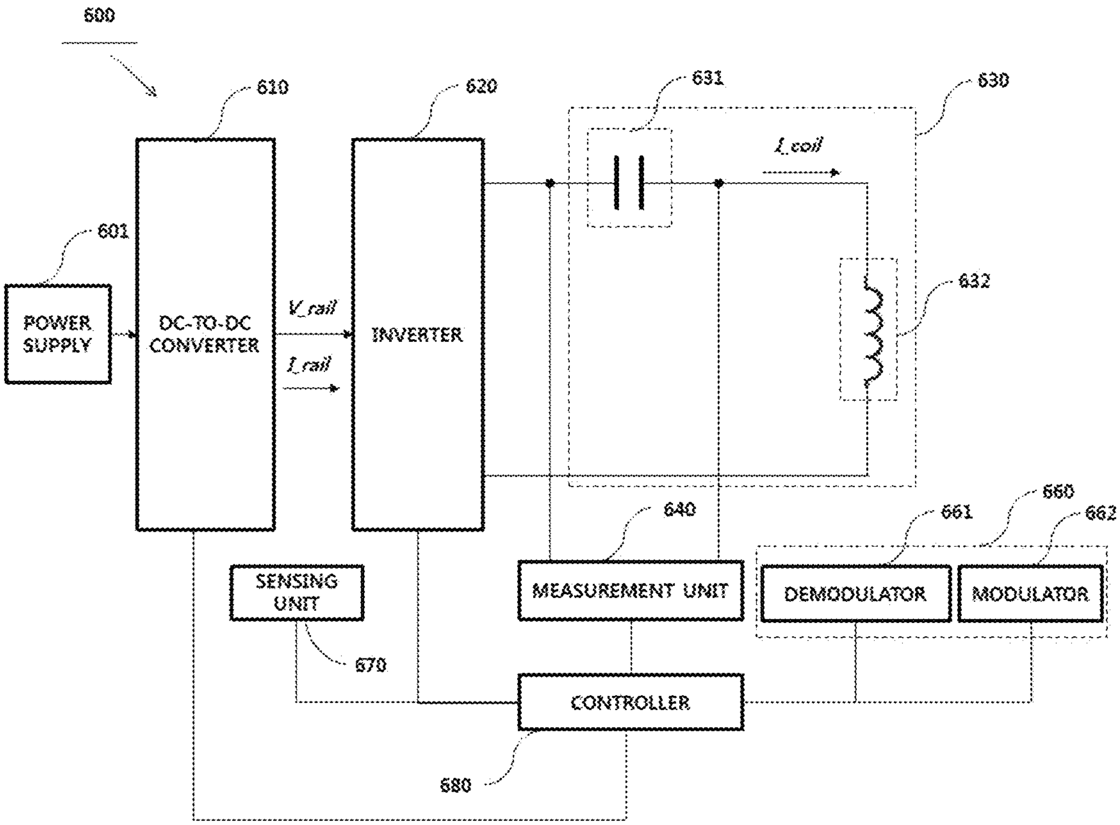
FIG. 6A is a block diagram illustrating the structure of a foreign object detection apparatus according to an embodiment.

FIG. 6A is a block diagram illustrating the structure of a foreign object detection apparatus according to an embodiment.

Referring to FIG. 6A, a foreign object detection apparatus 600 may include a power supply 601, a DC-to-DC converter 610, an inverter 620, a resonant circuit 630, a measurement unit 640, a communication unit 660, a sensing unit 670 and a controller 680. The foreign object detection apparatus 600 may be mounted in the wireless power transmission apparatus.

The resonant circuit 630 may include a resonant capacitor 631 and a resonant inductor 632, and the communication unit 660 may include at least one of a demodulator 661 and a modulator 662.

The power supply 601 may receive DC power through an external power terminal and transmit the DC power to the DC-to-DC converter 610.

The DC-to-DC converter 610 may convert the strength of the DC power received from the power supply 601 into a specific strength of DC power under control of the controller 680. For example, the DC-to-DC converter 610 may include a variable voltage generator capable of adjusting the strength of the voltage, without being limited thereto.

The inverter 620 may convert the converted DC power into AC power. The inverter 620 may convert the DC power signal input through control of a plurality of switches into an AC power signal and output the AC power signal.

For example, the inverter 620 may include a full bridge circuit. However, the present disclosure is not limited thereto and the inverter may include a half bridge circuit.

In another example, the inverter 620 may include a half bridge circuit and a full bridge circuit. In this case, the controller 680 may dynamically determine whether the inverter 620 operates as a half bridge or a full bridge.

The wireless power transmission apparatus according to one embodiment may adaptively control the bridge mode of the inverter 620 according to the strength of the power required by the wireless power reception apparatus. Here, the bridge mode includes a half bridge mode and a full bridge mode.

For example, if the wireless power reception apparatus requests low power of 5 W, the controller 680 may perform control such that the inverter 620 is driven in the half bridge mode. In contrast, if the wireless power reception apparatus requests high power of 15 W, the controller 680 may perform control such that the inverter is driven in the full bridge mode.

In another example, the wireless power transmission apparatus may adaptively determine the bridge mode according to a sensed temperature and drive the inverter 620 in the determined bridge mode. For example, if the temperature of the wireless power transmission apparatus exceeds a predetermined reference value while wireless power is transmitted using the half bridge mode, the controller 680 may perform control to deactivate the half bridge mode and activate the full bridge mode. That is, the wireless power transmission apparatus may increase the voltage and decrease the strength of current flowing in the resonant circuit 630 through the full bridge circuit for transmission of power having the same strength, thereby maintaining the internal temperature of the wireless power transmission apparatus at a reference value or less.

In general, the amount of heat generated in an electronic part mounted in the electronic apparatus may be more sensitive to the strength of current than the strength of the voltage applied to the electronic part.

In addition, the inverter 620 may not only convert the DC power into AC power but also change the strength of the AC power.

For example, the inverter 620 may adjust the strength of the output AC power by adjusting the frequency of a reference alternating current signal used to generate the AC power under control of the controller 680. To this end, the inverter 620 may include a frequency oscillator for generating the reference alternating current signal having a specific frequency. However, this is merely an example and the frequency oscillator may be mounted independently of the inverter 620 and mounted at one side of the foreign object detection apparatus 600.

In another example, the foreign object detection apparatus 600 may further include a gate driver (not shown) for controlling the switch provided in the inverter 620. In this case, the gate driver may receive at least one pulse width modulation signal from the controller 680 and control the switch of the inverter 620 according to the received pulse width modulation signal. The controller 680 may control the duty cycle, that is, the duty rate, and phase of the pulse width modulation signal to control the strength of the output power of the inverter 620. The controller 680 may adaptively control the duty cycle and phase of the pulse width modulation signal based on the feedback signal received from the wireless power reception apparatus.

The measurement unit 640 may measure at least one of a voltage, current and impedance across the resonant capacitor 631 according to the control signal of the controller 680 to calculate the quality factor value and/or inductance value of the resonant circuit 630. At this time, the calculated quality factor value and/or inductance value may be sent to the controller 680, and the controller 680 may temporarily store the quality factor value and/or the inductance value received from the measurement unit 640 in a predetermined recording region.

For example, when an object is detected in the charging area in the selection phase, the controller 680 may control the measurement unit 640 to calculate the quality factor value and/or the inductance value before entering the ping phase.

When the FOD status packet is received from the modulator 662 in the negotiation phase, the controller 680 may determine a threshold value (or a threshold range) for determining whether a foreign object is present based on information included in the FOD status packet.

The threshold value FO_Threshold for detecting the foreign object according to an embodiment may be determined based on a reference quality factor value RQF_Value, a predetermined design factor Design_factor corresponding to the wireless power transmitter, a tolerance defined in the standard, and a weight. Here, the weight may linearly or exponentially increase according to the reference quality factor value. That is, the controller 680 may determine the threshold value for detecting the foreign object by Equation 1:

$$\text{FO\_Threshold}=(\text{RQF\_Value}*\text{Design\_factor})+\text{tolerance}-\text{weight} \quad \text{(Equation 1)}$$

For example, although the weight may be calculated by a predetermined linear function using a reference quality factor value as a parameter, the embodiment is not limited thereto and the weight may be calculated by a higher-order function such as a second-order function or higher.

In another example, the weight may be predefined for each wireless power receiver type and recorded and maintained in the predetermined recording region, for example, a nonvolatile memory, of the foreign object detection apparatus 600. At this time, the weight of each wireless power receiver type may be maintained in the form of a mapping table, without being limited thereto.

The threshold range for detecting the foreign object according to another embodiment is identified by an upper-limit threshold value FO_Theshold_Upper_Limit and a lower-limit threshold value FO_Theshold_Lower_Limit, and may be determined based on a reference quality factor value RQF_Value, a predetermined design factor Design_factor corresponding to the wireless power transmitter, a tolerance defined in the standard, an upper-limit weight and a lower-limit weight. Here, the upper-limit weight and the lower-limit weight may linearly or exponentially increase according to the reference quality factor value. That is, the controller 680 may determine the threshold range for detecting the foreign object by Equation 2:

$$\text{FO\_Threshold\_Upper\_Limit}=(\text{RQF\_Value}*\text{Design\_factor})+\text{tolerance}-\text{upper-limit weight}$$

$$\text{FO\_Threshold\_Lower\_Limit}=(\text{RQF\_Value}*\text{Design\_factor})+\text{tolerance}-\text{lower-limit weight} \quad \text{(Equation 2)}$$

The controller 680 may determine that a foreign object is present, if the measured quality factor value is between the upper-limit threshold value and the lower-limit threshold value.

The threshold value FO_Threshold for detecting the foreign object according to another embodiment may be determined by applying a differential (Diff) ratio according to the reference quality factor (RQF) value, as shown in Table 1 below.

For example, referring to Table 1 below, when the RQF value exceeds 80, the Diff ratio of 40% is applied. At this time, the threshold value FO_Threshold for detecting the foreign object may be calculated by RQF×0.6+tolerance.

In another example, referring to Table 1 below, if the RQF value is greater than or equal to 50 and is less than or equal to 60, the Diff Ratio of 10% is applied. At this time, the threshold value FO_Threshold for detecting the foreign object may be calculated by RQF×0.9+tolerance.

TABLE 1

| Reference quality factor (RQF) | Diff ratio | FO_Threshold |
|---|---|---|
| >80 | 40% | =RQF × 0.6 + tolerance |
| 80 ≥ RQF ≥ 70 | 30% | =RQF × 0.7 + tolerance |
| 70 ≥ RQF ≥ 60 | 20% | =RQF × 0.8 + tolerance |
| 60 ≥ RQF ≥ 50 | 10% | =RQF × 0.9 + tolerance |
| 50 ≥ RQF | 5% | =RQF × 0.95 + tolerance |

The wireless power transmitter may receive the reference quality factor value through the FOD status packet in the negotiation phase and adaptively determine FO_Threshold according to the received reference quality factor value. As shown in Table 1 above, as the RQF value increases, a difference between the RQF value and FO_Threshold increases according to the Diff ratio corresponding to the RQF value. In contrast, as the RQF value decreases, a difference between the RQF value and FO_Threshold decreases according to the Diff ratio corresponding to the RQF value. It should be noted that Table 1 above is only an example and the Diff ratio according to the RQF value may be differently determined according to the design of those skilled in the art and the configuration of the device.

In general, if a foreign object is placed in a charging area, the quality factor value measured in the resonant circuit of the transmitter is lowered as compared to the case where the foreign object is not present. If the foreign object is placed in the charging area in an actual wireless charging system, a rate at which the measured quality factor value is reduced relative to the reference quality factor value may vary according to the type of the receiver placed in the charging area, that is, the reference quality factor value of the wireless power receiver.

In particular, as the reference quality factor value increases, the decrease rate of the quality factor value due to placement of the foreign object rapidly increases. Accordingly, the controller 680 according to the present invention may determine the threshold value (or the threshold range) such that the ratio of the threshold value for detecting the foreign object to the reference quality factor value decreases as the reference quality factor value of the wireless power receiver increases. As a result, it is possible to reduce a probability that the transmitter fails to detect the foreign object.

The controller 680 may compare the quality factor value measured after detecting an object with the threshold value determined for FO detection to determine whether the FO is present in the charging area, and control power transfer according to the FO detection result.

For example, when the FO is detected, the controller 680 may stop power transfer, and perform control to output a predetermined waning alarm indicating that the FO has been detected. Here, the warning alarm may be output through at least one of a beeper, an LED lamp, a vibration element and a liquid crystal display provided in the foreign object detection apparatus, without being limited thereto.

For example, if the quality factor value measured before entering the ping phase after detecting the object in the selection phase is less than the determined threshold value, the controller 680 may determine that the foreign object is present in the charging area.

In another example, if the quality factor value measured before entering the ping phase after detecting the object in the selection phase is included in the determined threshold range, the controller 680 may determine that the foreign object is present in the charging area.

The reference quality factor value included in the FOD status packet may be determined to be the smallest value of the quality factor values calculated in correspondence with the wireless power receiver at a specific position of a charging bed of a wireless power transmitter specified for standard performance test.

In addition, if the foreign object is detected in the negotiation phase, the controller 680 may return to the selection phase and control the measurement unit 640 to calculate the quality factor value of the resonant circuit 630 at predetermined periods.

At this time, the controller 680 may compare the quality factor value acquired in a state of detecting the foreign object with a predetermined threshold value (or a threshold range) to determine whether the detected foreign object has been removed from the charging area.

For example, the controller 680 may determine that the foreign object has been removed, if the quality factor value measured in the state in which the foreign object is detected is greater than a predetermined threshold value. In another example, the controller 680 may determine that the foreign object has been removed, if the quality factor value measured in the state in which the foreign object is detected exceeds an upper-limit threshold value.

In addition, the controller 680 may adaptively determine the threshold value for detecting the foreign object by referring to Table 1 above (referred to as a "threshold value determination table", for convenience of description).

Table 1 above may be maintained in the predetermined recording region of the memory (not shown) provided in the foreign object detection apparatus 600. When the FOD status packet including the reference quality factor value is received in the negotiation phase, the controller 680 may determine the threshold value for detecting the foreign object by referring to the received reference quality factor value and the threshold value determination table, and compare the determined threshold value with the pre-measured quality factor value to determine whether the foreign object is present.

Here, the threshold value determination table may be updated. For example, the foreign object detection apparatus may be connected to a specific server through a wired or wireless network and interwork with the server to update the threshold value determination table. In another example, the foreign object detection apparatus may receive or update the threshold value determination table from the connected wireless power receiver.

The threshold value determination table may be generated according to the type of the wireless power receiver, and the foreign object detection apparatus may determine the threshold value for detecting the foreign object by referring to the threshold value determination table corresponding to the type of the identified wireless power receiver.

In the wireless power receiver according to the embodiment, the threshold value determination table generated according to the type of the wireless power transmitter may be maintained. In this case, the wireless power receiver may transmit the threshold value determination table corresponding to the type of the identified wireless power transmitter to the wireless power transmitter. The wireless power transmitter may determine the threshold value for detecting the foreign object based on the received threshold value determination table.

As described above, the foreign object detection apparatus according to the embodiment may adaptively determine the threshold value for detecting the foreign object by referring to at least one of the type of the wireless power receiver and the threshold value determination table corresponding to the type of the wireless power transmitter.

Upon determining that the foreign object has been removed, the controller 680 may perform control to enter the power transfer phase again to resume charging of the wireless power reception apparatus.

In addition, the threshold value may include an inductance threshold value and a quality factor threshold value. If the determined value is a threshold range, the threshold range may include the inductance threshold range and the quality factor threshold range. The foreign object may be detected using the two threshold values, or the threshold value corresponding to the type may be determined according to the type of the reference value transmitted by each receiver to detect the foreign object.

Here, the FOD status packet may include at least one of a reference quality factor value and a reference inductance value corresponding to the wireless power receiver. The controller 680 may determine the quality factor threshold value and/or the inductance threshold value for determining whether the foreign object is present based on the received reference quality factor value and the reference inductance value. For example, although a value corresponding to 90% of the reference quality factor value and the reference inductance value may be determined as the quality factor threshold value and/or the inductance threshold value, the embodiment is not limited thereto and the ratio may be differently defined according to the design of those skilled in the art.

For example, the controller 680 may determine that the foreign object is present if the quality factor value stored previously (measured before the ping phase) is less than the determined quality factor threshold value or the pre-stored inductance value is less than the determined inductance threshold value.

The controller 680 may stop power transfer upon determining that the foreign object is present and perform control to output a predetermined warning alarm indicating that the foreign object has been detected. For example, the alarm unit may include, but is not limited to, a beeper, an LED lamp, a vibration element, a liquid crystal display, etc.

The reference quality factor value included in the FOD status packet may be determined to be the smallest value of the quality factor values calculated in correspondence with the wireless power receiver at a specific position of a charging bed of a specified wireless power transmitter.

The inductance value included in the FOD status packet may be determined to be the smallest value of the quality factor values calculated in correspondence with the wireless power receiver at a specific position of a charging bed of a wireless power transmitter specified for a standard performance test.

In addition, if the foreign object is detected in the negotiation phase, the controller 680 may return to the selection phase and control the measurement unit 640 to calculate the quality factor value and the inductance value of the resonant circuit 630 at predetermined periods. At this time, the controller 680 may compare the quality factor value and the inductance value acquired in a state of detecting the foreign object with the predetermined quality factor threshold value and the inductance threshold value to determine whether the detected foreign object has been removed from the charging area. In an additional embodiment, upon determining that the foreign object has been removed, the controller 680 may perform control to enter the power transfer phase and to resume charging of the wireless power reception apparatus. At this time, the controller may enter the power transfer phase while skipping the identification and configuration phase and/or the negotiation phase.

The demodulator 661 demodulates an in-band signal received from the wireless power reception apparatus and transmits the demodulated signal to the controller 680. For example, the demodulator 661 may demodulate the packet of FIG. 10 and transmit the demodulated packet to the controller 680.

The sensing unit 670 may measure the voltage, current, power, impedance and temperature of a specific terminal, a specific element and a specific position of the foreign object detection apparatus 600 (or the wireless power transmission apparatus).

For example, the sensing unit 670 may measure the voltage/current of the DC-converted power and provide the measured voltage/current to the controller 680. In addition, the sensing unit 670 may measure the internal temperature of the wireless power transmission apparatus and provide the measured result to the controller 680 in order to determine whether overheating has occurred. In this case, the controller 680 may adaptively cut off power supplied from the power supply or power supplied to the resonant circuit 630 based on the voltage/current value measured by the sensing unit 670. Therefore, a predetermined power cutoff circuit for blocking power supplied from the power supply 601 or DC power supplied to the inverter 620 may be further provided at one side of the foreign object detection apparatus 600.

The sensing unit 670 may further include a Hall sensor, a pressure sensor, etc. In this case, the Hall sensor or the pressure sensor may detect whether an object is present in the charging area, without being limited thereto.

The sensing unit 670 may detect change in current, voltage or impedance of the resonant circuit 630 while the analog ping signal is transmitted in the selection phase to detect whether an object is present in the charging area.

As described above, the foreign object detection apparatus 600 according to the embodiment may measure (or calculate) the quality factor value of the resonant circuit before entering the ping phase, when the object is detected in the selection phase, and compare the threshold value (or the threshold range) determined in the negotiation phase with the measured quality factor value to determine whether the foreign object is present, thereby significantly reducing a probability of foreign object detection failure.

The sensing unit may be replaced with the measurement unit and thus may be omitted.

In addition, the foreign object detection apparatus 600 according to the embodiment may dynamically determine the threshold value (or the threshold range) for detecting the foreign object according to the reference quality factor value corresponding to the wireless power receiver, thereby performing foreign object detection optimized for the wireless power receiver.

Figure 6B:
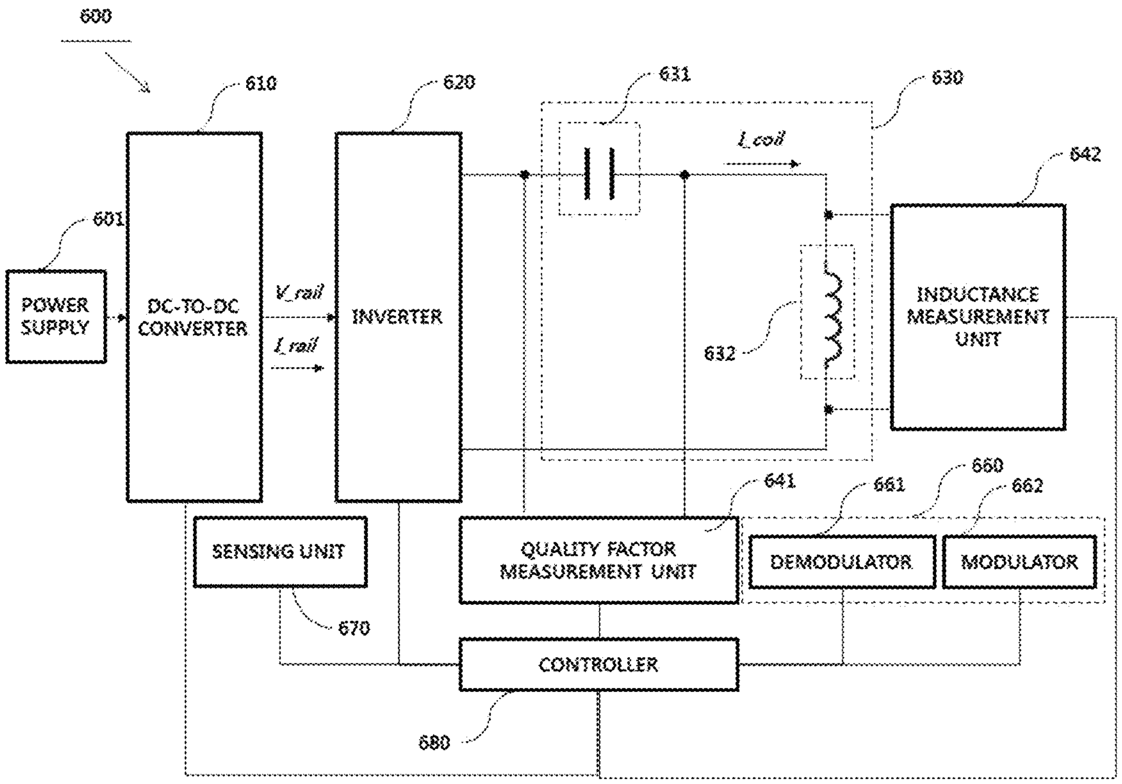
FIG. 6B is a block diagram illustrating the structure of a foreign object detection apparatus according to another embodiment.

For detailed operation of the remaining components shown in FIG. 6B, refer to the description of FIG. 6A.

FIG. 7A is a view illustrating the structure of an FOD status packet message according to an embodiment.

Referring to FIG. 7A, the FOD status packet message 700 may have a length of 2 bytes and include a reserved field 701 having a length of 6 bits, a mode field 702 having a length of 2 bits and a reference quality factor value field 703 having a length of 1 byte. All bits configuring the reserved field 701 may be set to 0.

As denoted by reference numeral 704, if the mode field 702 is set to a binary value of “00”, this may mean that a reference quality factor value measured and determined in a state in which the wireless power receiver is powered off is recorded in the reference quality factor value field 703.

FIG. 7B is a view illustrating the structure of an FOD status packet message according to an embodiment.

Referring to FIG. 7B, the FOD status packet message 700 may have a length of 2 bytes and include a first data field 701 having a length of 6 bits, a mode field 702 having a length of 2 bits and a reference quality factor value field 703 having a length of 1 byte.

As denoted by reference numeral 704, if the mode field 702 is set to a binary value of “00”, all bits configuring the first data field 701 are set to 0 and a reference quality factor value measured and determined in a state in which the wireless power receiver is powered off is recorded in the reference quality factor value field 703. In contrast, if the mode field 702 is set to a binary value of “01”, the reference inductance value measured and determined in a state in which a wireless power receiver is powered off is recorded in the first data field 701, and a reference quality factor value measured and determined in a state in which the wireless power receiver is powered off is recorded in the reference quality factor value field 703.

In the present embodiment, the foreign object detection apparatus (or the wireless power transmission apparatus)

may acquire at least one of the reference quality factor value and the reference inductance value corresponding to the wireless power receiver in the negotiation phase.

FIG. 7C is a view illustrating the structure of an FOD status packet message according to an embodiment.

Referring to FIG. 7C, the FOD status packet message 700 may have a length of 2 bytes and include a reserved field 701 having a length of 6 bits, a mode field 702 having a length of 2 bits and a reference value field 703 having a length of 1 byte. All bits configuring the reserved field 701 may be set to 0.

As denoted by reference numeral 704, if the mode field 702 is set to a binary value of "0 W", a reference quality factor value measured and determined in a state in which the wireless power receiver is powered off is recorded in the reference value field 703. In contrast, if the mode field 702 is set to a binary value of "01", the reference inductance value measured and determined in a state in which a wireless power receiver is powered off is recorded in the reference value field 703.

In the present embodiment, the foreign object detection apparatus (or the wireless power transmission apparatus) may acquire at least one of the reference quality factor value and the reference inductance value corresponding to the wireless power receiver in the negotiation phase.

Figure 8A:
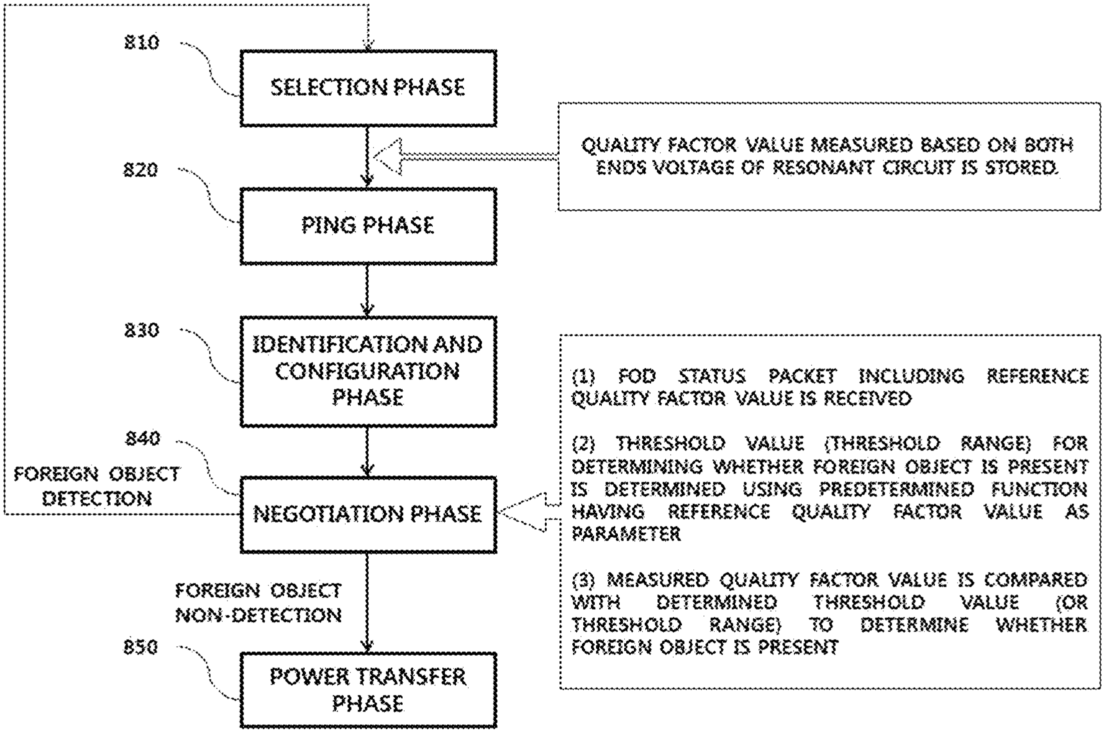
FIG. 8A is a diagram illustrating a status transition procedure for foreign object detection in a foreign object detection apparatus according to an embodiment.

FIG. 8A is a diagram illustrating a status transition procedure for foreign object detection in a foreign object detection apparatus according to an embodiment.

Referring to FIG. 8A, the foreign object detection apparatus may measure and store the quality factor value of the resonant circuit and then enter the ping phase 810, when an object is detected in the selection phase 810. In the ping phase 820, the foreign object detection apparatus may periodically transmit a predetermined power signal for identifying the wireless power receiver, for example, a digital ping.

When a signal strength indicator corresponding to the digital ping is received in the ping phase 820, the foreign object detection apparatus may enter the identification and configuration phase 830 to identify the wireless power receiver and to set various configuration parameters for the identified wireless power receiver.

If identification and configuration of the wireless power receiver is terminated, the foreign object detection apparatus may enter the negotiation phase 840 to receive the FOD status packet including the reference quality factor value.

The foreign object detection apparatus may determine a threshold value (or a threshold range) for determining whether a foreign object is present based on the reference quality factor value included in the FOD status packet and compare the stored quality factor value with the determined threshold value (or threshold range) to determine whether a foreign object is present in the charging area.

As described in FIG. 6A, in a wireless power receiver having a small reference quality factor value, drop in the quality factor value from the reference quality factor value and a ratio of the quality factor value to the reference quality factor value when the foreign object is placed in the charging area are relatively less than those of a wireless power receiver having a large reference quality factor value. Accordingly, the foreign object detection apparatus according to the embodiment may adaptively determine a threshold value (or threshold range) for detecting the foreign object according to the reference quality factor value received from the wireless power receiver.

Upon determining that the foreign object is present, the foreign object detection apparatus may stop power transfer and return to the selection phase 810. In contrast, upon determining that the foreign object is not present, the foreign object detection apparatus may enter the power transfer phase 850 to start wireless charging of the wireless power receiver.

Figure 8B:
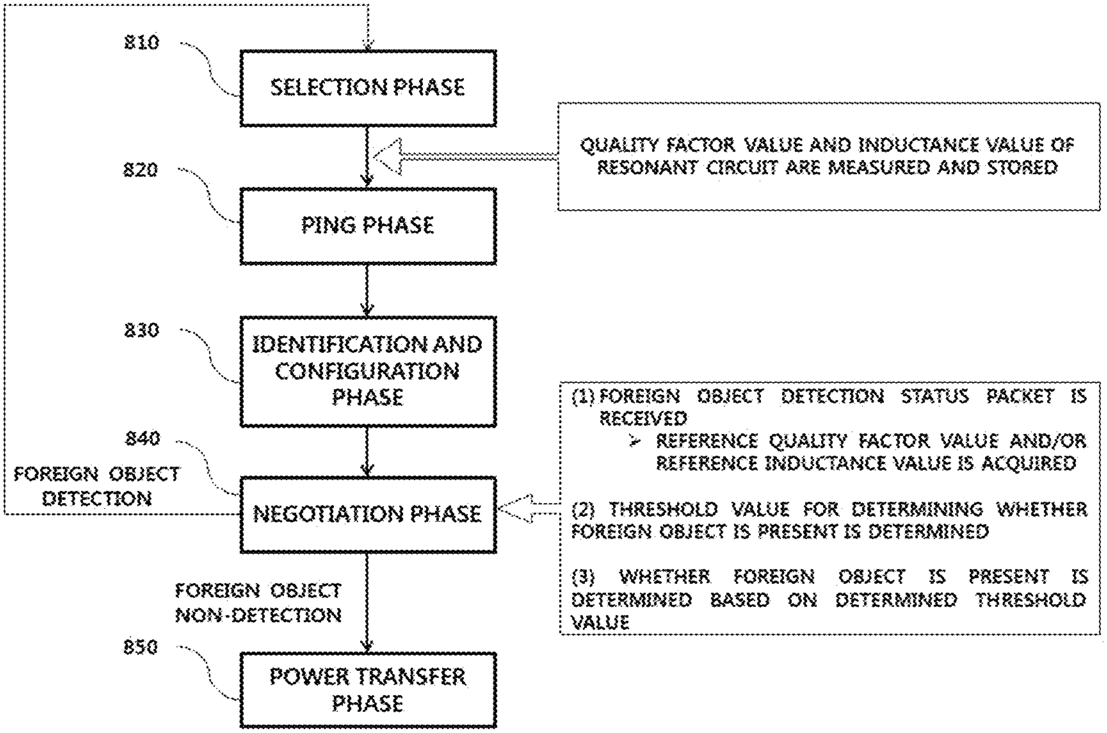
FIG. 8B is a diagram illustrating a status transition procedure for foreign object detection in a foreign object detection apparatus according to an embodiment.

FIG. 8B is a diagram illustrating a status transition procedure for foreign object detection in a foreign object detection apparatus according to an embodiment.

Referring to FIG. 8B, the foreign object detection apparatus may measure and store the quality factor value and the inductance value of the resonant circuit and then enter the ping phase 810, when an object is detected in the selection phase 810. In the ping phase 820, the foreign object detection apparatus may periodically transmit a predetermined power signal for identifying the wireless power receiver, for example, a digital ping.

When a signal strength indicator corresponding to the digital ping is received in the ping phase 820, the foreign object detection apparatus may enter the identification and configuration phase 830 to identify the wireless power receiver and set various configuration parameters for the identified wireless power receiver.

If identification and configuration of the wireless power receiver is terminated, the foreign object detection apparatus may enter the negotiation phase 840 to receive the FOD status packet including at least one of the reference quality factor value and the reference inductance value.

The foreign object detection apparatus may determine a threshold value (or a threshold range) for determining whether a foreign object is present based on the reference value(s) included in the FOD status packet and determine whether a foreign object is present in the charging area based on the determined threshold value (or threshold range).

Upon determining that the foreign object is present, the foreign object detection apparatus may stop power transfer and return to the selection phase 810. In contrast, upon determining that the foreign object is not present, the foreign object detection apparatus may enter the power transfer phase 850 to start wireless charging of the wireless power receiver. The foreign object detection apparatus may perform the calibration phase 250 before entering the power transfer phase 850 as described in FIG. 2.

Figure 9A:
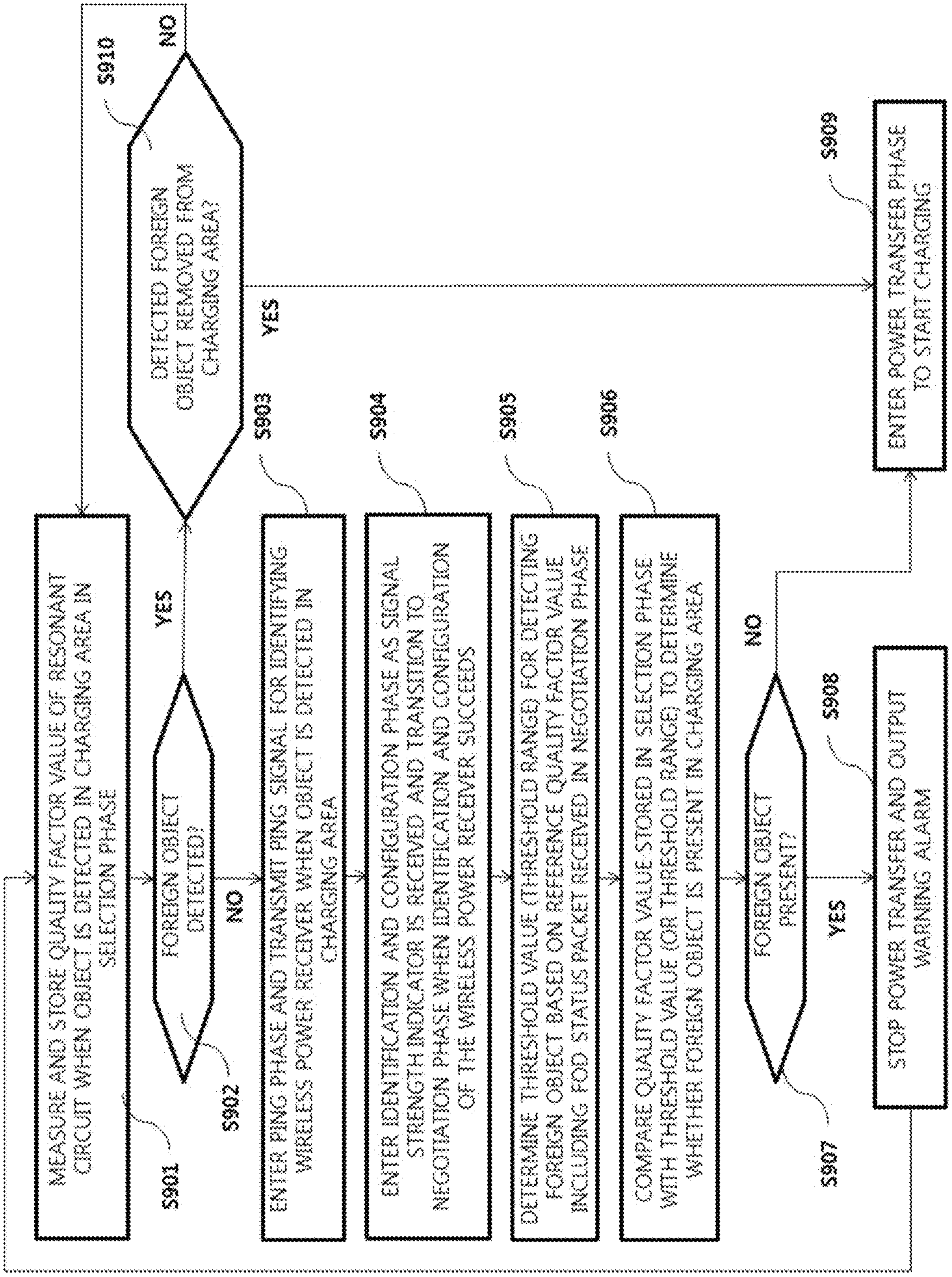
FIG. 9A is a flowchart illustrating a foreign object detection method in a wireless power transmission apparatus according to another embodiment.

FIG. 9A is a flowchart illustrating a foreign object detection method in a wireless power transmission apparatus according to another embodiment.

Referring to FIG. 9A, if an object is detected in the charging area in the selection phase, the wireless power transmission apparatus may measure and store the quality factor value of the resonant circuit in a predetermined recording region (S901).

The wireless power transmission apparatus may determine whether a foreign object has been detected previously (S902).

If a foreign object has not been detected, the wireless power transmission apparatus may enter the ping phase to wirelessly transmit a digital ping signal for identifying the wireless power receiver (S903).

The wireless power transmission apparatus may enter the identification and configuration phase when a signal strength indicator is received in response to the digital ping signal, and transition to the negotiation phase when identification and configuration of the wireless power receiver is terminated (S904).

The wireless power transmission apparatus may determine a threshold value (or threshold range) for determining whether a foreign object is present based on the reference quality factor value included in the FOD status packet received in the negotiation phase (S905).

Figure 11:
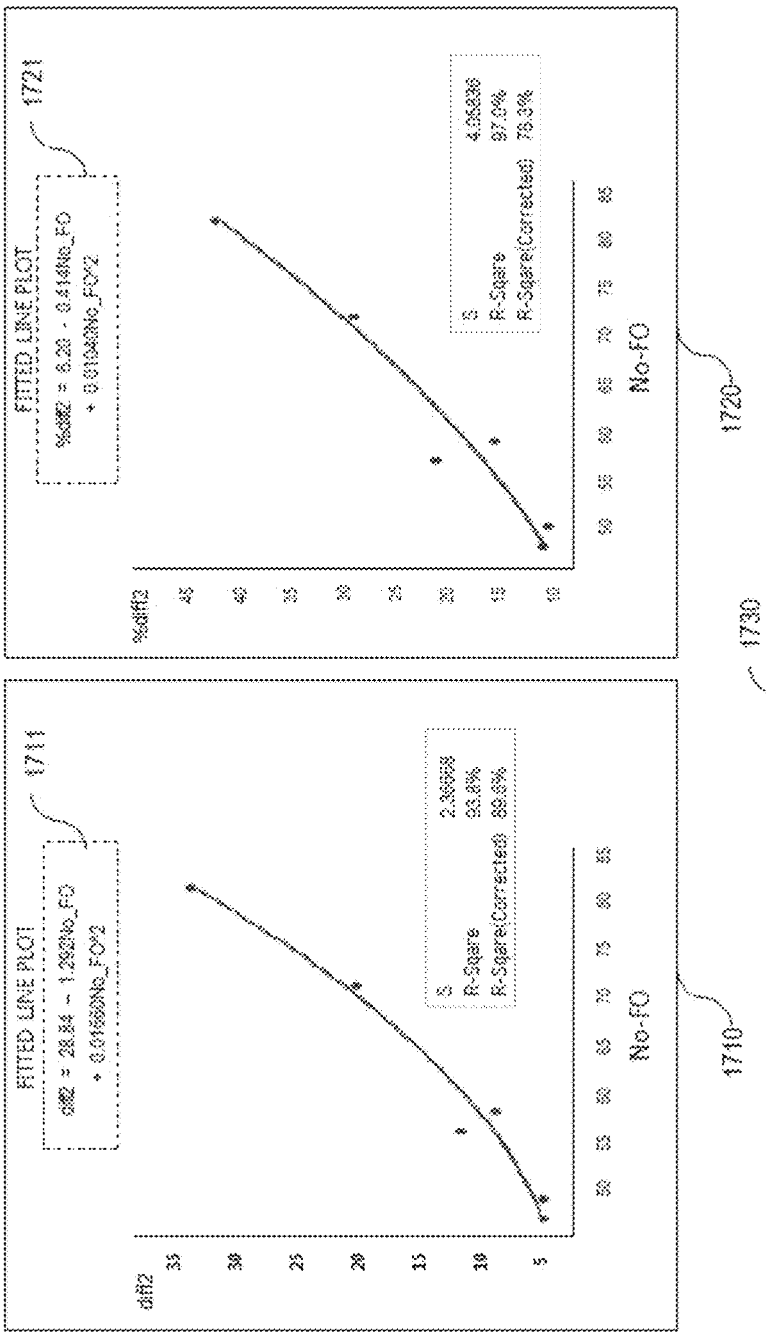

Here, for the method of determining the threshold value and the threshold range, refer to the description of FIGS. 11 to 13. The wireless power transmission apparatus may wirelessly transmit a power signal having a predetermined strength in the negotiation phase.

The wireless power transmission apparatus may compare the stored quality factor value with the determined threshold value (or threshold range) to determine whether a foreign object is present in the charging area (S906).

Upon determining that the foreign object is present, the wireless power transmission apparatus may stop power transfer, and perform control to output a predetermined warning alarm indicating that the foreign object has been detected (S907 to S908). Thereafter, the wireless power transmission apparatus may return to step 901.

Upon determining that the foreign object is not present in step 906, the wireless power transmission apparatus may enter the power transfer phase to start charging of the wireless power receiver (S909).

Upon determining that the foreign object has been already detected in step 902, the wireless power transmission apparatus may determine whether the detected foreign object has been removed from the charging area (S910). For the method of determining whether the detected foreign object has been removed, refer to the description of FIGS. 6A to 8B.

Upon determining that the foreign object has been removed, the wireless power transmission apparatus may enter the power transfer phase to resume charging of the wireless power receiver.

Upon determining that the foreign object has not been removed in step 910, the wireless power transmission apparatus may perform step 901.

Figure 9B:
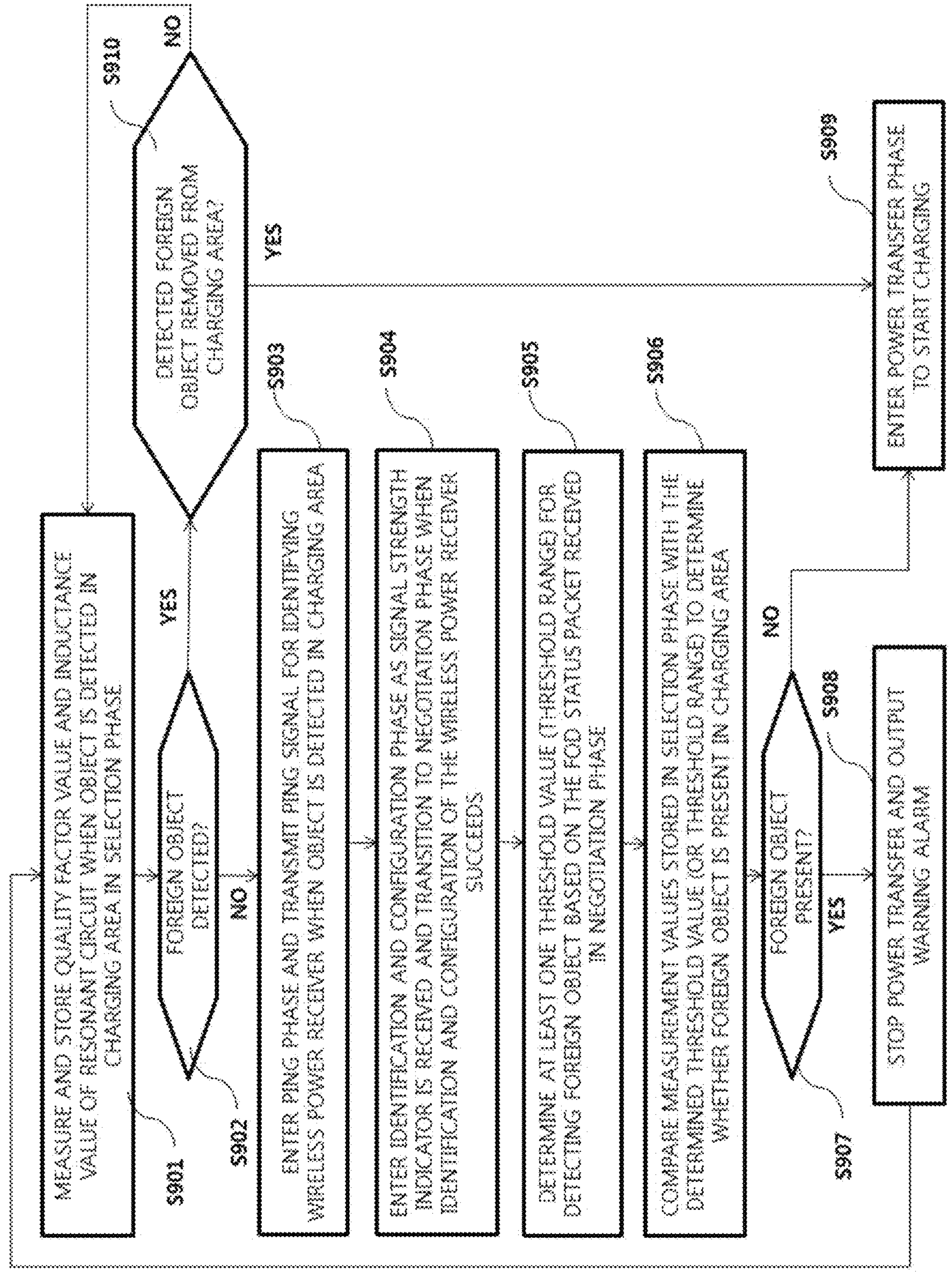
FIG. 9B is a flowchart illustrating a foreign object detection method in a wireless power transmission apparatus according to another embodiment.

FIG. 9B is a flowchart illustrating a foreign object detection method in a wireless power transmission apparatus according to another embodiment.

Referring to FIG. 9B, if an object is detected in the charging area in the selection phase, the wireless power transmission apparatus may measure and store the quality factor value and/or the inductance value of the resonant circuit in a predetermined recording region (S901).

The wireless power transmission apparatus may determine whether a foreign object has been detected (S902).

Upon determining that the foreign object has not been detected, the wireless power transmission apparatus may enter the ping phase to wirelessly transmit a digital ping signal for identifying the wireless power receiver (S903).

The wireless power transmission apparatus may enter the identification and configuration phase when a signal strength indicator is received in response to the digital ping signal, and transition to the negotiation phase when identification and configuration of the wireless power receiver is terminated (S904).

The wireless power transmission apparatus may determine at least one threshold value (or threshold range) for determining whether a foreign object is present based on the FOD status packet received in the negotiation phase (S905). Here, the threshold value may include an inductance threshold value and a quality factor threshold value. If the determined value is a threshold range, the threshold range may include an inductance threshold range and a quality factor threshold range. The wireless power transmission apparatus may wirelessly transmit a power signal having a predetermined strength in the negotiation phase.

The wireless power transmission apparatus may compare the stored values with the determined threshold value (or threshold range) to determine whether a foreign object is present in the charging area (S906).

Upon determining that the foreign object is present, the wireless power transmission apparatus may perform control to stop power transfer and to output a predetermined warning alarm indicating that the foreign object has been detected (optional) (S907 to S908). Thereafter, the wireless power transmission apparatus may return to step 901.

Upon determining that the foreign object is not present in step 906, the wireless power transmission apparatus may enter the power transfer phase to start charging of the wireless power receiver (S909).

Upon determining that the foreign object has already been detected in step 902, the wireless power transmission apparatus may determine whether the detected foreign object has been removed from the charging area (S910). Here, whether the detected foreign object has been removed from the charging area may be determined by comparing the quality factor value and the inductance value of the resonant circuit measured in step 901 with the threshold value (or the threshold range) determined in step 905, without being limited thereto.

Upon determining that the foreign object has been removed, the wireless power transmission apparatus may enter the power transfer phase to resume charging of the wireless power receiver.

Upon determining that the foreign object has not been removed in step 910, the wireless power transmission apparatus may perform step 901.

As described above, the wireless power transmission apparatus according to the embodiment may measure (or calculate) the quality factor value and inductance value of the resonant circuit before entering the ping phase, when the object is detected in the selection phase, and compare the threshold value determined based on the FOD status packet in the negotiation phase with the measured value to determine whether the foreign object is present, thereby significantly reducing the probability of foreign object detection failure.

Figure 10:
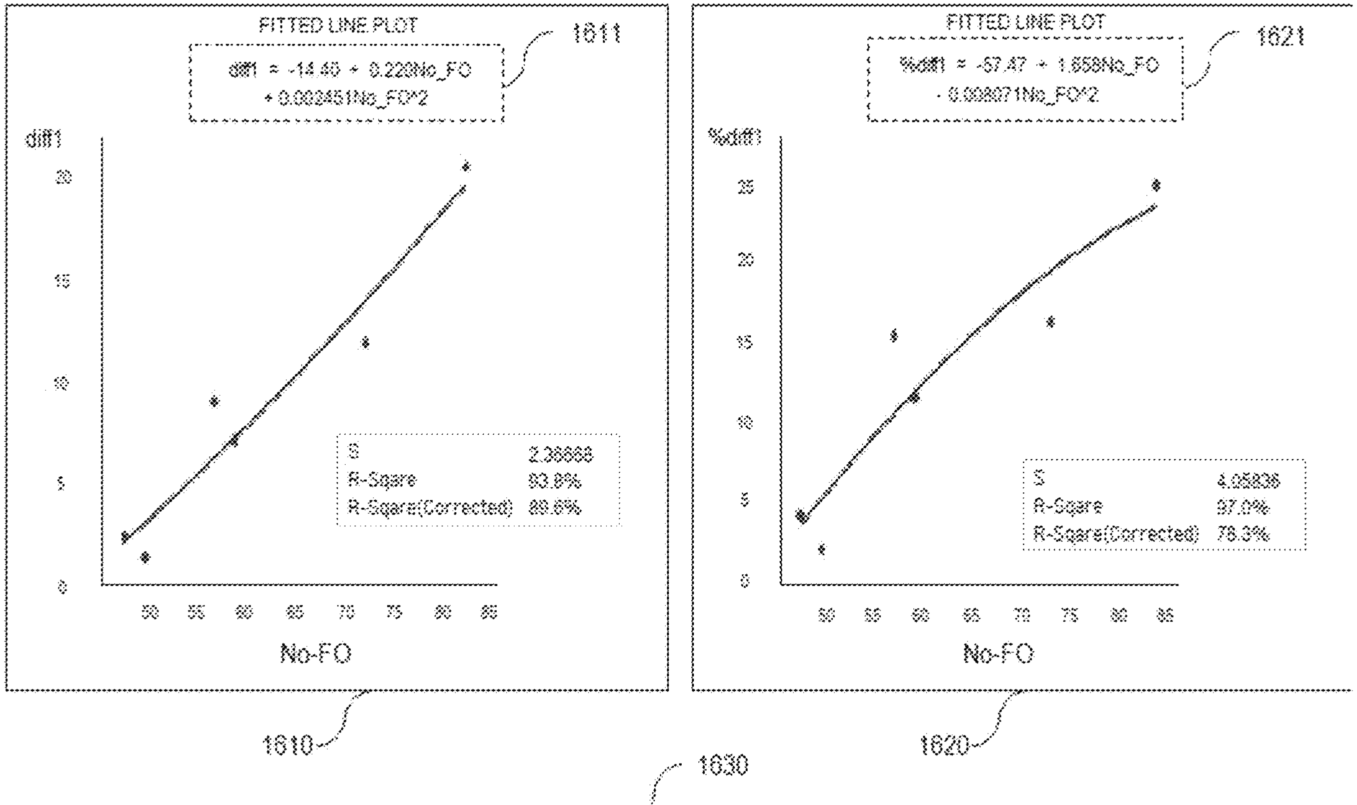
FIGS. 10 and 11 are graphs of experimental results showing a degree of lowering a quality factor value as compared to a reference quality factor value of each receiver type when a foreign object is placed in a charging area according to an embodiment.

FIG. 10 is a graph of experimental results showing a degree of lowering a quality factor value as compared to a reference quality factor value of each receiver type when a foreign object is placed in a charging area according to an embodiment.

FIG. 10 shows an experimental result when a 10-cent coin is placed in a charging area.

As denoted by reference numerals 1010 and 1030 of FIG. 10, it can be seen that, after placing the 10-cent coin in the charging area, an absolute differential diff1 between a quality factor value and a reference quality factor value increases as the reference quality factor value increases. At this time, a relationship between the quality factor NO_FO measured when the foreign object is not present, that is, the reference quality factor RFQ, and diff1 may be approximated by an equation denoted by reference numeral 1011. Although reference numeral 1011 is approximated by a quadratic equation, this is merely an example and a linear equation, a higher order equation, an exponential equation, etc. may be used.

As denoted by reference numerals 1020 and 1030 of FIG. 10, it can be seen that, after placing the 10-cent coin in the charging area, a differential ratio % diff1 between a quality factor value and a reference quality factor value increases as the reference quality factor value increases. At this time, a relationship between the quality factor NO_FO measured when the foreign object is not present, that is, the reference quality factor RFQ, and % diff1 may be approximated by an equation denoted by reference numeral 1021. Although reference numeral 1021 is approximated by a quadratic equation, this is merely an example and a linear equation, a higher order equation, an exponential equation, etc. may be used.

FIG. 11 is a graph of experimental results showing a degree of lowering a quality factor value as compared to a reference quality factor value of each receiver type when a foreign object is placed in a charging area according to another embodiment.

FIG. 11 shows an experimental result when a 25-cent coin is placed in a charging area.

As denoted by reference numerals 1110 and 1130 of FIG. 11, it can be seen that, after placing the 25-cent coin in the charging area, an absolute differential diff2 between a quality factor value and a reference quality factor value increases as the reference quality factor value increases. At this time, a relationship between the quality factor NO_FO measured when the foreign object is not present, that is, the reference quality factor RFQ, and diff2 may be approximated by an equation denoted by reference numeral 1111. Although reference numeral 1011 is approximated by a quadratic equation, this is merely an example and a linear equation, a higher order equation, an exponential equation, etc. may be used.

As denoted by reference numerals 1120 and 1130 of FIG. 11, it can be seen that, after placing the 25-cent coin in the charging area, a differential ratio % diff2 between a quality factor value and a reference quality factor value increases as the reference quality factor value increases. At this time, a relationship between the quality factor NO_FO measured when the foreign object is not placed, that is, the reference quality factor RFQ, and % diff2 may be approximated by an equation denoted by reference numeral 1121. Although reference numeral 1021 is approximated by a quadratic equation, this is merely an example and a linear equation, a higher order equation, an exponential equation, etc. may be used.

As described above, the wireless power transmission apparatus according to the embodiment may measure (or calculate) the quality factor value of the resonant circuit before entering the ping phase, when the object is detected in the selection phase, and compare the threshold value determined based on the FOD status packet in the negotiation phase with the measured value to determine whether the foreign object is present, thereby significantly reducing the probability of foreign object detection failure.

FIG. 12 is a view showing a result of measuring a quality factor value and an inductance value of a resonant circuit according to presence/absence of a foreign object for each receiver type.

Reference numeral 1210 shows the inductance value Ls, resistance value Rs and quality factor value Q of the resonant circuit measured in a state 1211 in which nothing is placed in the charging area, a state 1212 in which only a foreign object is placed, and a state 1213 in which only a receiver is placed.

Reference numeral 1220 shows the inductance value Ls, resistance value Rs and quality factor value Q of the resonant circuit measured for each receiver type in a state in which a foreign object and a receiver are simultaneously placed in the charging area.

As denoted by reference numeral 1211, the inductance value of the resonant circuit measured in a state (empty pad) in which nothing is placed on the charging bed of the wireless power transmission apparatus is 25.20 pH and the quality factor value is 133.8.

As denoted by reference numeral 1210, if a foreign object including, for example, FO #4 and a 10-cent coin is placed in a state in which nothing is placed in the charging area, the inductance value decreases. In contrast, if a receiver capable of wirelessly receiving power, for example, a smartphone having a wireless charging module, is placed in a state in which nothing is placed in the charging area, the inductance value increases.

In addition, as denoted by reference numeral 1210, if a foreign object or a receiver is placed in a state in which nothing is placed in the charging area, the quality factor value decreases. In particular, it can be seen that the quality factor values of Receiver 2 and Receiver 4 are less than the quality factor value of FO #4.

As denoted by reference numeral 1220, if standard foreign objects FO #4 and a 10-cent coin are additionally placed in a state in which the receiver is placed in the charging area, the inductance value and the quality factor value decrease as denoted by reference numerals 1221 and 1222. However, the rate at which the inductance value and the quality factor value decrease is changed according to the type of the receiver. For example, as denoted by reference numeral 1213, 1221 and 1222, it can be seen that, in the case of Receiver 1, if a foreign object is additionally placed, change in quality factor value is greater than change in inductance value. Accordingly, in the case of Receiver 1, change in quality factor value may be detected rather than change in inductance value, in order to determine whether a foreign object is present. In contrast, it can be seen that, in the case of Receiver 4, if a foreign object is additionally placed, change in inductance value is greater than change in quality factor value. Accordingly, in the case of Receiver 4, change in inductance value may be detected rather than change in quality factor value, in order to determine whether a foreign object is present.

The type of the receiver placed in the charging area may be identified in the identification and configuration phase. Accordingly, the wireless power transmission apparatus may not identify the type of the receiver before entering the ping phase after the object is detected in the selection phase.

Accordingly, the wireless power transmission apparatus according to embodiment may measure and store the inductance value and quality factor value of the resonant circuit before entering the ping phase, when the object is detected in the selection phase.

Thereafter, the wireless power transmission apparatus may determine the inductance threshold value and the quality factor threshold value for detecting the foreign object based on the FOD status packet received in the negotiation phase. The wireless power transmission apparatus may compare the determined threshold value with the pre-stored inductance value and quality factor value to determine whether a foreign object is present.

For example, the wireless power transmission apparatus may finally determine that the foreign object is placed in the charging area, upon determining that a foreign object is present by comparing the stored inductance value with the determined inductance threshold value or upon determining that a foreign object is present by comparing the stored quality factor value with the determined quality factor threshold value.

Although the wireless power transmission apparatus determines the threshold value for detecting the foreign object based on the FOD status packet in the above-described embodiment, this is merely an example and the threshold range may be determined. In this case, the wireless power transmission apparatus may determine that the foreign object is present, if at least one of the stored inductance value and the quality factor value is out of the determined threshold range.

The foreign object detection method of the wireless power transmission apparatus according to another embodiment may further include receiving a received power strength packet for power calibration from the wireless power receiver. At this time, the received power strength packet may include received power of the wireless power receiver corresponding to a light load or received power of the wireless power receiver corresponding to a load connection state.

Figure 13A:
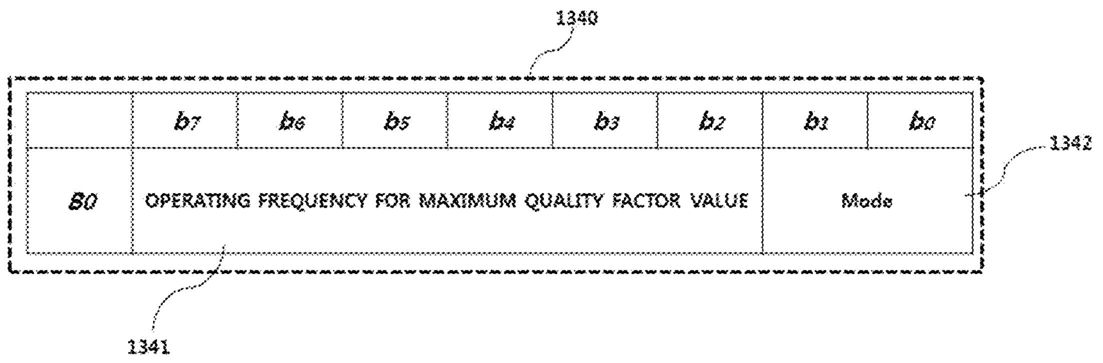
FIG. 13A is a view illustrating the structure of an FOD status packet message according to another embodiment.

FIG. 13A is a view illustrating the structure of an FOD status packet message according to another embodiment.

Referring to FIG. 13A, the FOD status packet message 1340 may have a length of 1 byte, and include an Operating Frequency for Maximum Quality Factor Value field 1340 having a length of 6 bits and a mode field 1342 having a length of 2 bits.

The wireless power transmitter according to the embodiment may determine that a foreign object is present in the charging area, if an operating frequency of a higher band, at which a quality factor value higher than a quality factor value measured at an operating frequency having a maximum quality factor value is measured, is present. Here, the operating frequency of the higher band means a certain frequency greater than the operating frequency having a maximum quality factor value in the operating frequency band.

The wireless power transmitter according to another embodiment may determine that a foreign object is present in the charging area, if a quality factor peak operating frequency (an operating frequency at which a maximum quality factor value of the quality factor values measured before the ping phase is measured) of a higher band than an operating frequency having the maximum quality factor value is present.

For example, an operating frequency 1341 for the maximum quality factor value may be an operating frequency for a maximum quality factor value corresponding to the type of the wireless power transmitter confirmed in the identification and configuration phase 230 of FIG. 2. For example, information on the operating frequency for the maximum quality factor value according to the type of the connectable wireless power transmitter may be maintained in a predetermined recording region of the wireless power receiver. The operating frequency for the maximum quality factor value may vary according to the power class, design shape, manufacturer, and standard of the wireless power transmitter.

Accordingly, upon determining at which operating frequency or in which operating frequency range the maximum quality factor value is measured in the wireless power receiver, the wireless power transmitter may minimize the frequency range in which the quality factor value is measured in order to determine whether the foreign object is present. That is, the wireless power transmitter may not measure the quality factor value in a frequency band lower than the operating frequency for the maximum quality factor value.

In another example, although the operating frequency 1342 for the maximum quality factor value is of a specific coil type, e.g., MP-A1 type, defined in the WPC standard, the embodiment is not limited thereto and an operating frequency for a maximum quality factor value corresponding to the wireless power transmitter in which the transmission coil is mounted may be used. Based on the MP-A1 type, the received maximum quality factor value may be scaled in consideration of a design difference and product characteristics of different types of wireless power transmitters and may be used to determine whether a foreign object is present.

The wireless power transmitter according to the embodiment may measure and store a quality factor value a1 in a specific upper-limit frequency in an operating frequency band in the ping phase 220 (or before the ping phase) of FIG. 2. Alternatively, a maximum quality factor of the quality factors measured in a predetermined frequency range (in the operating frequency band) and a frequency, at which the maximum quality factor is measured, may be stored. Thereafter, the wireless power transmitter may measure a quality factor value a2 at the operating frequency 1341 for the maximum quality factor value received through the FOD status packet 1340 in the negotiation phase 240, and determine that a foreign object is present in the charging area if a1 is greater than a2. Alternatively, the wireless power transmitter may compare the operating frequency for the maximum quality factor value received through the FOD status packet 1340 in the negotiation phase 240 with the frequency, at which the maximum quality factor measured in the ping phase 220 (or before the ping phase) is measured, thereby determining whether a foreign object is present.

If the frequency, at which the maximum quality factor measured in the ping phase 220 is measured, is greater than the received maximum quality factor operating frequency, it may be determined that a foreign object is present. This principle will be described below in detail.

Although the wireless power transmitter may measure only the quality factor value at the upper-limit frequency in the operating frequency band in the ping phase 220 (or before the ping phase) in the present embodiment, this is merely an example and both the quality factor values at the lower-limit frequency and the upper-limit frequency may be measured. In another embodiment, the quality factor value of each frequency may be measured through sweeping from the lower-limit frequency to the upper-limit frequency.

In another embodiment, the quality factor value of each frequency may be measured through sweeping in a specific frequency region.

The wireless power transmitter is defined to measure the quality factor value at the lower-limit frequency in the operating frequency band in the ping phase 220. Although the wireless power transmitter may measure only the quality factor value at the upper-limit frequency in the operating frequency band in the ping phase 220 in the present embodiment, this is merely an example and both the quality factor values at the lower-limit frequency and the upper-limit frequency may be measured.

A frequency offset value from lower-limit frequency, that is, a lowest frequency, in the operating frequency may be recorded in the operating frequency for the maximum quality factor value field 1341 according to an embodiment. At this time, an offset unit may mean, but is not limited to, 10 kHz and may be less or greater than 10 kHz. For example, if the operating frequency band of the wireless power transmitter is between the lower-limit frequency of 100 kHz and the upper-limit frequency of 300 kHz, the offset unit is 10 kHz, and the value recorded in the operating frequency for the maximum quality factor value field 1341 is a binary value of 000011, the actual frequency for the maximum quality factor value may be 130 kHz (100 kHz+3*10 kHz).

In another embodiment, the wireless power transmitter may sweep the entire operating frequency band or a specific frequency band of the entire operating frequency band to measure the quality factor value, before the ping phase.

In another embodiment, instead of the field 1341 into which the operating frequency for the maximum quality factor value of FIG. 13A is inserted, an operating frequency value, at which the quality factor value is lower than the reference quality factor value by a predetermined value (or ratio), may be inserted into the field 1341.

The wireless power transmitter may compare the quality factor value B1 measured at the reference operating frequency (for example, the operating frequency for measuring the quality factor value is 100 kHz) in the ping phase 220 (or before the ping phase) with the quality factor value B2 measured at the operating frequency greater than the received operating frequency, thereby determining whether a foreign object is present.

At this time, if B1 is greater than B2, it may be determined that a foreign object is present.

Figure 13B:
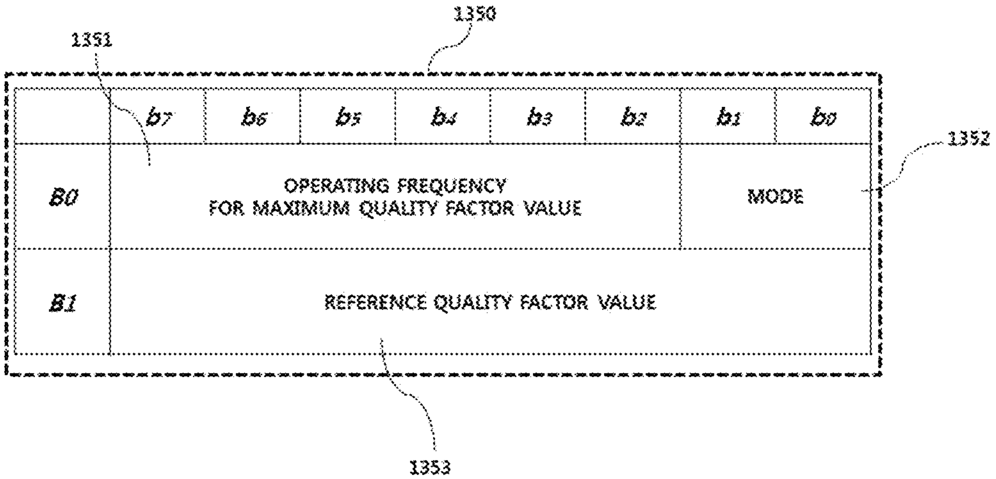
FIG. 13B is a view illustrating the structure of an FOD status packet message according to another embodiment.

FIG. 13B is a view illustrating the structure of an FOD status packet message according to another embodiment.

Referring to FIG. 13B, the FOD status packet message 1350 may have a length of 2 bytes, and include an Operating Frequency for Maximum Quality Factor Value field 1351 having a length of 6 bits, a mode field 1352 having a length of 2 bits, and a Reference Quality Factor Value field 1353 having a length of 1 byte.

Although the wireless power transmitter may check whether the operating frequency for the maximum quality factor value 1351 is included in the FOD status packet received through the value of the mode 1352, the embodiment is not limited thereto and the operating frequency for the maximum quality factor value 1351 may always be included in the FOD status packet, regardless of the value of the mode 1352.

When the FOD status packet of FIG. 7A is received, the wireless power transmitter may compare the reference quality factor value with the quality factor value measured in the ping phase 220 (or before the ping phase) to determine whether a foreign object is present (Method 1) or compare the operating frequency for the maximum quality factor value with the maximum operating frequency corresponding to the maximum quality factor value measured in the ping phase 220 (or before the ping phase) to determine whether a foreign object is present (Method 2, the embodiments of FIG. 13A).

Alternatively, it may be determined whether a foreign object is present using multiple methods.

In an embodiment, the wireless power transmitter may determine whether a foreign object is present using Method 1. At this time, two threshold values (Threshold value 1:Q_Threshold 1 and Threshold value 2: Q_Threshold 2) may be determined based on the received reference quality factor value.

If the quality factor value measured before the ping phase 220 is less than Threshold value 2, the wireless power transmitter may determine that a foreign object is present.

If the quality factor value measured before the ping phase 220 is less than Threshold value 1 and is greater than or equal to Threshold value 2, the wireless power transmitter may determine that a foreign object is present through Method 2.

Figure 13C:
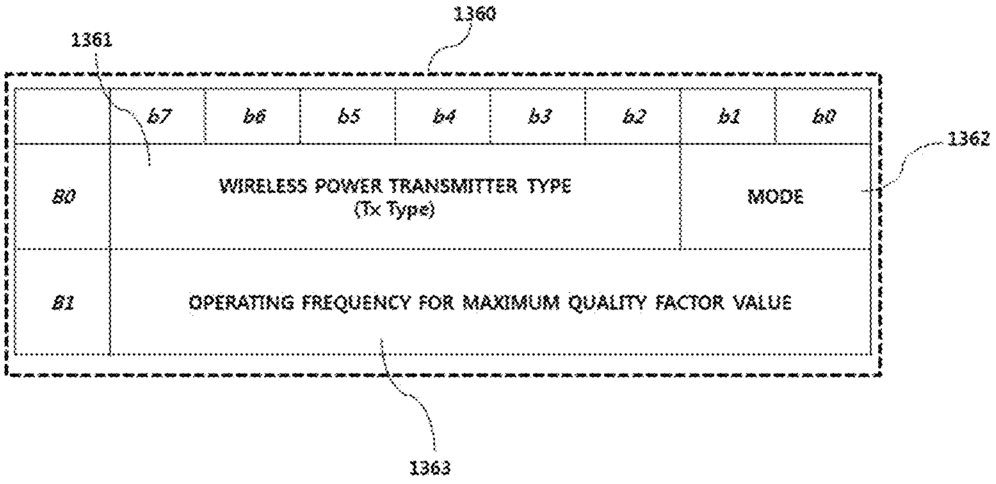
FIG. 13C is a view illustrating the structure of an FOD status packet message according to another embodiment.

FIG. 13C is a view illustrating the structure of an FOD status packet message according to another embodiment.

Referring to FIG. 13C, the FOD status packet message 1360 may have a length of 2 bytes, and include a wireless power transmitter (Tx) type field 1361 having a length of 6 bits, a mode field 1362 having a length of 2 bits, and an Operating Frequency for Maximum Quality Factor Value field 1363 having a length of 1 byte.

Although the wireless power transmitter may check whether the wireless power transmitter type 1361 and the operating frequency for the maximum quality factor value 1363 are included in the FOD status packet received through the value of the mode 1362, the embodiment is not limited thereto and the wireless power transmitter type 1361 and the operating frequency for the maximum quality factor value 1363 may always be included in the FOD status packet, regardless of the value of the mode 1362.

For example, the wireless power transmitter type 1361 may be a value (a predetermined classification number) indicating a predetermined transmitter (Tx) design number for uniquely identifying the wireless power transmitter registered upon WPC (Qi) authentication.

In another example, the wireless power transmitter type 1361 may be a predetermined classification number for classifying wireless power transmitters having common design features and performance features.

The wireless power transmitter according to the embodiment may determine that a foreign object is present in the charging area, if an operating frequency of a higher band, at which a quality factor value higher than a quality factor value measured at an operating frequency having a maximum quality factor value is present, is present. Here, the operating frequency of the higher band means a certain frequency greater than the operating frequency having a maximum quality factor value in the operating frequency band.

The wireless power transmitter according to another embodiment may determine that a foreign object is present in the charging area, if a quality factor peak operating frequency (an operating frequency at which a maximum quality factor value of the quality factor values measured before the ping phase is measured) of a higher band than an operating frequency having the maximum quality factor value is present.

Hereinafter, for convenience of description, the reference quality factor value measured when a foreign object is not present is RQF_NO_FO and the quality factor value measured when a specific foreign object is present is QF_FO. For example, although a specific foreign object is Foreign Object #4 (which may be used interchangeably with FO4, for convenience of description), which is an aluminum disk having a diameter of 22 mm and a thickness of 1 mm, the embodiment is not limited thereto and any coin may be used.

The wireless power transmitter measures a current quality factor value before the ping phase, that is, in the selection phase. The wireless power transmitter determines a quality factor threshold value for determining whether a foreign object is present, in consideration of the reference quality factor value received from the wireless power receiver in the negotiation phase, a production and measurement tolerance for considering the design difference of each transmitter, and accuracy of the reference quality factor.

The reference quality factor value means the smallest value of the quality factor values measured in five areas (center and four positions to the left, right, up and down from the center by 5 mm) of the charging areas of the test power transmitter (TPT), for example, an MP1 (MP-A1) type transmitter. The quality factor value actually measured in the charging area may differ between the transmitters according to the design difference between MP1 which is the test power transmitter (TPT) and the commercial wireless power transmitter including the inductance value of the transmission coil. A tolerance for calibrating this is referred to as a production and measurement tolerance.

For example, a drop value 1321 of the reference quality factor may be determined by subtracting a quality factor value measured when a specific foreign object is present from the reference quality factor value corresponding to the wireless power receiver.

In another example, the drop value 1321 of the reference quality factor may be a ratio of the quality factor value measured w % ben a foreign object is present to a reference quality factor value measured when a foreign object is not present. In this case, the drop value 1321 of the reference quality factor may be an integer value calculated as a percentage (%) or calculated by dividing the percentage by a specific unit STEP_VALUE, without being limited thereto. For example, the drop value 1321 of the reference quality factor may be calculated by Equation 1 below.

[(RQF_NO_FO−QF_FO)/RQF_NO_FO]*100 or

[((RQF_NO_FO−QF_FO)/RQF_NO_FO)*100]/STEP_VALUE     Equation 1

(here, *100 may be used to represent the value in % and may not be applied to an actual value.)

The wireless power receiver may have a reference quality factor drop value which varies according to at least one of the manufacturer and the product type.

Accordingly, the wireless power transmitter according to an embodiment may acquire the drop value of the reference quality factor from the detected wireless power receiver and adaptively determine a quality factor threshold for determining whether a foreign object is present in consideration of the drop value of the reference quality factor.

Therefore, according to the embodiment, it is possible to minimize a problem in which heat is generated or power transfer efficiency is significantly reduced due to non-detection of a foreign object located in a charging area.

FIG. 13D is a view illustrating the structure of an FOD status packet message according to an embodiment.

Referring to FIG. 13D, the FOD status packet message 1300 may have a length of 2 bytes and include a reserved field 1301 having a length of 6 bits, a mode field 1302 having a length of 2 bits and a reference quality factor value field 1303 having a length of 1 byte.

All bits configuring the reserved field 1301 may be set to 0.

As denoted by reference numeral 1304, if the mode field 1302 is set to a binary value of “00”, this may mean that a reference quality factor RQF_NO_FO (first reference quality factor) value measured and determined in a state in which the FO is not present is recorded in the reference quality factor value field 1303, and, if the mode field 1302 is set to a binary value of “01”, this may mean that a reference quality factor RQF_FO (second reference quality factor) value measured and determined in a state in which the FO is present is recorded in the reference quality factor value field 1303.

FIG. 13E is a view illustrating the structure of an FO status packet message according to one embodiment.

Referring to FIG. 13E, the FO status packet message 1310 may have a length of 3 bytes and include a reserved field 1311 having a length of 6 bits, a mode field 1312 having a length of 2 bits, a reference quality factor value 1313, and a reference quality factor value with foreign object 1314.

All bits configuring the reserved field 1301 may be set to 0.

The operation mode of the power receiver, to which the reference quality factor value 1313 is applied, may be identified through the mode field 1312. As denoted by reference numeral 1315, if the value of the mode 1312 is a binary value of “00”, this indicates the reference quality factor value measured when the wireless power receiver is powered off.

The wireless power receiver may have the reference quality factor value measured when a foreign object is not present and the reference quality factor value measured when a foreign object is present, which vary according to at least one of the manufacture and the product type.

The wireless power transmitter according to an embodiment may adaptively determine a quality factor threshold for determining whether a foreign object is present, in consideration of the reference quality factor value measured when a foreign object is not present and the reference quality factor value measured when a foreign object is present. This is because change in quality factor value based on whether a foreign object is present or not may differ between receivers. Therefore, according to the embodiment, it is possible to minimize a problem in which heat is generated or power transfer efficiency is significantly reduced due to non-detection of a foreign object located in a charging area.

FIG. 13F is a view illustrating the structure of an FO status packet message according to another embodiment.

Referring to FIG. 13F, the FO status packet message 1120 may have a length of 2 bytes, and include a Drop Value of Reference Quality Factor field 1321 having a length of 6 bits, a mode field 1322 having a length of 2 bits, and a Reference Quality Factor Value field 1323.

Here, the drop value 1321 of the reference quality factor may be determined based on the reference quality factor value 1223 measured when a foreign object is not present and the quality factor value measured when a specific foreign object is present (Quality Factor Value With Foreign Object).

The mode field 1322 may be used to indicate that the drop value of the reference quality factor 1321 is recorded in the reserved field 1301 of FIG. 13D. For example, as denoted by reference numeral 1324, if the value of the mode field 1322 is a binary value of “01”, this may mean the drop value of the reference quality factor 1321 is recorded. However, this is merely an example and another value, e.g., a binary value of “10” or a binary value of “11” of the mode field 1322 may be used to indicate that the drop value of the reference quality factor 1321 is recorded.

However, if the value of the mode field 1322 is set to a value other than a binary value of “00”, the reference quality factor value 1323 may automatically mean a value measured in a state in which the power receiver is powered off.

Although the format of the foreign object status packet is described as being identified by the mode, for convenience of description, in a specific embodiment, the foreign object status packet shown in FIGS. 13D to 13G may be used regardless of the mode.

Figure 13G:
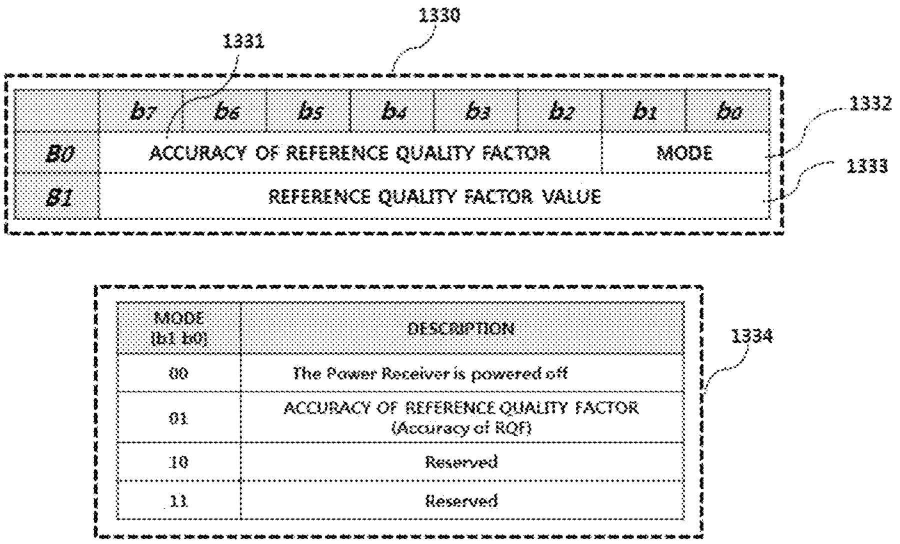

FIG. 13G is a view illustrating the structure of an FO status packet message according to another embodiment.

Referring to FIG. 13G, the FO status packet message 1330 may have a length of 2 bytes, and include an Accuracy of Reference Quality Factor field 1331 having a length of 6 bits, a mode field 1332 having a length of 2 bits, and a Reference Quality Factor Value field 1333.

Here, the accuracy of the reference quality factor 1331 may be a tolerance of the reference quality factor value 1333 measured when a foreign object is not present. For example, the reference quality factor value, to which tolerance is applied, may be set to a rate increased or decreased from the reference quality factor value 1333 received from the wireless power reception apparatus, without being limited thereto.

The accuracy of the reference quality factor 1331 may vary according to at least one of the manufacturer of the wireless power receiver and the product type. For example, the wireless power receiver of Company A and the wireless power receiver of Company B may be different from each other in accuracy of the reference quality factor value measured by interworking with the same wireless power transmitter. Accordingly, the wireless power transmitter needs to acquire information on accuracy of the reference quality factor of each wireless power receiver, and a quality factor threshold value for determining whether a foreign object is present may be determined in consideration of the accuracy of the reference quality factor. In addition, in the wireless power transmitter, hereinafter, for convenience of description, a quality factor threshold for determining whether a foreign object is present is referred to as FO_QF_THRESHOLD.

For example, as the result of testing the same wireless power transmitter, the measured reference quality factor value of the wireless power receiver of Company A may be 100 and the measured reference quality factor value of the wireless power receiver of Company B may be 70. In this case, the accuracy, e.g., +/−7% of the reference quality factor corresponding to the wireless power receiver Company B may be set to be greater than the accuracy, e.g., +/−10% of the reference quality factor corresponding to the wireless power receiver Company A. That is, the wireless power receiver of Company B may be set to have higher error sensitivity than the wireless power receiver of Company A.

Accuracy of the quality factor may vary according to the configuration of the finished product in which the receiver is mounted. According to a PCB, a camera module, an antenna and other parts mounted in the finished product, the quality factor measured when a foreign object is not present may be less than the quality factors of the other finished products.

If the finished product is located in the charging area together with a foreign object, change in quality factor value may be less than those of the other finished products, thereby requiring higher measurement accuracy.

The mode field 1322 may be used to indicate that the accuracy of the reference quality factor 1331 is recorded in the reserved field 1301 of FIG. 13D. For example, as denoted by reference numeral 1334, if the value of the mode field 1332 is a binary value of "01", this may mean that the accuracy of the reference quality factor 1331 is recorded. However, this is merely an example and another value, e.g., a binary value of "10" or a binary value of "11" of the mode field 1322 may be used to indicate that the accuracy of the reference quality factor 1331 is recorded.

However, if the value of the mode field 1332 is set to a value other than a binary value of "00", the reference quality factor value 1333 may automatically mean a value measured in a state in which the power receiver is powered off.

Figure 14:
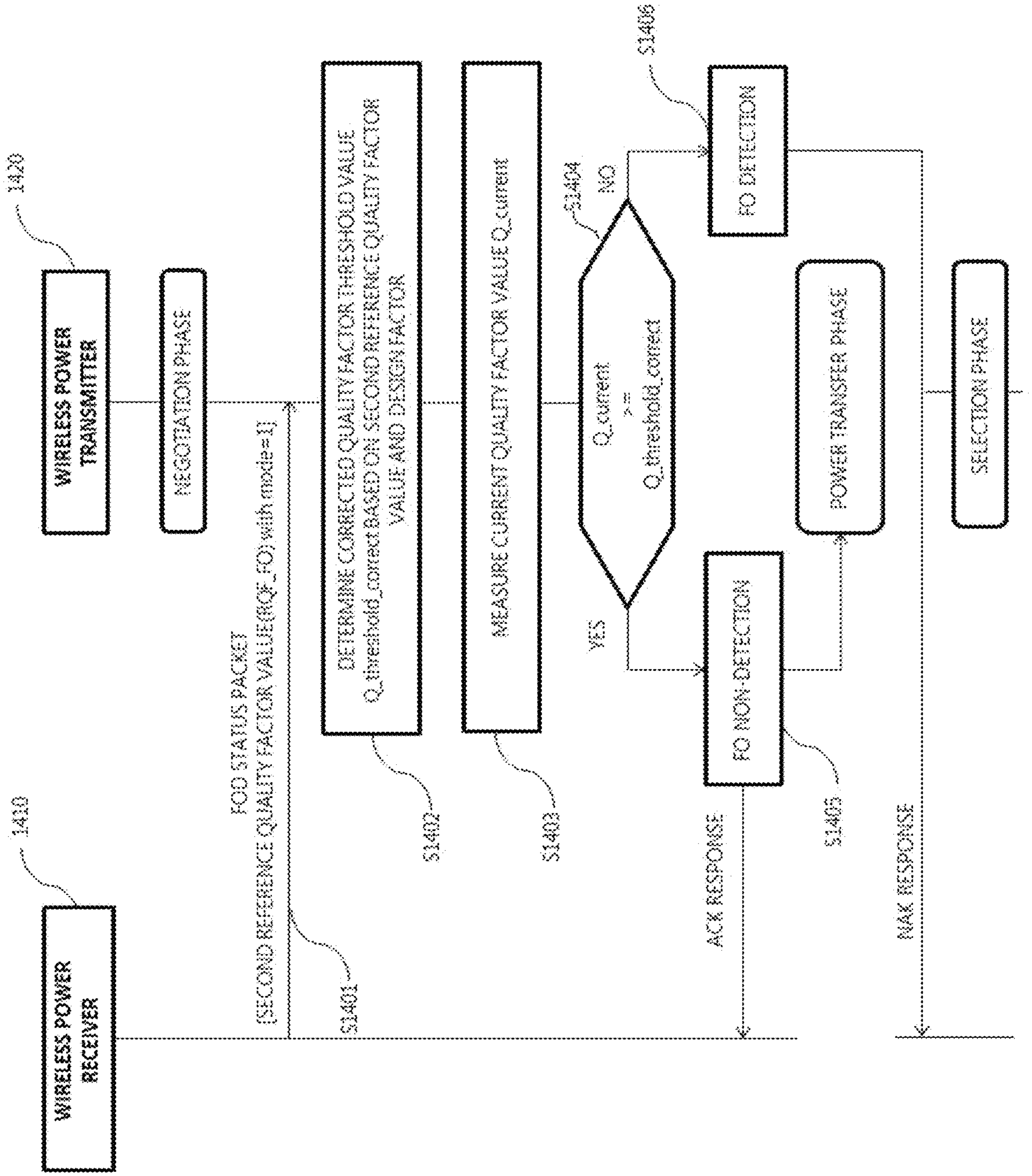
FIG. 14 is a flowchart illustrating an FOD method according to another embodiment.

FIG. 14 is a flowchart illustrating an FOD method according to another embodiment.

Referring to FIG. 14, in the negotiation phase, the wireless power receiver 1410 may transmit an FOD status packet including a second reference quality factor value (Second Reference Quality Factor Value. RQF_FO) to the wireless power transmitter 1420 (S1401). At this time, the value of the mode value of the FOD status packet may be set to "01".

The second reference quality factor value may be determined to be the smallest value of the quality factor values measured at a plurality of points in the charging area of a specific wireless power transmitter and may be maintained in the wireless power receiver.

For example, the second reference quality factor value RQF_FO may be determined to be the smallest value of a first quality factor value measured at the center where the transmission coil (primary coil) and the reception coil (secondary coil) are well aligned in a state in which the FO is present near the wireless power receiver placed in the charging area and second quality factor values measured while moving with a constant distance offset, for example, +/−5 mm on the x-axis and the y-axis, without being limited thereto, from the center without rotation of the wireless power receiver in a state in which the FO is present near the wireless power receiver. The second quality factor values may include a quality factor value measured at at least four different positions.

The wireless power transmitter 1420 may determine a threshold value for FO detection based on a design factor pre-stored in correspondence with the wireless power transmitter 1420 and the received second reference quality factor value (S1403). Hereinafter, for convenience of description, the second reference quality factor value corrected based on the design factor is referred to as a corrected quality factor threshold value Q_threshold_correct.

Since the second reference quality factor value is determined based on the quality factor value measured at a specific wireless power transmitter (hereinafter referred to as a wireless power transmitter for test), a wireless power transmitter commercially manufactured by a specific manufacturer (hereinafter referred to as a commercial wireless power transmitter, for convenience of description) may be different from the wireless power transmitter for test in terms of configuration and features. Accordingly, the commercial wireless power transmitter and the wireless power transmitter for test may be different from each other in terms of the quality factor value measured under the same conditions. Accordingly, the second reference quality factor value used as the threshold value for FO detection in the embodiment of FIG. 20 needs to be corrected in consideration of the configuration and features, that is, the design factor, of the commercial wireless power transmitter.

For example, the design factor may be a correction constant determined based on at least one of power class corresponding to the commercial wireless power transmitter, the characteristics and arrangement of a transmission coil, a power control algorithm installed in a transmitter, power transfer loss, and the shape and structure of the wireless power transmitter. However, the embodiment is not limited thereto and a value capable of correcting the measurement error of the quality factor value relative to the wireless power transmitter for test may be used.

The wireless power transmitter 1420 may measure a current quality factor value Q_current and compare the current quality factor value Q_current with a corrected quality factor threshold value Q_threshold_correct (S1403 to S404).

For reference, the current quality factor value may be measured before the digital ping phase, immediately before the negotiation (renegotiation) phase or periodically.

If the current quality factor value Q_current is greater than or equal to the corrected quality factor threshold value Q_threshold_correct as the result of comparison, the wireless power transmitter 1420 may determine that FO is not detected and transmit an ACK response to the wireless power receiver 1410 (S1405). At this time, the status of the wireless power transmitter 1420 may transition from the negotiation step to the power transfer phase.

If the current quality factor value Q_current is less than the corrected quality factor threshold value Q_threshold_correct as the result of comparison of step 1401, the wireless power transmitter 1420 may determine that FO is detected and transmit a NAK response to the wireless power receiver 1410 (S1406). At this time, the status of the wireless power transmitter 1420 may transition from the negotiation phase to the selection phase.

Figure 15:
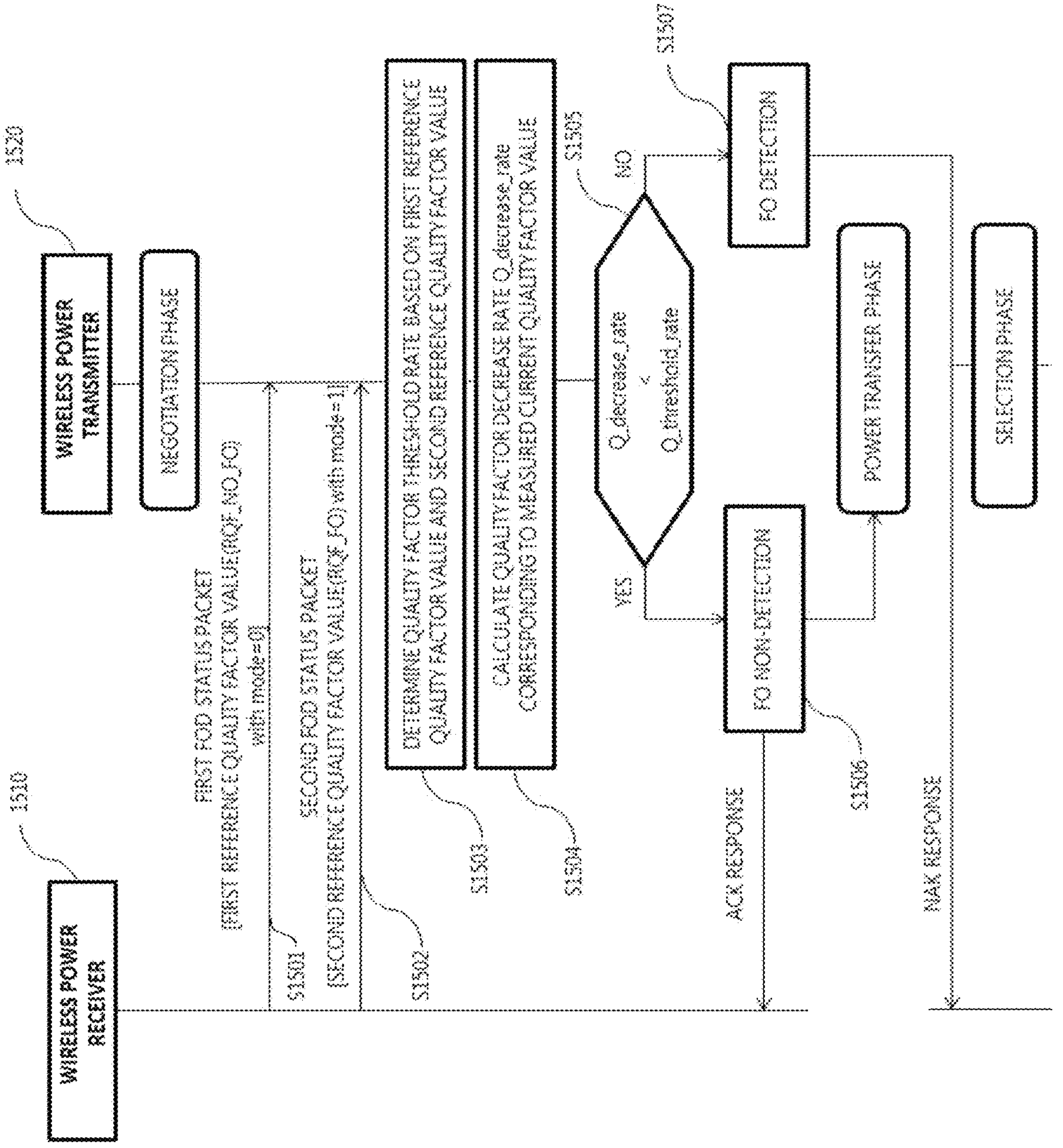
FIG. 15 is a flowchart illustrating an FOD method according to another embodiment.

FIG. 15 is a flowchart illustrating an FOD method according to another embodiment.

Referring to FIG. 15, in the negotiation phase, the wireless power receiver 1510 may transmit first to second FOD status packets including a Reference Quality Factor Value Q_reference to the wireless power transmitter 1520 (S1501 to S1502).

Here, the first FOD status packet may include a first reference quality factor value RQF_NO_FO when the mode has a binary value of "00". The second FOD status packet may include a second reference quality factor value RQF_FO when the mode is 1, that is, a reference quality factor value determined based on the quality factor value measured in a state in which an FO is present in the charging area.

Here, the first reference quality factor value RQF_NO_FO is greater than the second reference quality factor value RQF_FO.

The first and second reference quality factor values may be respectively determined based on the quality factor values measured in a state in which an FO is not present near the receiver and in a state in which an FO is present near the receiver. For example, the first and second reference quality factor values may be the smallest values of the quality factor values measured at a plurality of points in the charging area of a specific wireless power transmitter for test.

The wireless power transmitter 1520 may determine a Quality Factor Threshold Rate Q_threshold_rate for FO detection based on the received first to second reference quality factor values (S1503).

Here, the quality factor threshold rate Q_threshold_rate may be calculated by dividing a difference between the first reference quality factor value RQF_NO_FO and the second reference quality factor value RQF_FO by the first reference quality factor value RQF_NO_FO. For example, if the first reference quality factor value RQF_NO_FO is 80 and the second reference quality factor value RQF_FO is 50, the quality factor threshold rate Q_threshold_rate may be (80−50)/80=0.375.

The wireless power transmitter may 1520 may measure the current quality factor value Q_current and calculate a quality factor decrease rate Q_decrease_rate based on the measured current quality factor value and the first reference quality factor value RQF_NO_FO (S1404).

For reference, the current quality factor value may be measured before the digital ping phase, immediately before the negotiation (renegotiation) phase or periodically.

The wireless power transmitter 1520 may determine whether the quality factor decrease rate Q_decrease_rate is less than the quality factor threshold rate Q_threshold_rate through comparison (S1505).

Upon determining that the quality factor decrease rate Q_decrease_rate is less than the quality factor threshold rate Q_threshold_rate as the result of comparison, the wireless power transmitter 1520 may determine that an FO is not detected and transmit an ACK response to the wireless power receiver 1510 (S1506). At this time, the status of the wireless power transmitter 1520 may transition from the negotiation phase to the power transfer phase.

Upon determining that the quality factor decrease rate Q_decrease_rate is greater than or equal to the quality factor threshold rate Q_threshold_rate as the result of comparison in step 1505, the wireless power transmitter 1520 may determine that an FO is detected and transmit a NAK response to the wireless power receiver 1510 (S1507). At this time, the status of the wireless power transmitter 1520 may transition from the negotiation phase to the selection phase.

Although FO detection is performed by comparing the quality factor decrease rate Q_decrease_rate with the quality factor threshold rate Q_threshold_rate in the embodiment of FIG. 15, this is merely an example and the wireless power transmitter according to another embodiment may calculate a corrected quality factor threshold rate Q_threshold_rate_correct based on the design factor corresponding to the wireless power transmitter, and determine whether an FO is present in the charging area by comparing the quality factor decrease rate Q_decrease_rate with the corrected quality factor threshold rate Q_threshold_rate_correct.

In another embodiment, the quality factor threshold value may be determined as follows.

The quality factor threshold value may be determined in consideration of the quality factor measurement error range (±10% (0.1*the reference quality factor value) of the received reference quality factor value or the accuracy of quality factor value (FIG. 19)) and the transmitter characteristics (transmitter type (design), manufacturer, product or measurement error, etc.).

Figure 16:
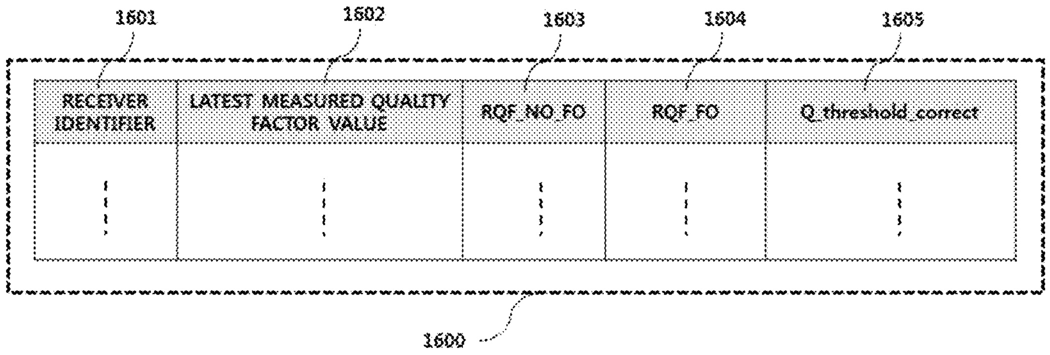
FIG. 16 is a quality factor table according to an embodiment.

FIG. 16 is a quality factor table according to an embodiment.

The quality factor table 1600 shown in FIG. 16 may be maintained in the memory of the wireless power transmitter. The wireless power transmitter may update the quality factor table 1600 based on the received FO status packet. For example, the quality factor table 1600 may include at least one of a receiver identifier field 1601, a Latest Measured Quality Factor Value field 1602, a first reference quality factor value field RQF NO FO 1603, a second reference quality factor value field RQF_FO 1604, and a corrected quality factor threshold value field Q_threshold_correct 1605.

Here, the receiver identifier 1601 may be configured by any one or a combination of a manufacturer code, a basic device identifier and an extended device identifier acquired in the identification and configuration phase. For example, the receiver identifier may be configured by concatenating the manufacturer code and the basic device identifier. In another example, the receiver identifier may be configuring by concatenating the manufacturer code, the basic device identifier and the extended device identifier.

In the Latest Measured Quality Factor Value field 1602, a latest measured quality factor value may be recorded in correspondence with the receiver identifier 1601. At this time, if charging of the wireless power receiver corresponding to the receiver identifier 1601 is normally terminated or transitioning from the negotiation phase to the power transfer phase is normally performed, the wireless power transmitter may record the quality factor value measured in the negotiation phase in the quality factor table 1600.

In addition, if the FOD status packet is received in the negotiation phase, the wireless power transmitter may record at least one of the second reference quality factor value RQF_FO and the first reference quality factor value RQF NO FO included in the FOD status packet in the quality factor table 1600.

In addition, the wireless power transmitter may record the corrected quality factor threshold value Q_threshold_correct calculated for FO detection in the first negotiation phase with the wireless power receiver in the quality factor table 1600.

If the wireless power receiver corresponding to the receiver identifier recorded in the quality factor table 1600 is subsequently detected, the wireless power transmitter may detect an FO by referring to the quality factor table 1600.

The quality factor table 1600 according to another embodiment may further include at least one of the drop value of the reference quality factor 1321 described in FIG. 13F and the accuracy of the reference quality factor 1331 described in FIG. 13D.

Figure 17:
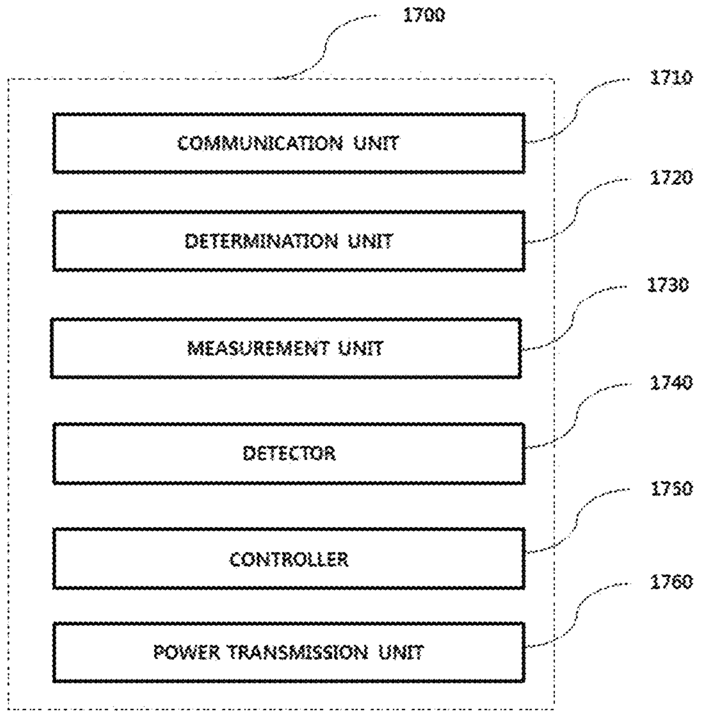
FIG. 17 is a block diagram illustrating the configuration of an FO detection apparatus according to an embodiment.

FIG. 17 is a block diagram illustrating the configuration of an FO detection apparatus according to an embodiment.

The FO detection apparatus 1700 according to an embodiment may be installed or mounted in the wireless power transmitter.

Referring to FIG. 17, the FO detection apparatus 1700 may include a communication unit 1710, a determination unit 1720, a measurement unit 1730, a detector 1740, a controller 1750 and a power transmission unit 1760.

The communication unit 1710 may receive the FOD status packet including the reference quality factor value from the wireless power receiver connected in the negotiation phase. Here, the reference quality factor value may include at least one of the reference quality factor value RQF_NO_FO (the first reference quality factor value) when an FO is not present in the charging area and the reference quality factor value RQF_FO (the second reference quality factor value) when an FO is present in the charging area, and may be received through one FOD status packet or a plurality of FOD status packets in the negotiation phase.

The determination unit 1720 may determine a threshold value to be used upon FO detection based on the received reference quality factor value. For example, the second reference quality factor value RQF_FO may be determined as the threshold value used upon FO detection, this is merely an example and the second reference quality factor value corrected based on the design factor corresponding to the wireless power transmitter may be determined as the threshold value used upon FO detection.

As the threshold value used upon FO detection according to another embodiment, the quality factor threshold rate Q_threshold_rate calculated based on the first and second reference quality factor values may be determined.

In a first embodiment, the quality factor threshold rate Q_threshold_rate may be calculated by dividing a difference between the first reference quality factor value RQF_NO_FO and the second reference quality factor value RQF_FO by the first reference quality factor value RQF_NO_FO. For example, if the first reference quality factor value RQF_NO_FO is 80 and the second reference quality factor value RQF_FO is 50, the quality factor threshold rate Q_threshold_rate may be (80-50)/80=0.375.

In a second embodiment, the quality factor threshold rate Q_threshold_rate may be a value obtained by dividing the second reference quality factor value RQF_FO by the first reference quality factor value RQF_NO_FO. For example, if the first reference quality factor value RQF_NO_FO is 80 and the second reference quality factor value RQF_FO is 50, the quality factor threshold rate Q_threshold_rate may be 50/80=0.625.

As the threshold value used upon FO detection according to another embodiment, a corrected quality factor threshold rate Q_threshold_rate_correct calculated based on a first corrected reference quality factor and a second corrected reference quality factor calculated by applying a design factor predetermined according to the wireless power transmitter to the first and second reference quality factor values may be determined.

The measurement unit 1730 may measure or calculate a current quality factor value to be compared with the threshold value upon FO detection.

For example, the measurement unit 1730 may measure the current quality factor value Q_current in the negotiation phase.

In addition, the measurement unit 1730 may calculate the quality factor decrease rate Q_decrease_rate based on the measured current quality factor value Q_current and the first reference quality factor value RQF_NO_FO. Here, the quality factor decrease rate Q_decrease_rate may be calculated by [RQF_NO_FO−Q_current]/[RQF_NO_FO].

In addition, the measurement unit 1730 may calculate the current quality factor rate Q_current_rate based on the measured current quality factor value Q_current and the first reference quality factor value RQF_NO_FO. Here, the current quality factor rate Q_current_rate may be calculated by [Q_current]/[RQF_NO_FO].

The detector 1740 may compare the threshold value determined by the determination unit 1720 with the value measured or calculated by the measurement unit 1730 to detect whether an FO is present in the charging area.

Figure 20:
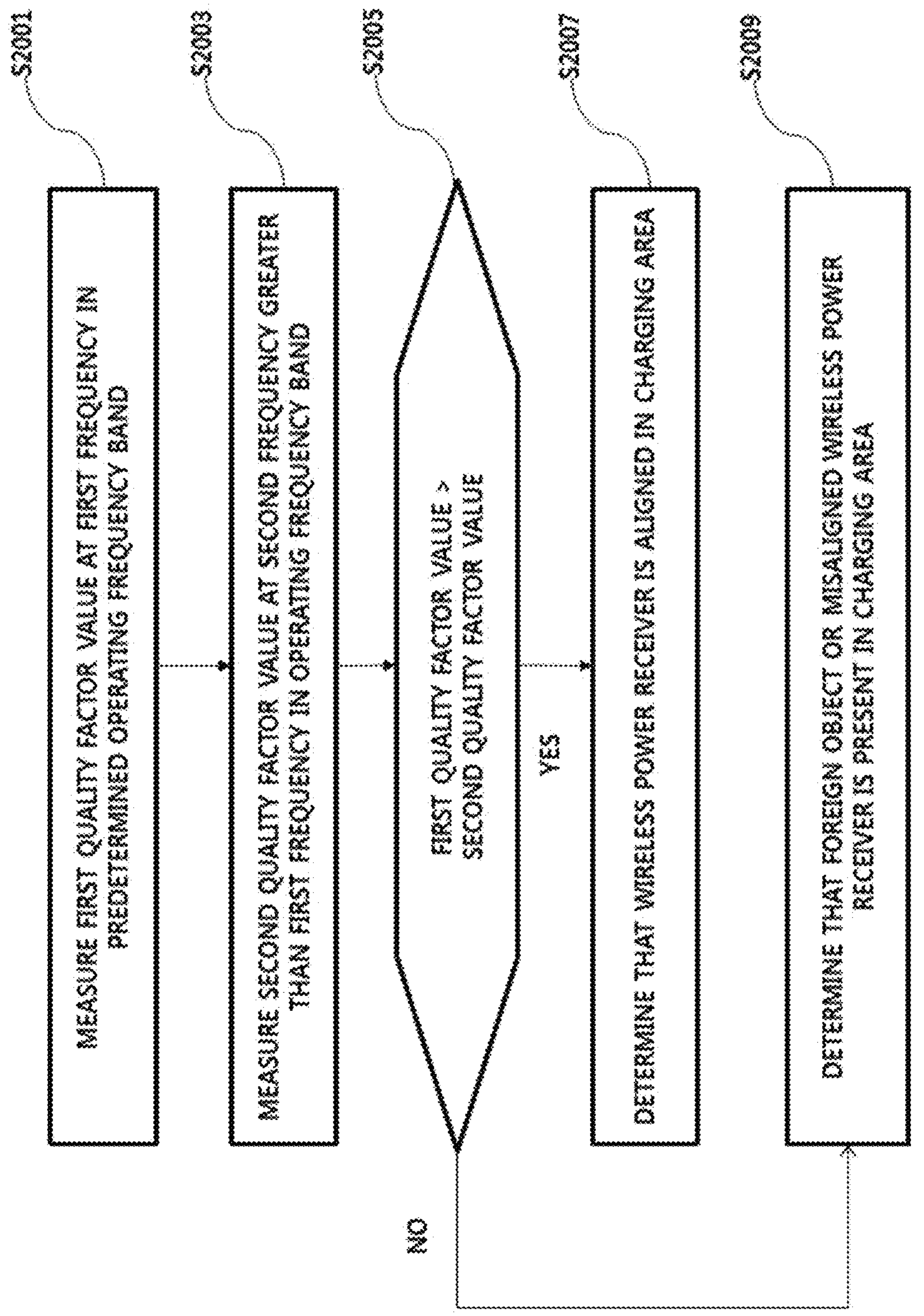
FIG. 20 is a flowchart illustrating an FOD method based on a quality factor value according to another embodiment.

For example, the detector 1740 may determine that an FO is present in the charging area if the current quality factor value Q_current is less than the second reference quality factor value RQF_FO, as shown in FIG. 20.

In another example, the detector 1740 may determine that an FO is present in the charging area if the current quality factor value Q_current is less than the corrected quality factor threshold value Q_threshold_correct, as shown in FIG. 14.

In another example, the detector 1740 may determine whether an FO is present in the charging area, by comparing the quality factor decrease rate Q_decrease_rate with the quality factor threshold rate Q_threshold_rate, as shown FIG. 15.

In another example, the detector 1740 may determine whether an FO is present in the charging area, by comparing the quality factor decrease rate Q_decrease_rate with the corrected quality factor threshold rate calculated based on the design factor corresponding to the wireless power transmitter.

In another example, the detector 1740 may determine the quality factor threshold value as follows.

The quality factor threshold value may be determined in consideration of the quality factor measurement error range (±10% (0.1*the reference quality factor value) of the received reference quality factor value or the accuracy of quality factor value (FIG. 11)) and the transmitter characteristics (transmitter type (design), manufacturer, product or measurement error, etc.).

The controller 1750 may control overall operation and input/output of the FO detection apparatus 1700. For example, the controller 1750 may perform control, such that the status of the wireless power transmitter transitions from the negotiation phase to the power transfer phase and the power transmission unit 1760 transmits power necessary to charge a load, if the FO is not detected by the detector 1740. In another example, the controller 1750 may perform control, such that the status of the wireless power transmitter transitions from the negotiation phase to the selection phase and power transfer of the power transmission unit 1760 is interrupted, if the FO is detected by the detector 1740.

The FO detection apparatus 1700 according to another embodiment may further include a memory (not shown) for storing the quality factor table 1600 shown in FIG. 16.

The FO detection apparatus 1700 according to another embodiment may further include a correction unit (not shown) for calculating power loss between the wireless power receiver and the wireless power transmitter before transitioning to the power transfer phase, if the FO is not detected by the detector 1740.

Figure 18:
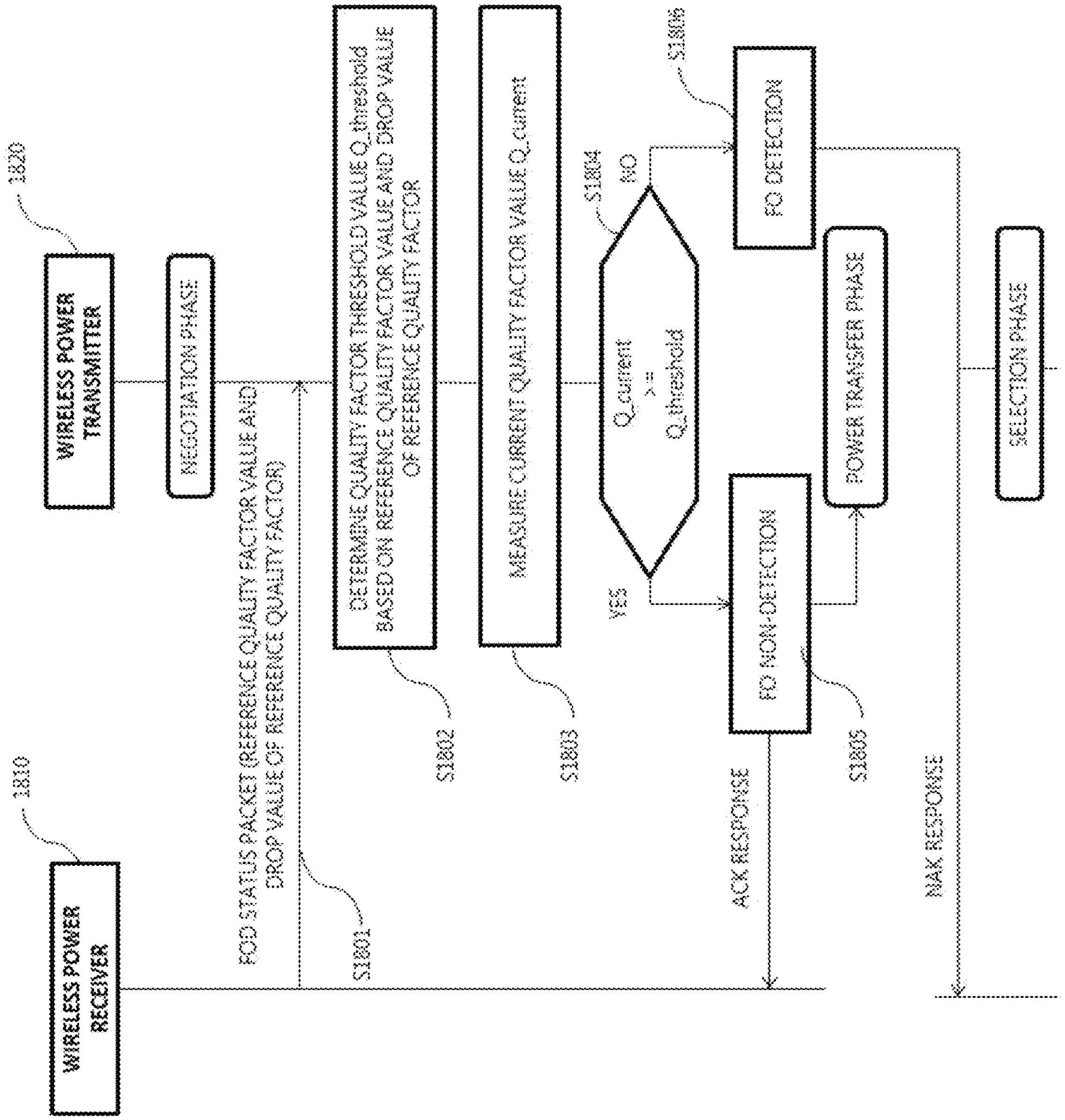
FIG. 18 is a flowchart illustrating an FOD method according to another embodiment.

FIG. 18 is a flowchart illustrating an FOD method according to another embodiment.

Referring to FIG. 18, in the negotiation phase, the wireless power receiver 1810 may transmit an FOD status packet including the reference quality factor value and the drop value of the reference quality factor to the wireless power transmitter 1820 (S1801). At this time, the mode value of the FOD status packet may be set to "01", without being limited thereto.

Here, the reference quality factor value may be determined to be the smallest value of the quality factor values measured at a plurality of points of the charging area of a specific wireless power transmitter specified for performance test and may be maintained in the wireless power receiver.

The wireless power transmitter 1820 may determine the quality factor threshold value Q_threshold using the received reference quality factor value and the drop value of the reference quality factor (S1803).

For example, the wireless power transmitter 1820 may determine a value obtained by subtracting the drop value of the reference quality factor from the reference quality factor value as a quality factor threshold value, without being limited thereto. In another example, the quality factor threshold value may be determined using a predetermined quality factor value generation function using the reference quality factor value and the drop value of the reference quality factor as input variables.

The wireless power transmitter 1820 may measure the current quality factor value Q_current and determine whether the current quality factor value Q_current is greater than or equal to the quality factor threshold value Q_threshold (S1803 to S1804).

For reference, the current quality factor value may be measured before the digital ping phase, immediately before the negotiation (renegotiation) phase or periodically.

If the current quality factor value Q_current is greater than or equal to the quality factor threshold value Q_threshold as the result of comparison, the wireless power transmitter 1820 may determine that FO is not detected and transmit an ACK response to the wireless power receiver 1810 (S1805). At this time, the status of the wireless power transmitter 1820 may transition from the negotiation step to the power transfer phase.

If the current quality factor value Q_current is less than the quality factor threshold value Q_threshold as the result of comparison in step 1804, the wireless power transmitter 1820 may determine that FO is detected and transmit a NAK response to the wireless power receiver 1810 (S1806). At this time, the status of the wireless power transmitter 1820 may transition from the negotiation phase to the selection phase.

Figure 19:
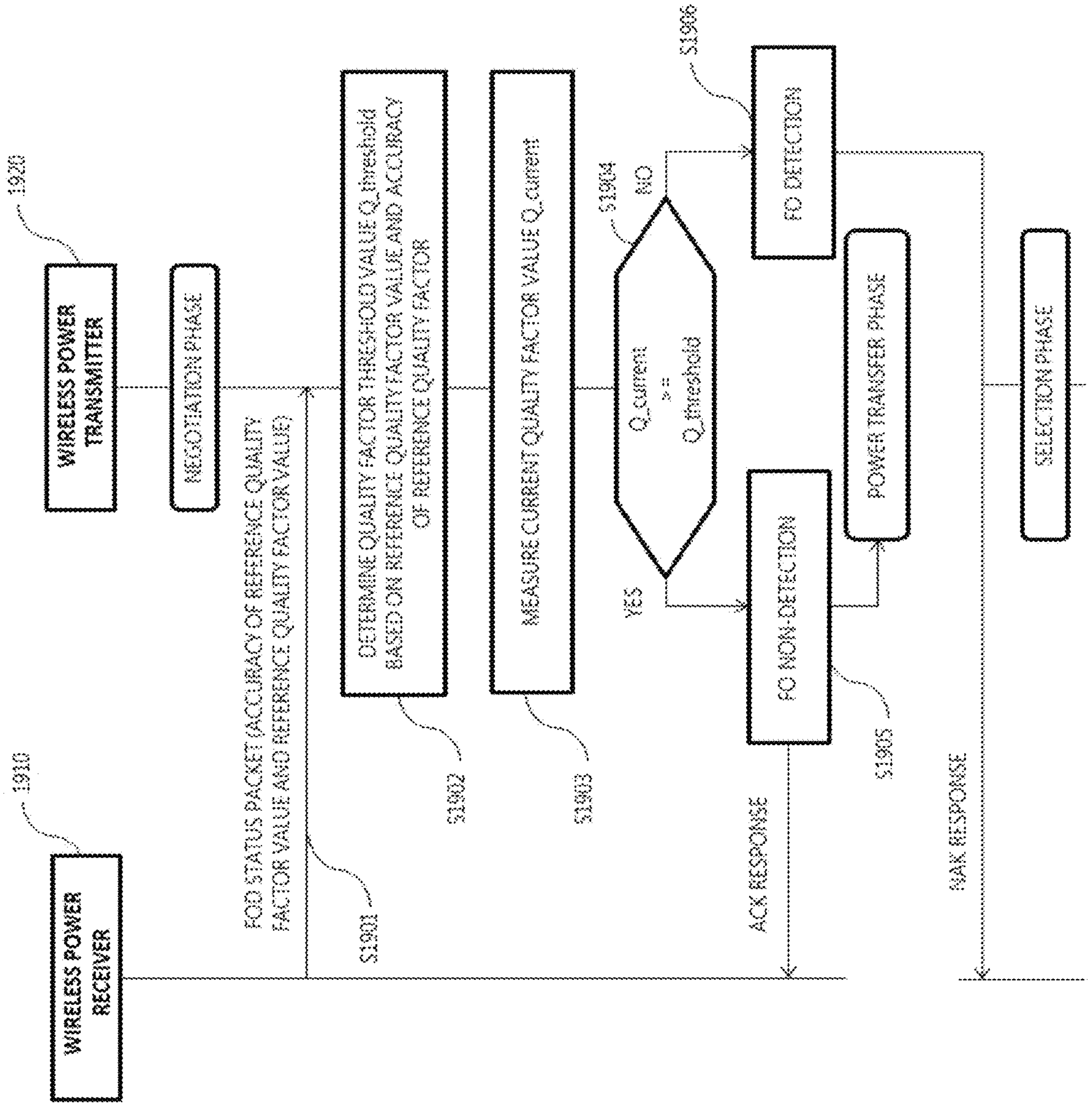
FIG. 19 is a flowchart illustrating an FOD method according to another embodiment.

FIG. 19 is a flowchart illustrating an FOD method according to another embodiment.

Referring to FIG. 19, in the negotiation phase, the wireless power receiver 1910 may transmit an FOD status packet including accuracy of the reference quality factor and the reference quality factor value to the wireless power transmitter 1920 (S1901). At this time, the mode value of the FOD status packet may be set to a binary value of "01", without being limited thereto.

The wireless power transmitter 1920 may determine the quality factor threshold value Q_threshold using the received accuracy of the reference quality factor and the reference quality factor value (S1903).

The wireless power transmitter 1920 according to an embodiment may determine the quality factor threshold value using a pre-stored production and measurement tolerance.

For example, the wireless power transmitter 1920 may determine a value obtained by subtracting the accuracy of the reference quality factor and the production and measurement tolerance from the reference quality factor value as the quality factor threshold value, without being limited thereto. In another example, the quality factor threshold value may be determined using a predetermined quality factor threshold value generation function using the accuracy of the reference quality factor and the reference quality factor value as input variables.

The wireless power transmitter 1920 may measure the current quality factor value Q_current and determine whether the current quality factor value Q_current is greater than or equal to the quality factor threshold value Q_threshold (S1903 to S1904).

The current quality factor value according to an embodiment may be measured before the digital ping phase, immediately before the negotiation (renegotiation) phase or periodically.

If the current quality factor value Q_current is greater than or equal to the quality factor threshold value Q_threshold as the result of comparison, the wireless power transmitter 1920 may determine that FO is not detected and transmit an ACK response to the wireless power receiver 1910 (S1905). At this time, the status of the wireless power transmitter 1920 may transition from the negotiation step to the power transfer phase.

If the current quality factor value Q_current is less than the quality factor threshold value Q_threshold as the result of comparison in step 1904, the wireless power transmitter 1920 may determine that FO has been detected and transmit a NAK response to the wireless power receiver 1910 (S1906). At this time, the status of the wireless power transmitter 1920 may transition from the negotiation phase to the selection phase.

The wireless power transmitter according to another embodiment may acquire the reference quality factor value, the accuracy of the reference quality factor and the drop value of the reference quality factor through the plurality of FOD status packets. At this time, the wireless power transmitter may determine the quality factor threshold value using at least one of the reference quality factor value, the accuracy of the reference quality factor, the drop value of the reference quality factor and the production and measurement tolerance.

For example, the wireless power transmitter may determine the output value of a predetermined quality factor threshold value generation function using the reference quality factor value, the accuracy of the reference quality factor and the drop value of the reference quality factor as input variables.

The wireless power transmitter according to another embodiment may acquire the quality factor value, the accuracy of the reference quality factor and the drop value of the reference quality factor measured in a state in which a foreign object is not present from the wireless power receiver through a plurality of FOD status packets.

For example, the wireless power transmitter may determine a value obtained by the accuracy of the reference quality factor and the drop value of the reference quality factor from the quality factor value measured in a state in which a foreign object is not present, as the quality factor threshold value.

In another example, the wireless power transmitter may determine, as the quality factor threshold value, the output value of the predetermined quality factor threshold value generation function using, as input variables, the quality factor value, the accuracy of the reference quality factor and the drop value of the reference quality factor measured in a state in which a foreign object is not present.

FIG. 20 is a flowchart illustrating an FOD method based on a quality factor value according to another embodiment.

Referring to FIG. 20, the wireless power transmitter may measure a first quality factor value at a first frequency in a predetermined operating frequency band (S2001). Here, the operating frequency band may be set to a frequency band from 100 kHz to 210 kHz in advance. However, this is merely an example and it should be noted that a different operating frequency band may be set according to at least one of the settings and configuration of the wireless power transmitter and the applied standard. Accordingly, step S2001 may be omitted and the quality factor value for a specific frequency may be measured in step S2003.

The wireless power transmitter may measure a second quality factor value at a second frequency greater than the first frequency in the operating frequency band (S2003).

The wireless power transmitter may compare the first quality factor value with the second quality factor value (S2005).

In one embodiment, the first frequency may be an operating frequency for a maximum quality factor value (a peak Q factor value). In step S2005, the FOD status packet may be received in the negotiation phase, the first frequency may be confirmed, and the first quality factor value corresponding to the confirmed first frequency may be compared with the second quality factor value corresponding to the second frequency greater than the first frequency.

In another embodiment, the first frequency may be 100 kHz. Since the wireless power transmitter and receiver may measure, transmit and receive a reference quality factor value in a state of setting a frequency to 100 kHz, the first frequency may be 100 kHz.

If the first quality factor value is greater than the second quality factor value as a result of comparison, the wireless power transmitter may determine that the wireless power receiver is aligned and disposed in the charging area (S2007). Here, a high coupling coefficient between a transmission resonant coil (primary coil) and a reception resonant coil (secondary coil) may mean that the wireless power transmitter is well aligned.

If the second quality factor value is greater than the first quality factor value as a result of comparison in step S2005, the wireless power transmitter may determine that a foreign object is present in the charging area and a misaligned wireless power receiver is present (S2009).

In another embodiment, if the first quality factor value is greater than the second quality factor value as a result of comparison in step S2005, it may be determined that only a foreign object is present in the charging area.

When a foreign object is present, the quality factor value corresponding to the second frequency may be greater than the first quality factor value corresponding to the first frequency, as compared to the state in which the wireless power receiver is misaligned. The foreign object having small influence may have a quality factor value similar to that of the misaligned receiver, but a difference between the quality factor value measured when a foreign object having relatively large influence is present and the quality factor value measured when the misaligned receiver is present may be relatively large.

Upon determining that a foreign object is present or a misaligned wireless power receiver is present, the wireless power transmitter according to an embodiment may stop power transfer and output a predetermined alarm signal indicating that the foreign object is present or the misaligned wireless power receiver is present.

The wireless power transmitter may enter the selection phase after waiting for a predetermined time after the alarm signal is output, thereby scanning the receiver again. The time waiting before entering the selection phase may be determined in consideration of a time required to remove the foreign object from the charging area by the user or to normally dispose the misaligned wireless power receiver again by the user.

The wireless power transmitter according to another embodiment may measure the quality factor values corresponding to the first and second frequencies before entering the selection phase and compare the quality factor values to check whether the foreign object has been removed from the charging area. If the foreign object has been removed, the wireless power transmitter may enter the selection phase.

The wireless power transmitter according to another embodiment may measure the quality factor values corresponding to the first and second frequencies before entering the selection phase and compare the quality factor values to check whether the wireless power receiver has been aligned. If the wireless power receiver has been aligned, the wireless power transmitter may enter the selection phase.

Although the wireless power transmitter according to an embodiment may perform steps 2701 to 2709 in the selection phase 210 of FIG. 2, this is merely an example and steps 2701 to 2709 may be performed in any phase performed before the negotiation phase 240, e.g., any one of the selection phase 210, the ping phase 220 and the identification and configuration phase 230.

The wireless power transmitter according to another embodiment may perform steps 2701 to 2709 in the power transfer phase 260 of FIG. 2. In this case, the wireless power transmitter may measure the quality factor values corresponding to the frequencies while power control using operating frequency control is performed and compare the quality factor values to determine whether a foreign object is present.

The wireless power transmitter according to another embodiment may determine (or acquire) a quality factor peak frequency, at which a maximum quality factor value is measured, in the predetermined operating frequency band (S2001, S2003). The frequencies in the predetermined operating frequency band (or a specific frequency band) may be swept to find an operating frequency, at which the maximum quality factor value is measured. The wireless power transmitter may receive an FOD status packet including a reference peak frequency from the wireless power receiver and compare the reference peak frequency with the acquired quality factor peak operating frequency, determining whether a foreign object is present. Direct comparison with the reference peak frequency may be performed or a threshold frequency may be determined in consideration of a transmission coil, design, product tolerance, etc. and the acquired quality factor peak operating frequency and the threshold frequency may be compared.

Figure 21:
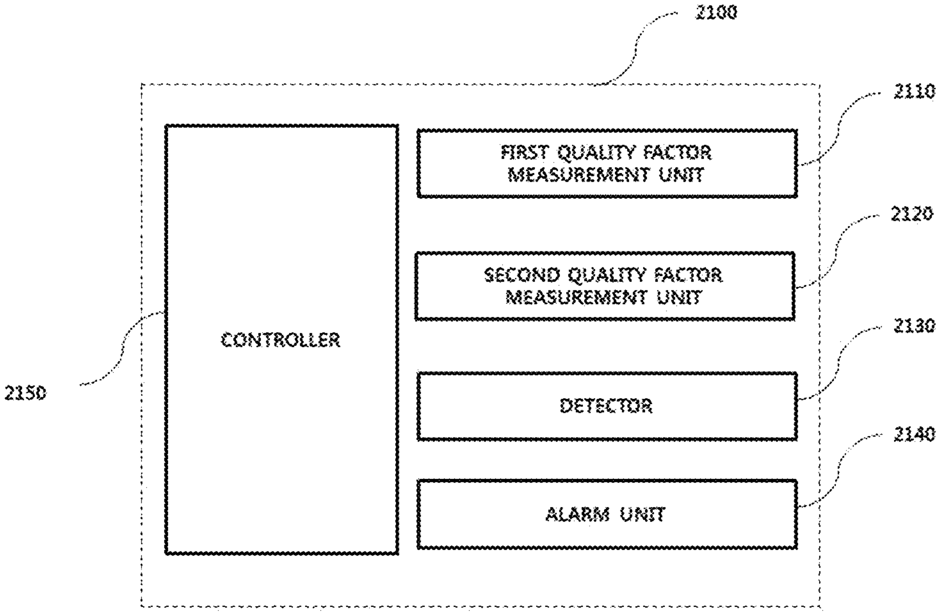
FIG. 21 is a block diagram illustrating the structure of an FOD apparatus corresponding to the embodiment of FIG. 20.

FIG. 21 is a block diagram illustrating the structure of an FOD apparatus corresponding to the embodiment of FIG. 20.

Referring to FIG. 21, the FO detection apparatus 2100 may include a first quality factor measurement unit 2110, a second quality factor measurement unit 2120, a detector 2130, an alarm unit 2140 and a controller 2150. In another embodiment, the first quality factor measurement unit and the second quality factor measurement may be unified into one module or device. In this case, the same measurement unit may measure the first quality factor value and the second quality factor value according to operating frequency control of the controller 2150. Alternatively, the same measurement unit may measure a maximum quality factor value according to operating frequency control of the controller and store the quality factor peak operating frequency corresponding to the maximum quality factor value in a memory.

The first quality factor measurement unit 2110 may measure the first quality factor value corresponding to the first frequency in the predetermined operating frequency band.

The second quality factor measurement unit 2120 may measure the second quality factor value corresponding to the second frequency in the predetermined operating frequency band. Here, the second frequency may be greater than the first frequency and a difference between the first frequency and the second frequency may be determined based on the bandwidth of the operating frequency band, without being limited thereto. For example, the first frequency and the second frequency may be a lower-limit frequency and an upper-limit frequency of the operating frequency band.

The detector 2130 may determine whether a foreign object is present in the charging area based on the first quality factor value and the second quality factor value. Alternatively, it may be determined whether a foreign object is present in the charging area based on the quality factor peak operating frequency and the reference quality factor peak operating frequency received from the wireless power reception unit.

For example, if the second quality factor value is greater than the first quality factor value, the detector 2130 may determine that a foreign object is present in the charging area or a misaligned wireless power receiver is present. In contrast, if the second quality factor value is less than the first quality factor value, the detector 2130 may determine that a foreign object is not present in the charging area or an aligned wireless power receiver is present.

In another example, if the second quality factor value is greater than the first quality factor value by a predetermined reference value, the detector 2130 may determine that a foreign object is present in the charging area or a misaligned wireless power receiver is present. In contrast, if the first quality factor value is greater than the second quality factor value of if a difference between the second quality factor value and the first quality factor value is less than a predetermined reference value, the detector 2130 may determine that an aligned wireless power receiver is present.

In another example, the detector 2130 may determine whether a foreign object is present in the charging area or a misaligned wireless power receiver is present, based on the change rate of the quality factor value according to change in frequency in the operating frequency band.

Although the change rate may be calculated by dividing a value obtained by subtracting the first quality factor value from the second quality factor value by the first quality factor value, the embodiment is not limited thereto and any equation capable of calculating the change rate of the quality factor value according to frequency change may be used.

If the calculated change rate is greater than 0 or is equal to or greater than a first threshold value having a predetermined positive value, the detector 2130 may determine that a foreign object is present in the charging area or a misaligned wireless power receiver is present.

In contrast, if the calculated change rate is less than 0 or is equal to or less than a second threshold value having a predetermined negative value, the detector 2130 may determine that an aligned wireless power receiver is disposed in the charging area.

If a foreign object or a misaligned wireless power receiver is detected, the detector 2130 may transmit the result of detection to the controller 2150.

The alarm unit 2140 may output a predetermined alarm signal indicating that a foreign object is present in the charging area or a misaligned wireless power receiver is present in the charging area through an alarm element, under control of the controller 2150. Here, the alarm element may include a buzzer, an LED lamp, a vibration element, and a liquid crystal display, without being limited thereto.

Upon determining that a foreign object or a misaligned wireless power receiver is disposed, the controller 2150 according to an embodiment may control the power transmission unit 2160 of FIG. 20 to stop power transfer if power is currently transmitted and control the alarm unit 2140 to output a predetermined alarm signal indicating that a foreign object or a misaligned wireless power receiver is disposed.

The controller 2150 may enter the selection phase after waiting for a predetermined time after the alarm signal is output, and scan the receiver again.

The time waiting before entering the selection phase may be determined in consideration of a time required to remove the foreign object from the charging area by the user or to normally dispose the misaligned wireless power receiver again by the user.

The controller 2150 according to another embodiment may control the first to second quality factor measurement units 2110 and 2120 to measure the quality factor values corresponding to the first and second frequency before entering the selection phase, and compare the measured first to second quality factor values to check whether the foreign has been removed from the charging area. If the foreign object has been removed, the controller 2150 may enter the selection phase.

The controller 2150 according to another embodiment may perform control to measure the quality factor values corresponding to the first and second frequencies before entering the selection phase and check whether the wireless power receiver has been normally aligned based on the measured first to second quality factor values. If the wireless power receiver has been normally aligned, the controller 2150 may enter the selection phase.

In another embodiment, the foreign object detection phase may be performed in the selection phase, that is, before the ping phase. In this case, if the foreign object is detected in the selection phase, the wireless power transmitter may enter the selection phase without entering the ping phase.

The controller 2150 according to another embodiment may temporarily stop power transfer if a foreign object is detected while transmitting power to the wireless power receiver, that is, in the power transfer phase 260 of FIG. 2, and output a predetermined alarm signal indicating that the foreign object has been detected. Upon determining that the detected foreign object has been removed while outputting the alarm signal, the controller 2150 may perform control to resume power transfer.

Figure 22:
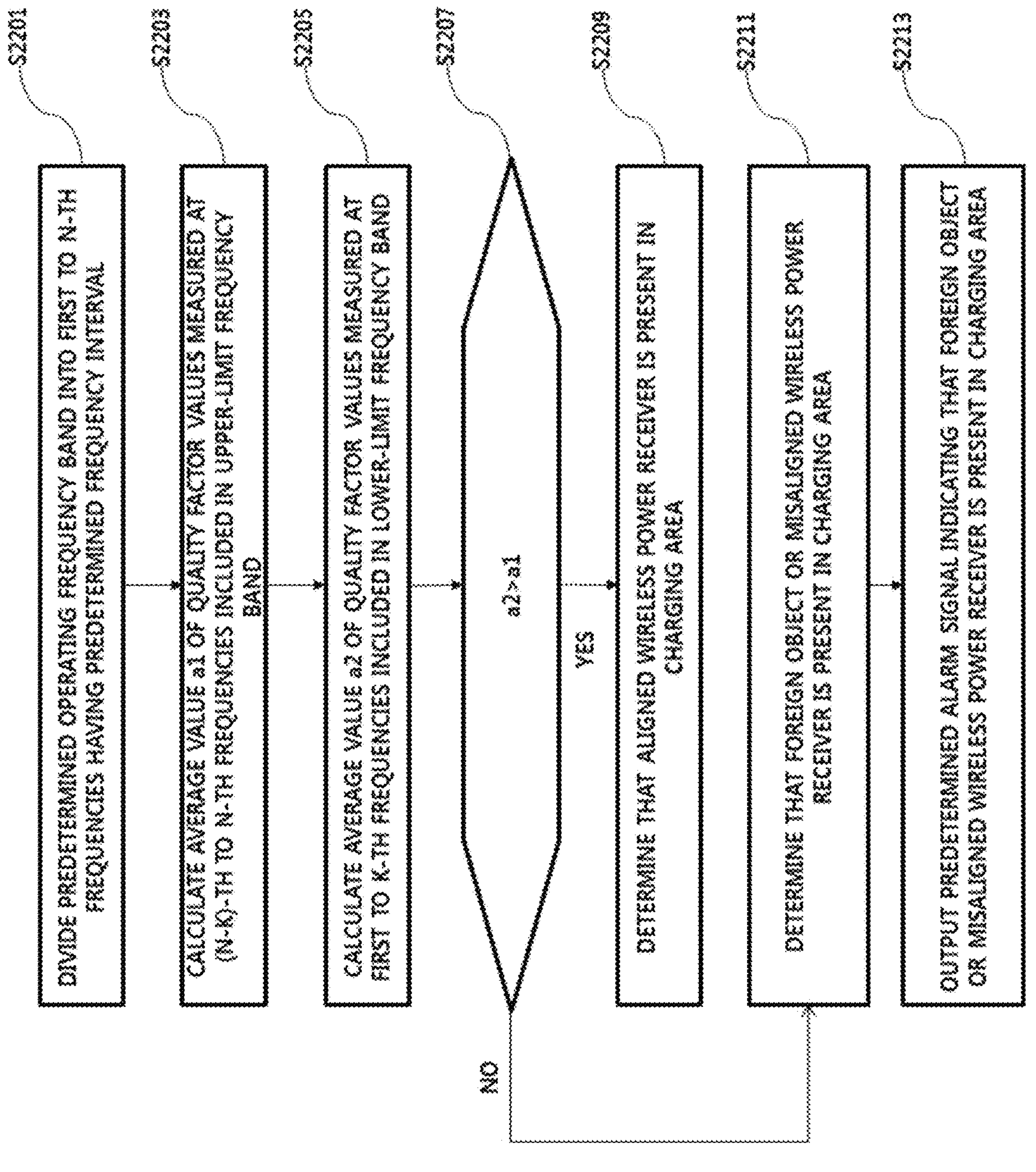
FIG. 22 is a flowchart illustrating an FOD method based on a quality factor value according to another embodiment.

FIG. 22 is a flowchart illustrating an FOD method based on a quality factor value according to another embodiment.

Referring to FIG. 22, the wireless power transmitter may divide a predetermined operating frequency band into first to N-th frequencies having a predetermined frequency interval (S2201). Here, the operating frequency band may be roughly divided into a lower-limit frequency band, a middle frequency band and an upper-limit frequency band. It should be noted that the size of each frequency band may vary according to user settings. For example, if the operating frequency band is from 100 kHz to 210 kHz and a frequency interval for distinguishing a specific frequency in the operating frequency band is set to 10 kHz, the operating frequency band may be divided into first to twelfth frequencies. Here, first to third frequency may belong to the lower-limit frequency band (100 kHz to 130 kHz), fourth to ninth frequencies may belong to the middle frequency band (130 kHz to 180 kHz), and tenth to twelfth frequencies may belong to the upper-limit frequency band (180 kHz to 210 kHz). This is merely an example and it should be noted that a different operating frequency band and frequency interval may be set according to at least one of the settings and configuration of the wireless power transmitter and the applied standard.

The wireless power transmitter may calculate an average value a1 of the quality factor value(s) measured at (N−K+1)-th to N-th frequencies included in the upper-limit frequency band (S2203).

In addition, the wireless power transmitter may calculate an average value a2 of the quality factor value(s) measured at first to k-th frequencies included in the lower-limit frequency band (S2205).

The wireless power transmitter may compare a1 with a2 (S2207).

If the quality factor average value a2 of the lower-limit frequency band is greater than the quality factor average value a1 of the upper-limit frequency band, the wireless power transmitter may determine that an aligned wireless power receiver is disposed in the charging area (S2209). Here, a high coupling coefficient between a transmission resonant coil (primary coil) and a reception resonant coil (secondary coil) may mean that the wireless power transmitter is well aligned.

If a2 is less than or equal to a1 as the result of comparison in step 2207, the wireless power transmitter may determine that a foreign object or a misaligned wireless power receiver is disposed in the charging area (S2211).

The wireless power transmitter may output a predetermined alarm signal indicating that the foreign object or the misaligned wireless power receiver is disposed in the charging area (S2213).

Although the wireless power transmitter according to an embodiment may perform steps 2201 to 2213 in the selection phase 210 of FIG. 2, this is merely an example and steps 2701 to 2709 may be performed in any phase performed before the negotiation phase 240, e.g., any one of the selection phase 210, the ping phase 220 and the identification and configuration phase 230.

The wireless power transmitter according to another embodiment may perform steps 2201 to 2213 in the power transfer phase 260 of FIG. 2. In this case, the wireless power transmitter may measure the quality factor values corresponding to the frequencies while power control using operating frequency control is performed. In addition, the wireless power transmitter may calculate the quality factor average value of the upper-limit frequency band and the quality factor average value of the lower-limit frequency band using the measured quality factor values corresponding to the frequencies and compare the quality factor average values to determine whether a foreign object is present.

Although the quality factor average value a1 of the upper-limit frequency band and the quality factor average value a2 of the lower-limit frequency band are compared to determine whether a foreign object is present in the embodiment of FIG. 21, this is merely an example and the wireless power transmitter according to another embodiment may determine whether a foreign object or a misaligned wireless power receiver is disposed in the charging area based on the increase/decrease in quality factor average value in addition to whether the quality factor average value increases or decreases according to frequency change. For example, if a value obtained by subtracting a1 from a2 is a negative number and an absolute value of a difference between a2 and a1 exceeds a predetermined threshold value, the wireless power transmitter may determine that a foreign object or a misaligned wireless power receiver is disposed in the charging area.

Figure 23:
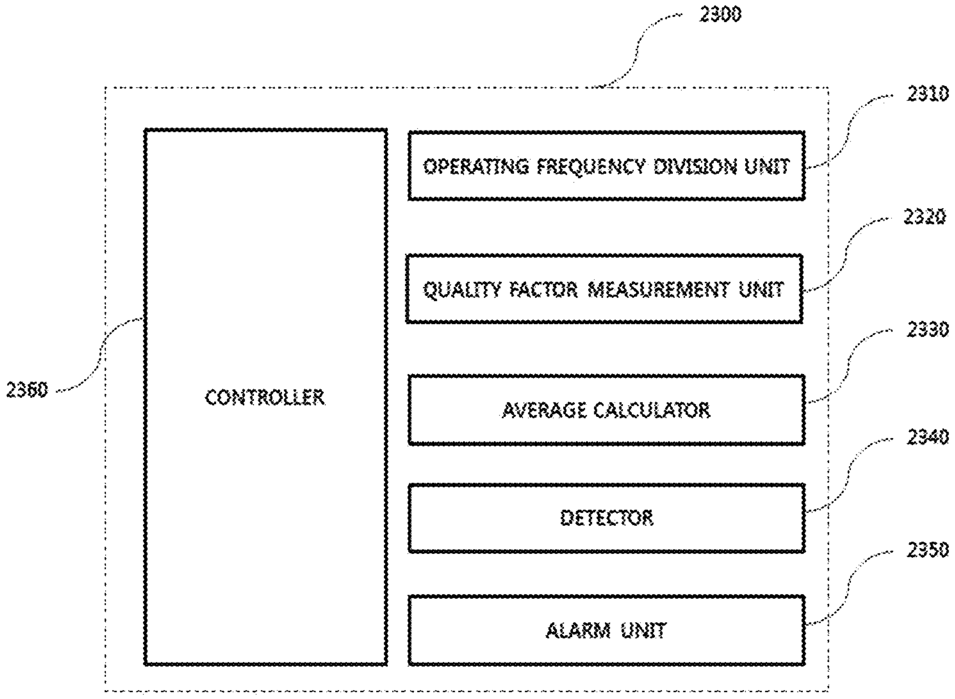
FIG. 23 is a block diagram illustrating the structure of an FOD apparatus corresponding to the embodiment of FIG. 22.

FIG. 23 is a block diagram illustrating the structure of an FOD apparatus corresponding to the embodiment of FIG. 22.

Referring to FIG. 23, the FOD apparatus 2300 may include an operating frequency division unit 2310, a quality factor measurement unit 2320, an average calculator 2330, a detector 2340, an alarm unit 2350 and a controller 2360.

The operating frequency division unit 2310 may divide a predefined operating frequency band into first to N-th frequencies, at which the quality factor value will be measured, at a predetermined frequency interval, and classify the divided frequencies into a lower-limit frequency band, a middle frequency band and an upper-limit frequency band. Here, the lower-limit frequency band and the number of frequencies to be measured, which are included in the lower-limit frequency band, may be predefined and maintained in a predetermined recording region. It should be noted that the operating frequency band, the frequency interval, and the number of frequencies to be measured, which are included in the lower-limit/upper-limit frequency band, may be changed through a predetermined user interface mounted in the wireless power transmitter and/or an external server connected to the wireless power transmitter over a wired or wireless communication network.

The quality factor measurement unit 2320 may measure the quality factor values corresponding to the first to N-th frequencies. The quality factor measurement unit 2340 according to an embodiment may measure only the quality factor values corresponding to the frequencies to be measured, which are included in the lower-limit frequency band and the upper-limit frequency band.

The average calculator 2330 may calculate the average value a2 of the quality factor value(s) measured with respect to the lower-limit frequency band and the average value a1 of the quality factor value(s) measured with respect to the upper-limit frequency band.

The detector 2340 may detect a foreign object or a misaligned wireless power receiver disposed in the charging area based on a1 and a2, and transmit the result of detection to the controller 2360. For example, if a value obtained by subtracting a2 from a1 is a positive number, that is, if the average of the quality factor values increases as the frequency in the operating frequency band increases, it may be determined that the foreign object or the misaligned wireless power receiver is present in the charging area. In contrast, if a value obtained by subtracting a2 from a1 is a negative number, that is, if the average of the quality factor values decreases as the frequency in the operating frequency band increases, it may be determined that an aligned wireless power receiver is present in the charging area.

In another example, the detector 2340 may determine whether a foreign object or a misaligned wireless power receiver is present in the charging area in consideration of the increase/decrease in quality factor average value in addition to whether the quality factor average value increases or decreases according to frequency change in the operating frequency band. For example, if a value obtained by subtracting a1 from a2 is a negative number and an absolute value of a difference between a2 and a1 exceeds a predetermined threshold value, the wireless power transmitter may determine that a foreign object or a misaligned wireless power receiver is disposed in the charging area.

The alarm unit 2350 may output a predetermined alarm signal indicating that a foreign object is present in the charging area or a misaligned wireless power receiver is disposed in the charging area through an alarm element, under control of the controller 2360.

Here, the alarm element may include a buzzer, an LED lamp, a vibration element, and a liquid crystal display, without being limited thereto.

FIGS. 24A to 24D are graphs of experimental results illustrating a logical basis of the embodiments of FIGS. 20 to 23.

Figure 24A:
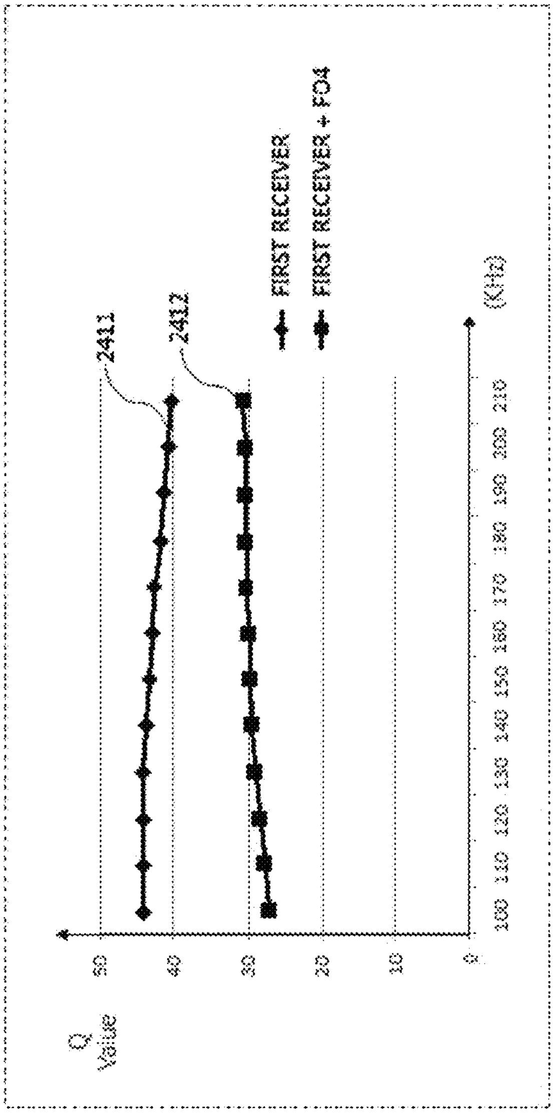
FIGS. 24A to 24E are graphs of experimental results illustrating a logical basis of the embodiments of FIGS. 14 to 23.

As denoted by reference numeral 2411 of FIG. 24A, if only the first receiver is disposed in the charging area, the quality factor value measured by the wireless power transmitter decreases as the frequency in the operating frequency band (100 kHz to 210 kHz) increases. In contrast, as denoted by reference numeral 2412, if the first receiver and a foreign object FO4 are disposed in the charging area, the quality factor value measured by the wireless power transmitter increases as the frequency in the operating frequency band increases.

As denoted by reference numeral 2413, it can be seen that, when only the first receiver is disposed in the charging area, the quality factor value measured at the operating frequency of 100 kHz is 44 and the quality factor value measured at the operating frequency of 210 kHz is 40. In contrast, it can be seen that, when the first receiver and the foreign object FO4 are disposed in the charging area, the quality factor value measured at the operating frequency of 100 kHz is 27.1 and the quality factor value measured at the operating frequency of 210 kHz is 30.5. Here, FO4 means a foreign object of the standard defined in the WPC standard.

The experimental result shown in FIG. 24A shows that the quality factor value decreases as the frequency in the operating frequency band increases if the wireless power receiver is aligned and disposed in the charging area, but increases as the frequency in the operating frequency band increases if the foreign object is disposed in the charging area.

Figure 24B:
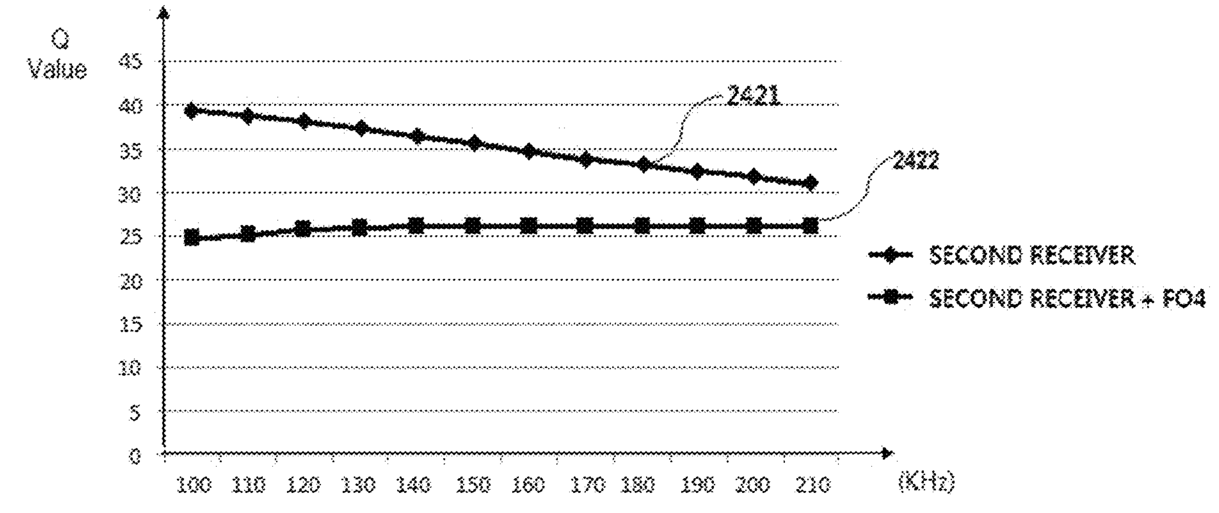

FIG. 24B shows an experimental result of the second receiver generated by a manufacturer different from that of the first receiver of FIG. 24A.

As denoted by reference numeral 2421 of FIG. 24A, if only the second receiver is disposed in the charging area, the quality factor value measured by the wireless power transmitter decreases as the frequency in the operating frequency band (100 kHz to 210 kHz) increases. In contrast, as denoted by reference numeral 2422, if the second receiver and a foreign object FO4 are disposed in the charging area, the quality factor value measured by the wireless power transmitter increases as the frequency in the operating frequency band increases.

As denoted by reference numeral 2423, it can be seen that, when only the second receiver is disposed in the charging area, the quality factor value measured at the operating frequency of 100 kHz is 39.5 and the quality factor value measured at the operating frequency of 210 kHz is 31.1. In contrast, it can be seen that, when the second receiver and the foreign object FO4 are disposed in the charging area, the quality factor value measured at the operating frequency of 100 kHz is 24.9 and the quality factor value measured at the operating frequency of 210 kHz is 26.1.

The experimental result shown in FIG. 24B shows that the quality factor value decreases as the frequency in the operating frequency band increases if the wireless power receiver is aligned and disposed in the charging area, but increases as the frequency in the operating frequency band increases if the foreign object is disposed in the charging area, equally to the experimental result of FIG. 24A.

Figure 24C:
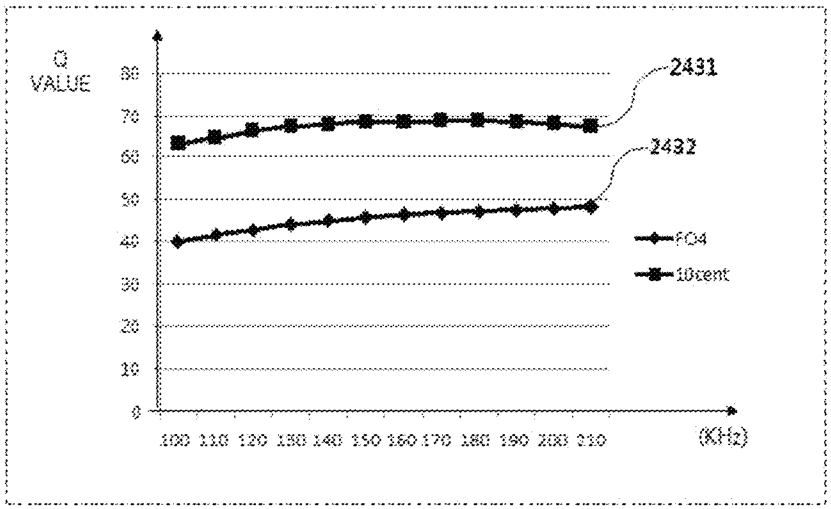

FIG. 24C shows the quality factor value measured with respect to a foreign object FO4 and a 10-cent coin defined in the standard in the operating frequency band.

Reference numerals 2431 and 2432 of FIG. 24C show the change pattern of the quality factor value measured with respect to the 10-cent coin and FO4. As denoted by reference numerals 2431 and 2432, it can be seen that, if a foreign object other than the wireless power receiver is placed in the charging area, the quality factor value increases as the frequency in the operating frequency band increases.

In the case of the 10-cent coin, some quality factor values measured in the middle frequency band is greater than the quality factor value measured in the upper-limit frequency band. Accordingly, in order to minimize erroneous determination occurring according to erroneous measurement result, as described in FIGS. 22 to 23, it may be determined whether a foreign object is present based on the quality factor average value calculated in each of the lower-limit frequency band and the upper-limit frequency band.

Figure 24D:
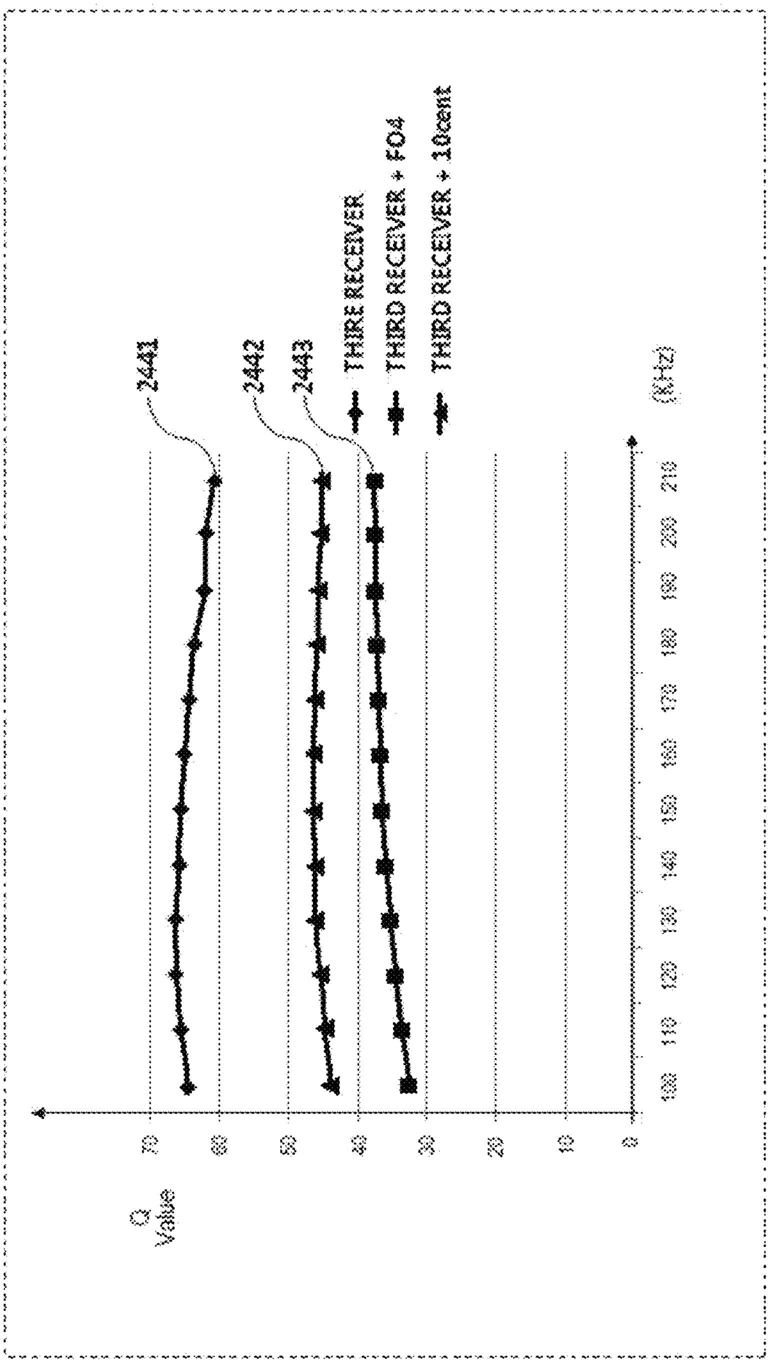

FIG. 24D shows an experimental result of a third receiver manufactured by a manufacturer different from those of the first to second receivers.

As denoted by reference numeral 2441 of FIG. 24D, if only the third receiver is placed in the charging area, the quality factor value decreases as the frequency increases. However, as denoted by reference numerals 2442 to 2443, if a foreign object, e.g., FO4 or the 10-cent coin, is further placed in the charging area, the quality factor value increases as the frequency increases.

Figure 24E:
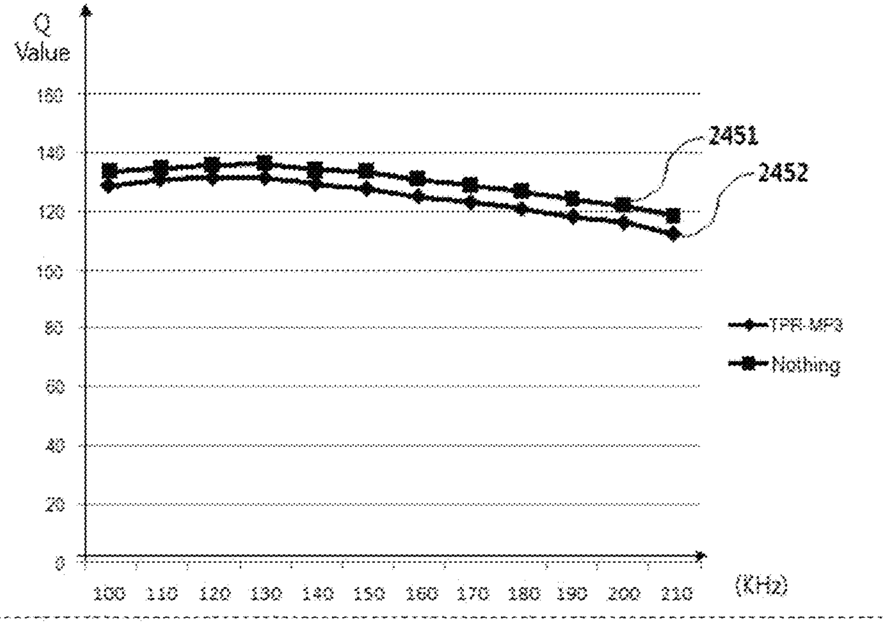

FIG. 24E shows an experimental result of the standard wireless power transmitter and the standard wireless power reception module used for product authentication.

As denoted by reference numeral 2452 of FIG. 24E, it can be seen that, if the standard wireless power reception module is in the standard wireless power transmitter, the quality factor value decreases as the frequency in the operating frequency band increases. Of course, as denoted by reference numeral 2451, it can be seen that, even if nothing is placed in the charging area of the standard wireless power transmitter, the quality factor value decreases as the frequency in the operating frequency band increases. However, as denoted by reference numeral 2453, it can be seen that the quality factor value measured in a state in which the standard wireless power reception module is placed in the charging area of the standard wireless power transmitter decreases to a certain extent as compared to the case where nothing is placed in the charging area.

FIG. 25 is a view illustrating a relationship between a quality factor value and a maximum quality factor peak frequency according to placement of a foreign object and a wireless power receiver in a charging area of a wireless power transmitter.

The table shown in FIG. 25 shows the shift of the maximum quality factor peak frequency when the wireless power receiver and the foreign object are placed in the charging area as compared to the case where only the wireless power receiver is placed in the charging area Δt this time, it may be determined whether a foreign object is present using the maximum quality factor peak frequency.

The wireless power transmitter may receive information on the reference quality factor peak frequency from the wireless power receiver and determine a threshold frequency based on the received information. Here, the threshold frequency may be determined in consideration of the design of a coil, circuit characteristics, tolerance, etc. The wireless power transmitter may determine whether a foreign object is present, by comparing the threshold frequency with the peak frequency of FIG. 25.

Figure 26:
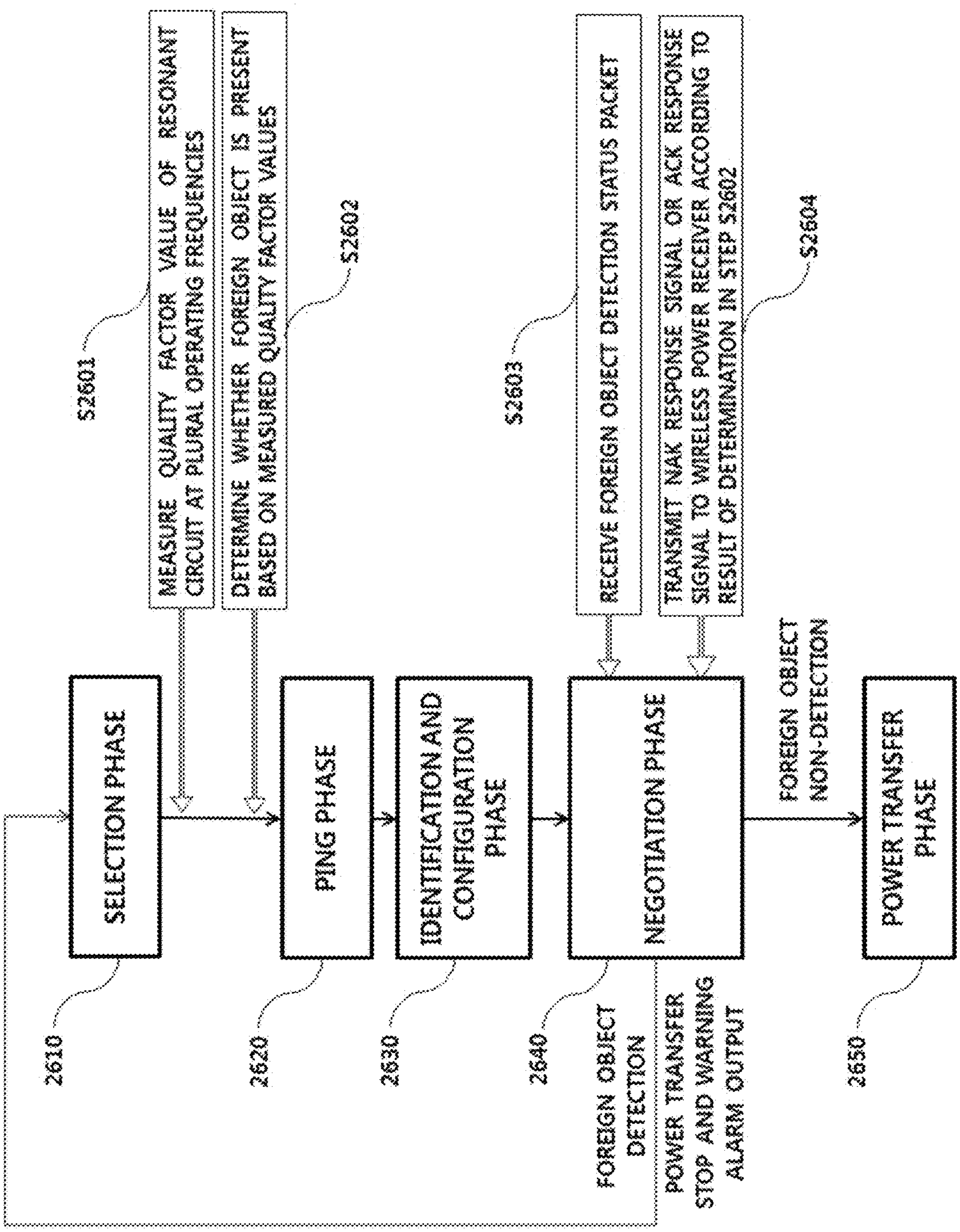
FIG. 26 is a view illustrating a state transition procedure for detecting a foreign object in a foreign object detection apparatus according to an embodiment.

FIG. 26 is a view illustrating a state transition procedure for detecting a foreign object in a foreign object detection apparatus according to an embodiment.

Referring to FIG. 26, when an object is detected in the selection phase 2610, the foreign object detection apparatus may measure the quality factor value of the resonant circuit at a plurality of operating frequencies (S2601). Although the number of operating frequencies, at which the quality factor value is measured, is 2 to 6, the embodiment is not limited thereto and the number of operating frequencies may be increased. The operating frequency, at which the quality factor value is measured, may be selected in a predefined operating frequency range to have a predetermined frequency interval. For example, if the operating frequency range of the foreign object detection apparatus is from 100 kHz to 220 kHz and the number of operating frequencies is 5, the values of the operating frequencies, at which the quality factor value is measured, may be 100 kHz, 130 kHz, 160 kHz, 190 kHz and 220 kHz.

The foreign object detection apparatus may determine whether a foreign object is placed, that is, whether a foreign object is present, based on the measured quality factor values (S2602).

For example, the foreign object detection apparatus may determine that a foreign object is present in the charging area, when the quality factor value increases as the operating frequency increases. In contrast, the foreign object detection apparatus may determine that a foreign object is not present in the charging area, when the quality factor value decreases as the operating frequency increases.

In another example, the foreign object detection apparatus may calculate change in quality factor value at adjacent operating frequencies and determine that a foreign object is present in the charging area when an average of the calculated changes exceeds a predetermined reference value. For example, the reference value may be 0, without being limited thereto. Here, the adjacent operating frequencies mean two nearest operating frequencies among the operating frequencies, at which the quality factor value is measured.

In another example, the foreign object detection apparatus may calculate the slopes of the quality factor values at adjacent operating frequencies and may determine that a foreign object is present in the charging area when the average of the calculated slopes exceeds a predetermined first reference value. In contrast, when the average of the calculated slopes is equal to or less than a predetermined second reference value, it may be determined that a foreign object is not present in the charging area. The first reference value and the second reference value may be different and, in this case, the first reference value is greater than the second reference value.

The foreign object detection apparatus may enter the ping phase 2620 when the determination as to whether the foreign object is present is terminated.

In the ping phase 2620, the foreign object detection apparatus may periodically transmit a predetermined power signal for identifying the wireless power receiver, e.g., digital ping.

The foreign object detection apparatus may enter the identification and configuration phase 2630 when a signal strength indicator is received in the ping phase 2620 and set various configuration parameters for the identified wireless power receiver.

The foreign object detection apparatus may enter the negotiation phase 2640 when the identification and configuration of the wireless power receiver is terminated and receive a foreign object detection (FOD) status packet from the identified wireless power receiver (S2603). Here, the foreign object detection status may include a reference quality factor value.

The foreign object detection apparatus may transmit a NAK response signal or an ACK response signal to the identified wireless power receiver according to the result of determination in step 2602 (S2604). At this time, the foreign object detection apparatus may not determine a threshold value (a threshold range) for determining whether a foreign object is present based on the received foreign object detection status packet. If the foreign object is present as the result of determination in step 2602, the foreign object detection apparatus may transmit the NAK response signal to the identified wireless power receiver and transition to the selection phase 2610. At this time, the foreign object detection apparatus may stop power transfer and output a predetermined warning alarm indicating that the foreign object has been detected.

For example, if the foreign object is not present as the result of determination in step 2602, the foreign object detection apparatus may transmit the ACK response signal and then transition to the power transfer phase 2650. In another example, the foreign object detection apparatus may transition to the power transfer phase 2650 through the calibration phase 250 of FIG. 2, if the foreign object is not present as the result of determination in step 2602.

The foreign object detection apparatus may enter the power transfer phase 2650 to start wireless charging of the wireless power receiver.

The foreign object detection apparatus, which has transitioned to the selection phase 2610 according to foreign object detection, may periodically measure the quality factor values of the resonant circuit at a plurality of operating frequencies and determine whether the foreign object has been removed based on the measured quality factor values. Upon determining that the foreign object has been removed, the foreign object detection apparatus may enter the power transfer phase 2650 to resume power transfer to the wireless power receiver. In contrast, if the foreign object is not removed for a predetermined time after transitioning to the selection phase 2610 according to foreign object detection, the foreign object detection apparatus may output a predetermined warning alarm indicating that the detected foreign object has not been removed.

The foreign object detection apparatus according to anther embodiment may further transmit a predetermined foreign object (FO) presence status packet including FO status information corresponding to the result of determination in step 2601 to the wireless power receiver. For example, if FO status information is “0”, this may mean that the foreign object is not detected and, if FO status information is “1”, this may mean that the foreign object is detected, without being limited thereto.

In another embodiment, step S2603 may be omitted.

Figure 27:
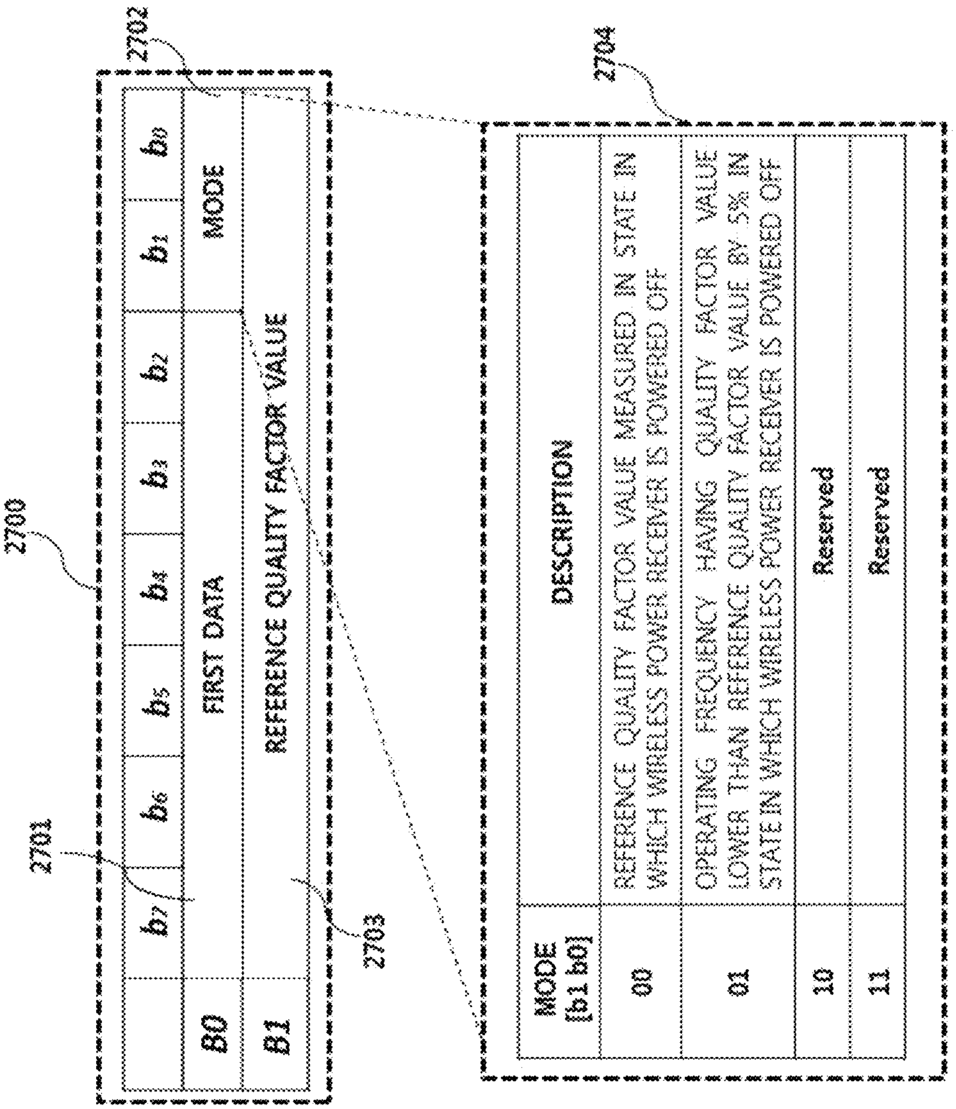
FIG. 27 is a view illustrating the structure of an FOD status packet message according to another embodiment.

FIG. 27 is a view illustrating the structure of an FOD status packet message according to another embodiment.

Referring to FIG. 27, the FOD status packet message 2700 may have a length of 2 bytes and include a first data field 2701 having a length of 6 bits, a mode field 2702 having a length of 2 bits, and a reference quality factor value 2703 having a length of 1 byte.

As denoted by reference numeral 2704, if the mode field 2702 is set to a binary value of “00”, all bits of the first data field 2701 are set to 0 and the reference quality factor value measured and determined in a state in which the wireless power receiver is powered off is recorded in the reference quality factor value field 2703. In contrast, if the mode field 2702 is set to a binary value of “01”, an operating frequency having the quality factor value measured in a state in which a wireless power receiver is powered off, which is lower than the reference quality factor value by 5%, is recorded in the first data field 2701. The reference quality factor value measured and determined in a state in which a wireless power receiver is powered off may be recorded in the first data field 2701. For example, referring to FIG. 20, the reference quality factor value of the receiver may be 39.5 which is measured when the operating frequency is 100 kHz. At this time, the quality factor value lower than the reference quality factor value by 5% is 37.525. Accordingly, the operating frequency having the quality factor value lower than the reference quality factor value by 5% may be any value between 120 kHz and 130 kHz.

Although the value corresponding to the operating frequency having the quality factor value lower than the reference quality factor value by 5% is recorded in the first data field 2701 in the embodiment of FIG. 27, this is exemplary and a value other than 5%. e.g., 7%, may be set according to the design of those skilled in the art.

Figure 28:
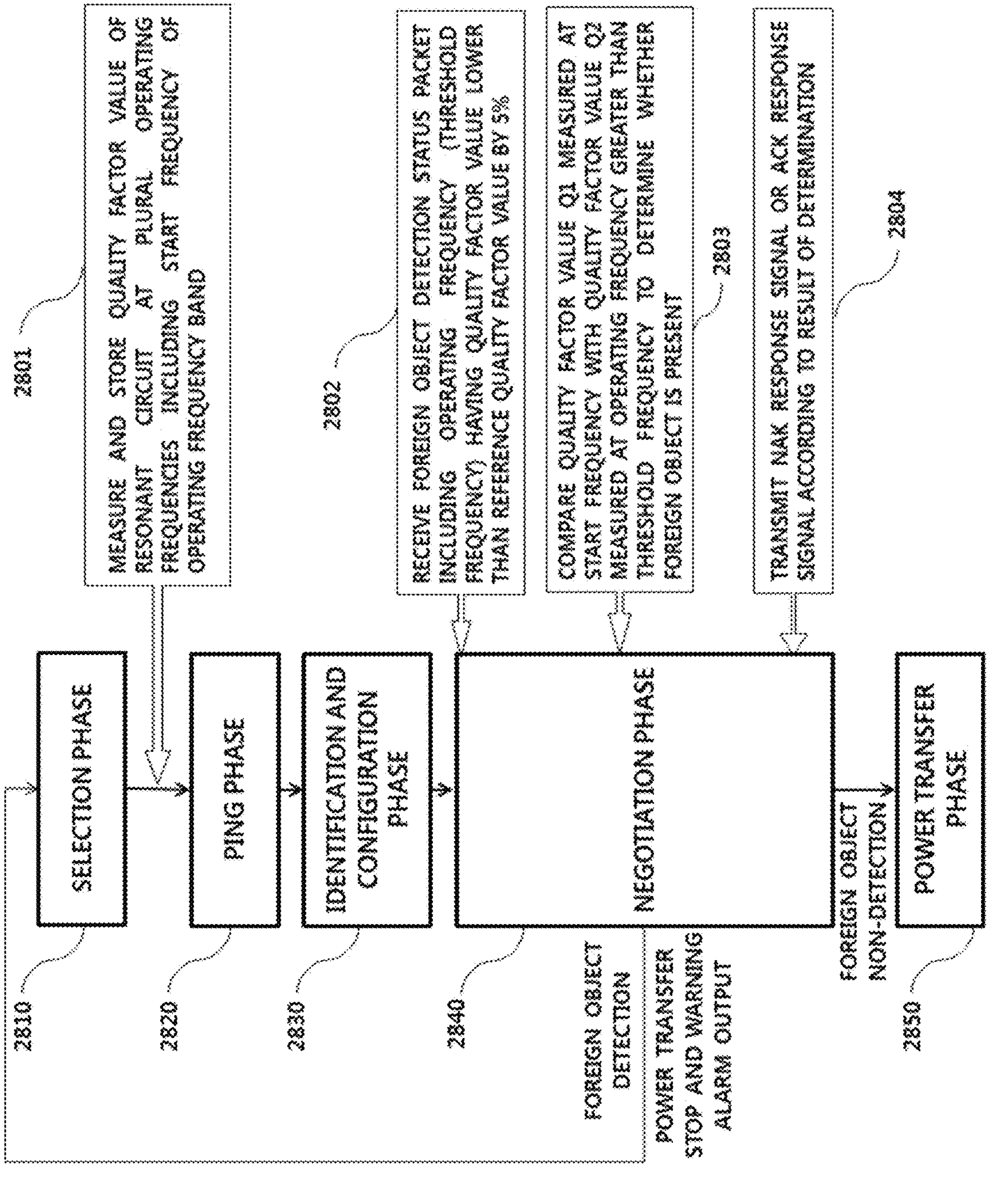
FIG. 28 is a view illustrating a state transition procedure for detecting a foreign object in a foreign object detection apparatus according to an embodiment.

FIG. 28 is a view illustrating a state transition procedure for detecting a foreign object in a foreign object detection apparatus according to an embodiment.

Referring to FIG. 28, when an object is detected in the selection phase 2810, the foreign object detection apparatus may measure the quality factor value of the resonant circuit at a plurality of operating frequencies including the lower-limit frequency of the operating frequency band (S2801). Although the number of operating frequencies, at which the quality factor value is measured, is 2 to 8, the embodiment is not limited thereto and the number of operating frequencies may be increased. The operating frequency, at which the quality factor value is measured, may be selected in a predefined operating frequency range to have a predetermined frequency interval. The embodiment is not limited thereto and the operating frequencies may be arbitrarily selected in the operating frequency range. For example, the operating frequency range of the foreign object detection apparatus may be from 100 kHz to 220 kHz. For example, if the lower-limit frequency is 100 kHz and the number of operating frequencies is 7, the values of the operating frequencies, at which the quality factor value is measured, may be 100 kHz, 120 kHz, 140 kHz, 160 kHz, 180 kHz, 200 kHz and 220 kHz.

The foreign object detection apparatus may record the measured quality factor value of each operating frequency in a predetermined recording region.

The foreign object detection apparatus may enter the ping phase 2820, if quality factor value measurement is terminated.

In the ping phase 2820, the foreign object detection apparatus may periodically a predetermined power signal for identifying the wireless power receiver, for example, digital ping.

When a signal strength indicator is received in the ping phase 2820, the foreign object detection apparatus may enter the identification and configuration phase 2830 to identify the wireless power receiver and to set various configuration parameters for the identified wireless power receiver.

If identification and configuration of the wireless power receiver is terminated, the foreign object detection apparatus may enter the negotiation phase 2840 to receive the FOD status packet from the identified wireless power receiver (S2802). Here, the foreign object detection status packet may include information on the operating frequency having the quality factor value lower than the reference quality factor value by 5% (hereinafter referred to as a threshold frequency, for convenience of description).

The foreign object detection apparatus may compare the quality factor value Q1 corresponding to the lower-limit frequency measured in step 2801 with the quality factor value Q2 measured at an operating frequency greater than the threshold frequency to determine whether a foreign object is present (S2803). Here, Q2 may be a quality factor value having the largest value among the quality factor values measured at the operating frequencies greater than the threshold frequency.

If Q2 is greater than Q1, the foreign object detection apparatus may determine that the foreign object is placed in the charging area. In contrast, if Q2 is less than Q1, the foreign object detection apparatus may determine that the foreign object is not placed in the charging area.

The foreign object detection apparatus according to another embodiment may determine (or estimate) the quality factor value corresponding to the threshold frequency based on the quality factor value of each operating frequency measured in step 2801. For example, if the same frequency as the threshold frequency is included in the plurality of operating frequencies used to measure the quality factor value in step 2801, the quality factor value measured at the operating frequency becomes the quality factor value measured at the threshold frequency. However, if the same frequency as the threshold frequency is not included in the plurality of operating frequencies used to measure the quality factor value in step 2801, the quality factor value corresponding to the threshold frequency may be estimated based on at least one quality factor value measured at an operating frequency closest to the threshold frequency. For example, a linear function may be derived using the quality factor values measured at two operating frequencies closest to the threshold frequency and the quality factor value corresponding to the threshold frequency may be estimated by substituting the threshold frequency into the derived linear function, without being limited thereto.

The foreign object detection apparatus may transmit a NAK response signal or an ACK response signal to the identified wireless power receiver according to the result of determination in step 2803. At this time, the foreign object detection apparatus may not determine a threshold value (a threshold range) for determining whether a foreign object is present based on the received foreign object detection status packet. If the foreign object is present as the result of determination in step 2803, the foreign object detection apparatus may transmit the NAK response signal to the identified wireless power receiver and transition to the selection phase 2810. At this time, the foreign object detection apparatus may stop power transfer and output a predetermined warning alarm indicating that the foreign object has been detected.

For example, if the foreign object is not present as the result of determination in step 2802, the foreign object detection apparatus may transmit the ACK response signal and then transition to the power transfer phase 2850. In another example, the foreign object detection apparatus may transition to the power transfer phase 2850 through the calibration phase 250 of FIG. 2, if the foreign object is not present as the result of determination in step 2803.

The foreign object detection apparatus may enter the power transfer phase 2850 to start wireless charging of the wireless power receiver.

The foreign object detection apparatus, which has transitioned to the selection phase 2810 according to foreign object detection, may periodically measure the quality factor values of the resonant circuit at a plurality of operating frequencies and determine whether the foreign object has been removed based on the measured quality factor values. Upon determining that the foreign object has been removed, the foreign object detection apparatus may enter the power transfer phase 2850 and resume power transfer to the wireless power receiver. In contrast, if the foreign object is not removed for a predetermined time after transitioning to the selection phase 2810 according to foreign object detection, the foreign object detection apparatus may output a predetermined warning alarm indicating that the detected foreign object has not been removed.

The foreign object detection apparatus according to anther embodiment may further transmit a predetermined foreign object (FO) presence status packet including FO status information corresponding to the result of determination in step 2801 to the wireless power receiver. For example, if FO status information is "0", this may mean that the foreign object is not detected and, if FO status information is "1", this may mean that the foreign object is detected, without being limited thereto.

Figure 29:
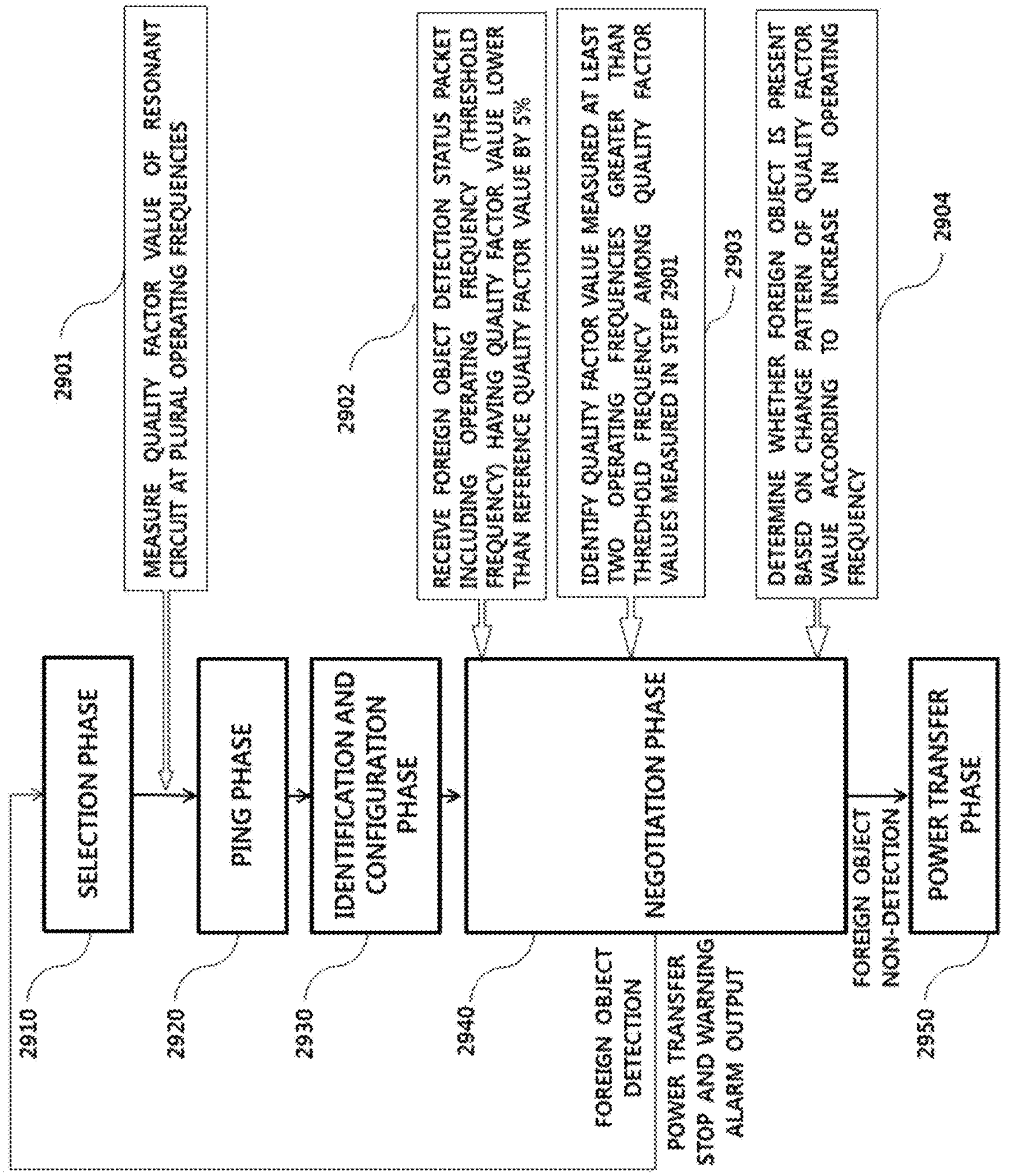
FIG. 29 is a view illustrating a state transition procedure for detecting a foreign object in a foreign object detection apparatus according to an embodiment.

FIG. 29 is a view illustrating a state transition procedure for detecting a foreign object in a foreign object detection apparatus according to an embodiment.

When an object is detected in the selection phase 2910, the foreign object detection apparatus according to an embodiment may measure the quality factor values of the resonant circuit at a plurality of operating frequencies (S2901).

When the FOD status packet including the threshold phase is received, the foreign object detection apparatus may identify at least two operating frequencies greater than or equal to the threshold frequency and extract the measured quality factor values at the identified operating frequencies (S2903).

The foreign object detection apparatus may compare the quality factor values corresponding to the operating frequencies greater than or equal to the threshold frequency to determine whether a foreign object is present (S2904). For example, if the quality factor value increases as the operating frequency increases, the foreign object detection apparatus may determine that the foreign object is present in the charging area. In contrast, if the quality factor value decreases as the operating frequency increases, the foreign object detection apparatus may determine that the foreign object is not present in the charging area.

When an object is detected in the selection phase, the foreign object detection apparatus according to another embodiment may scan the quality factor value in the operating frequency band.

Here, the operating frequency band may be divided into a plurality of lower frequency regions which do not overlap. For example, the operating frequency band may be divided into a first frequency region including the lower-limit frequency and a second frequency region including the upper-limit frequency.

For example, if the operating frequency band is from 100 kHz to 200 kHz, the first frequency region is from 100 kHz to 150 kHz including the lower-limit frequency of 100 kHz and the second frequency region is from 151 kHz to 200 kHz including the upper-limit frequency of 200 kHz.

The foreign object detection apparatus may scan the quality factor values while the frequency in the first frequency region is changed in predetermined frequency units and identify the operating frequency (the first frequency), at which a highest quality factor value is measured. In addition, the foreign object detection apparatus may scan the quality factor values while the frequency in the second frequency region is changed and identify the operating frequency (the second frequency), at which a highest quality factor value is measured. The foreign object detection apparatus may compare the quality factor value Q4 corresponding to the first frequency with the quality factor value Q5 corresponding to the second frequency to determine whether a foreign object is present in the charging area. For example, if Q5 is greater than Q4, the foreign object detection apparatus may determine that the foreign object is present.

In contrast, if Q5 is less than Q4, the foreign object detection apparatus may determine that the foreign object is not present.

Figure 30:
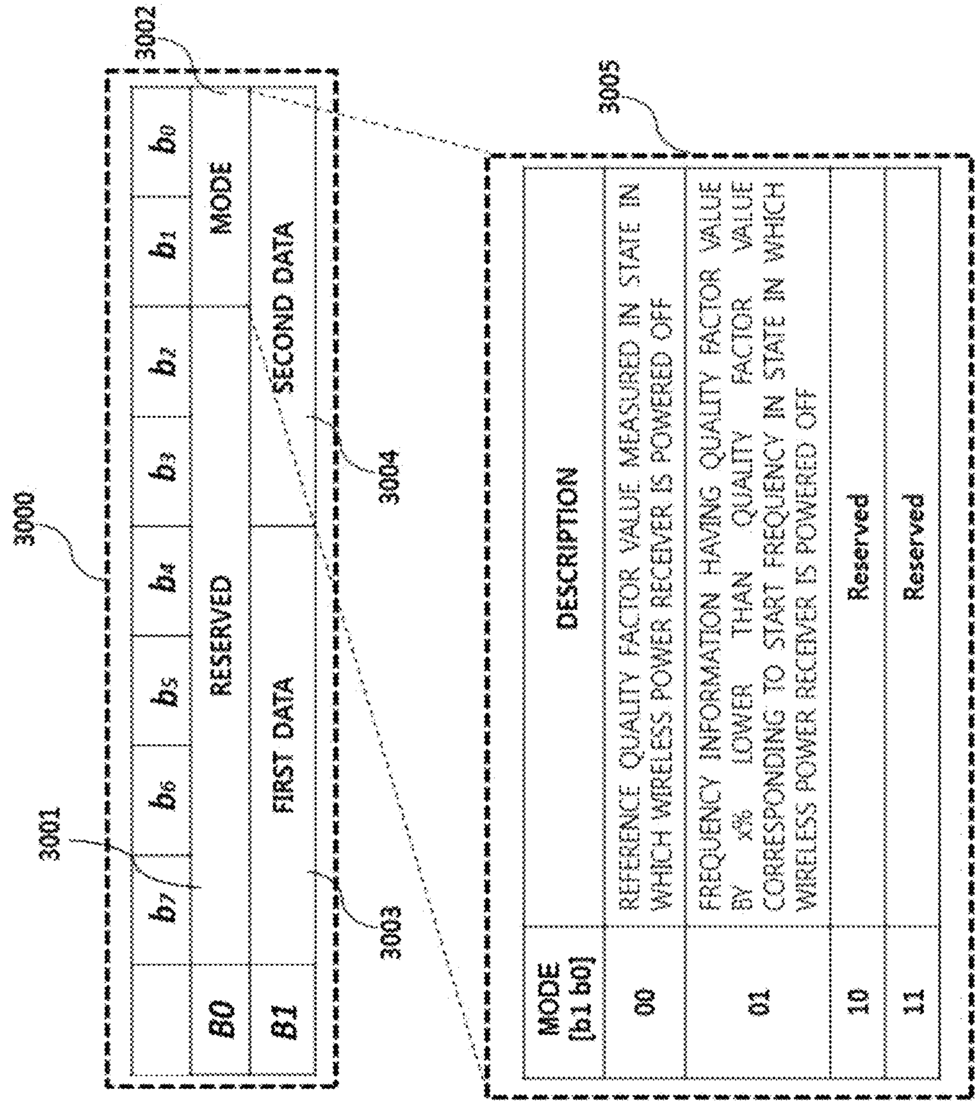
FIG. 30 is a view illustrating the structure of an FOD status packet message according to another embodiment.

FIG. 30 is a view illustrating the structure of an FOD status packet message according to another embodiment.

Referring to FIG. 30, the FOD status packet message 3000 may have a length of 2 bytes and include a reserved field 3001 having a length of 6 bits, a mode field 3002 having a length of 2 bits, a first data field 3003 and a second data field value 3004. Although the length of the first data field 3003 is 3 bits in the embodiment of FIG. 30 and the length of the second data 3004 is 5 bits, this is merely an example and the embodiment is not limited thereto. All bits of the reserved field 3001 are set to 0.

As denoted by reference numeral 3005, if the mode field 3002 is set to a binary value of "00", the reference quality factor value measured and determined in a state in which the wireless power receiver is powered off is recorded in the first data field 3003 and the second data field 3004. In contrast, if the mode field 3002 is set to a binary value of "01", information on the threshold frequency may be recorded in the first data field 3003 and information on a ratio of the quality factor value corresponding to the lower-limit frequency to the quality factor value corresponding to the threshold frequency may be recorded in the second data field 3004.

The method according to the foregoing embodiments may be implemented as code that can be written to a computer-readable recording medium and can thus be read by a computer. Examples of the computer-readable recording medium include a ROM, a RAM, a CD-ROM, a magnetic tape, a floppy disk, an optical data storage, and a carrier wave (e.g., data transmission over the Internet).

The computer-readable recording medium can be distributed over a plurality of computer systems connected to a network so that computer-readable code is written thereto and executed therefrom in a decentralized manner. Functional programs, code, and code segments needed to realize the embodiments herein can be construed by one of ordinary skill in the art.

Those skilled in the art will appreciate that the disclosure may be carried out in other specific ways than those set forth herein without departing from the spirit and essential characteristics of the disclosure.

The above exemplary embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The foreign object detection method according to the embodiment may be used in a wireless charging system for detecting a foreign object located between a wireless power transmitter and a wireless power transmitter using the quality factor value before the ping phase and in the negotiation phase and the power transfer phase.

What is claimed is:

1. A method of transmitting power by a wireless power transmitter, the method comprising:

sequentially transmitting a sensing signal a plurality of times to a wireless power receiver through a plurality of transmission coils to sense the presence of the wireless power receiver;

identifying transmission coils that receive a signal strength indictor transmitted by the wireless power receiver in response to the plurality of sensing signals; and selecting, as a power transmission coil, the transmission coil that has received the signal strength indicator having the largest amount or the largest value among the transmission coils that have received the signal strength indicator, receiving a plurality of packets including a foreign object detection (FOD) status packet from the wireless power receiver;

determining whether a foreign object is present in a charging area of the wireless power transmitter on the basis of the FOD status packet; and transmitting, to the wireless power receiver, a response signal indicating whether the foreign object is present in the charging area of the wireless power transmitter on the basis of a result of the determination, wherein the response signal is determined based on a reference peak frequency included in the FOD status packet received from the wireless power receiver, wherein the reference peak frequency is a value when no foreign object is present in the charging area of the wireless power transmitter, wherein the FOD status packet includes a two-bit mode field and a one-byte data value, and wherein the data value of the FOD status packet is determined by a value of the mode field.

2. The method of claim 1, wherein the reference peak frequency is pre-allocated to the wireless power receiver.

3. The method of claim 1, wherein the FOD status packet has a length of two bytes, wherein one byte of the FOD status packet includes a six-bit reserved field and the two-bit mode field, and wherein the two-bit mode field indicates whether the FOD status packet includes information on the reference peak frequency of the wireless power receiver.

4. The method of claim 1, wherein the response signal is determined by a threshold frequency which is determined based on the reference peak frequency and the wireless power transmitter.

* * * * *